(12) United States Patent
Matteson et al.

(10) Patent No.: US 12,538,452 B2
(45) Date of Patent: Jan. 27, 2026

(54) SYSTEM FOR COOLING ELECTRONIC DEVICES IN AN ELECTRONIC MODULE

(71) Applicant: ICEOTOPE GROUP LIMITED, South Yorkshire (GB)

(72) Inventors: Jason Matteson, South Yorkshire (GB); Neil Edmunds, South Yorkshire (GB); David Amos, South Yorkshire (GB); William Page, South Yorkshire (GB); Nathan Longhurst, South Yorkshire (GB); Mustafa Kadhim, South Yorkshire (GB); Jasper Kidger, South Yorkshire (GB)

(73) Assignee: ICEOTOPE GROUP LIMITED, South Yorkshire (GB)

( * ) Notice: Subject to any disclaimer, the term of this patent is extended or adjusted under 35 U.S.C. 154(b) by 251 days.

(21) Appl. No.: 18/037,595

(22) PCT Filed: Nov. 18, 2021

(86) PCT No.: PCT/EP2021/082224
§ 371 (c)(1),
(2) Date: May 18, 2023

(87) PCT Pub. No.: WO2022/106582
PCT Pub. Date: May 27, 2022

(65) Prior Publication Data
US 2024/0032243 A1 Jan. 25, 2024

(30) Foreign Application Priority Data
Nov. 18, 2020 (GB) ..................................... 2018106

(51) Int. Cl.
*H05K 7/20* (2006.01)
*F28D 9/00* (2006.01)

(52) U.S. Cl.
CPC ..... *H05K 7/20272* (2013.01); *H05K 7/20254* (2013.01); *H05K 7/20263* (2013.01);
(Continued)

(58) Field of Classification Search
CPC ...................................................... F08D 9/0093
See application file for complete search history.

(56) References Cited

U.S. PATENT DOCUMENTS 7,808,783 B2 * 10/2010 Goth ........................ G06F 1/206
361/699
8,955,346 B2 * 2/2015 Campbell ............. F25B 25/005
62/276

(Continued)

FOREIGN PATENT DOCUMENTS

GB 2571053 8/2019
JP 2007109853 A 4/2007
(Continued)

OTHER PUBLICATIONS

Notice of Reasons for Refusal Office Action for JP Application 2023-530015, date of mailing Nov. 26, 2024, 14 pages.
(Continued)

*Primary Examiner* — Zachary Pape
(74) *Attorney, Agent, or Firm* — Bochner PLLC; Andrew D. Bochner

(57) ABSTRACT

A system for cooling a plurality of electronic devices, having a first cooling circulatory arrangement, configured to cause a first liquid coolant to circulate between a first electronic device and a heat exchanger, wherein the first electronic device is thermally coupled to the first liquid coolant. The system also has a second cooling circulatory arrangement, configured to cause a second liquid coolant to flow through the heat exchanger, and to cause the second liquid coolant to flow through a cooling module thermally coupled to a (Continued)

second electronic device. The first cooling circulatory arrangement and the second cooling circulatory arrangement are thermally coupled via the heat exchanger, such that the heat exchanger is configured to transfer heat from the first liquid coolant to the second liquid coolant.

14 Claims, 31 Drawing Sheets

(52) U.S. Cl.
CPC ....... *H05K 7/20772* (2013.01); *F28D 9/0093* (2013.01); *H05K 7/20236* (2013.01)

(56) References Cited

U.S. PATENT DOCUMENTS

| | | | | |
|---|---|---|---|---|
| 9,629,280 | B2* | 4/2017 | Johnson | H05K 7/20254 |
| 11,153,994 | B1* | 10/2021 | Lo | F01P 3/20 |
| 2007/0235167 | A1* | 10/2007 | Brewer | H05K 7/20772 |
| | | | | 257/E23.098 |
| 2017/0177007 | A1 | 6/2017 | Shelnutt | |
| 2018/0027695 | A1 | 1/2018 | Wakino | |
| 2019/0226767 | A1* | 7/2019 | Omi | F28D 15/0266 |
| 2019/0320548 | A1* | 10/2019 | Gao | H05K 7/1488 |

FOREIGN PATENT DOCUMENTS

| | | |
|---|---|---|
| JP | 201818857 A | 2/2018 |
| JP | 2020532875 A | 11/2020 |
| WO | 2018096362 | 5/2018 |
| WO | 2020234600 | 11/2020 |

OTHER PUBLICATIONS

International Search Report and Written Opinion for Application No. PCT/EP2021/082224, date of mailing Feb. 23, 2022, 12 pages.

* cited by examiner

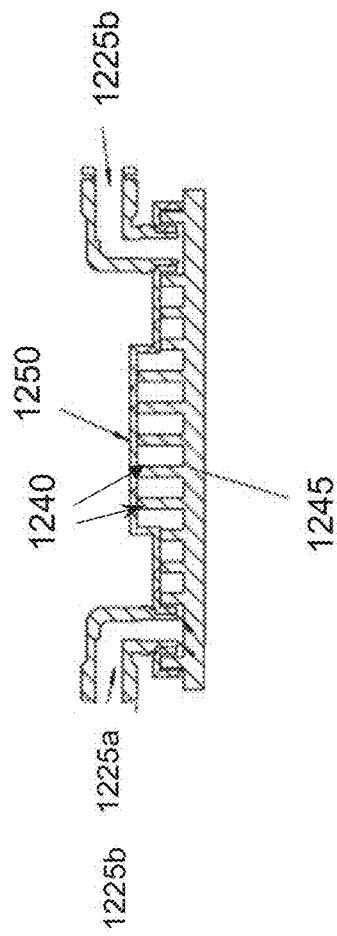
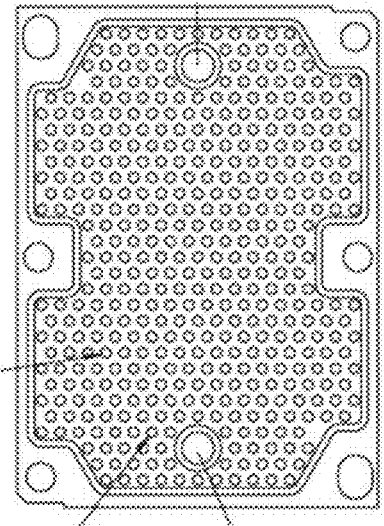

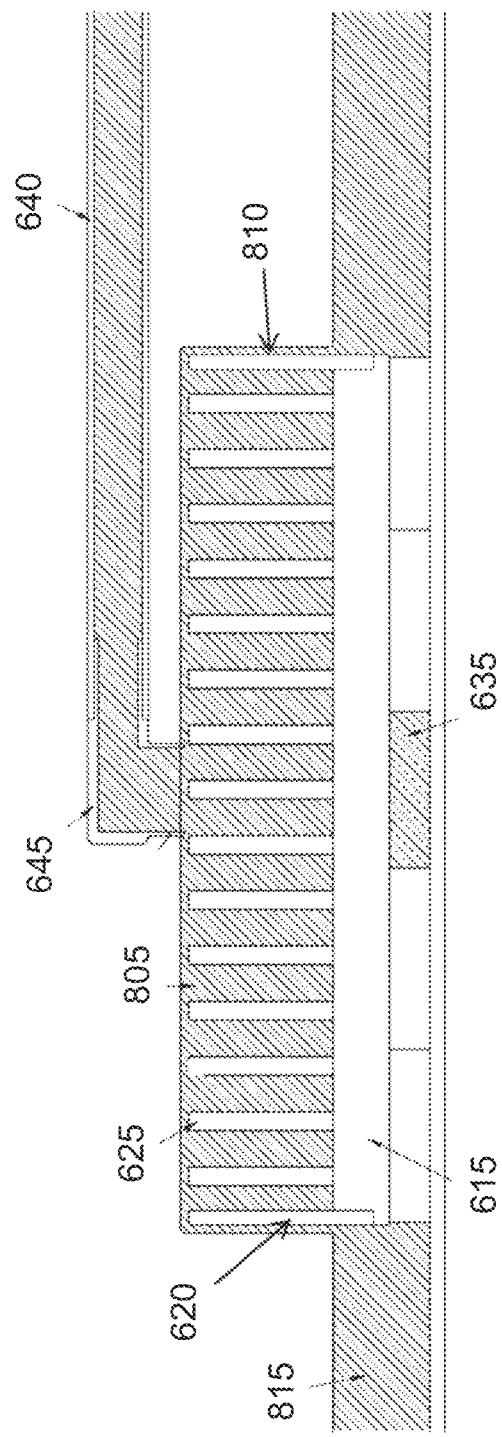

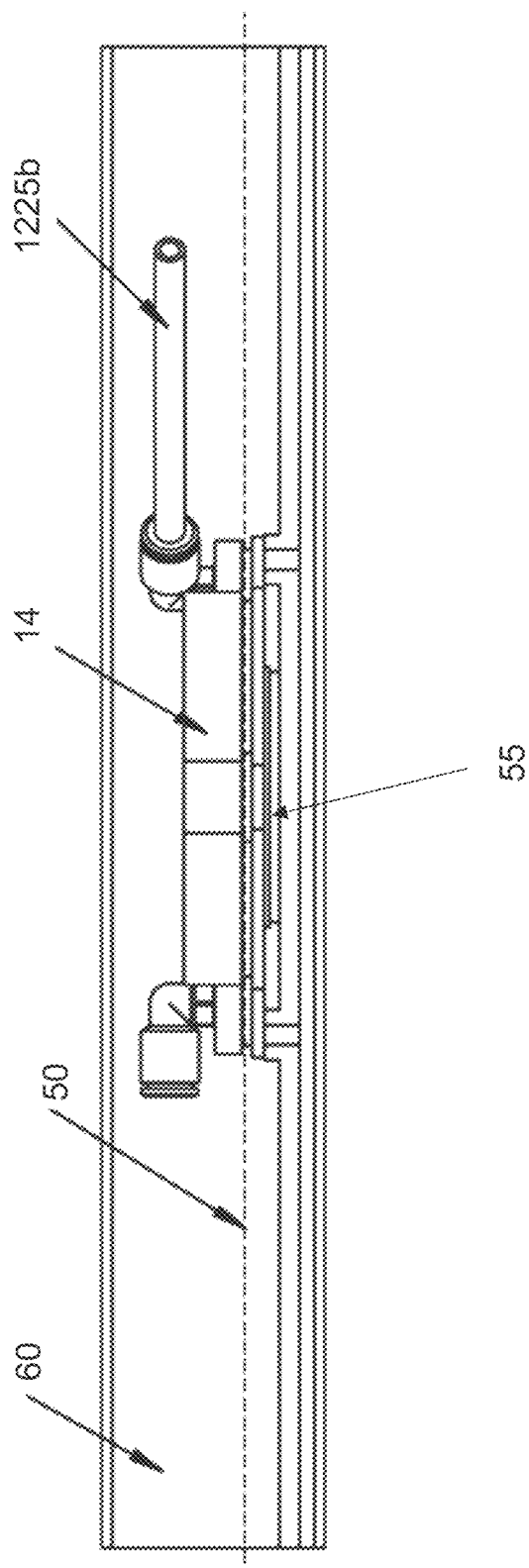

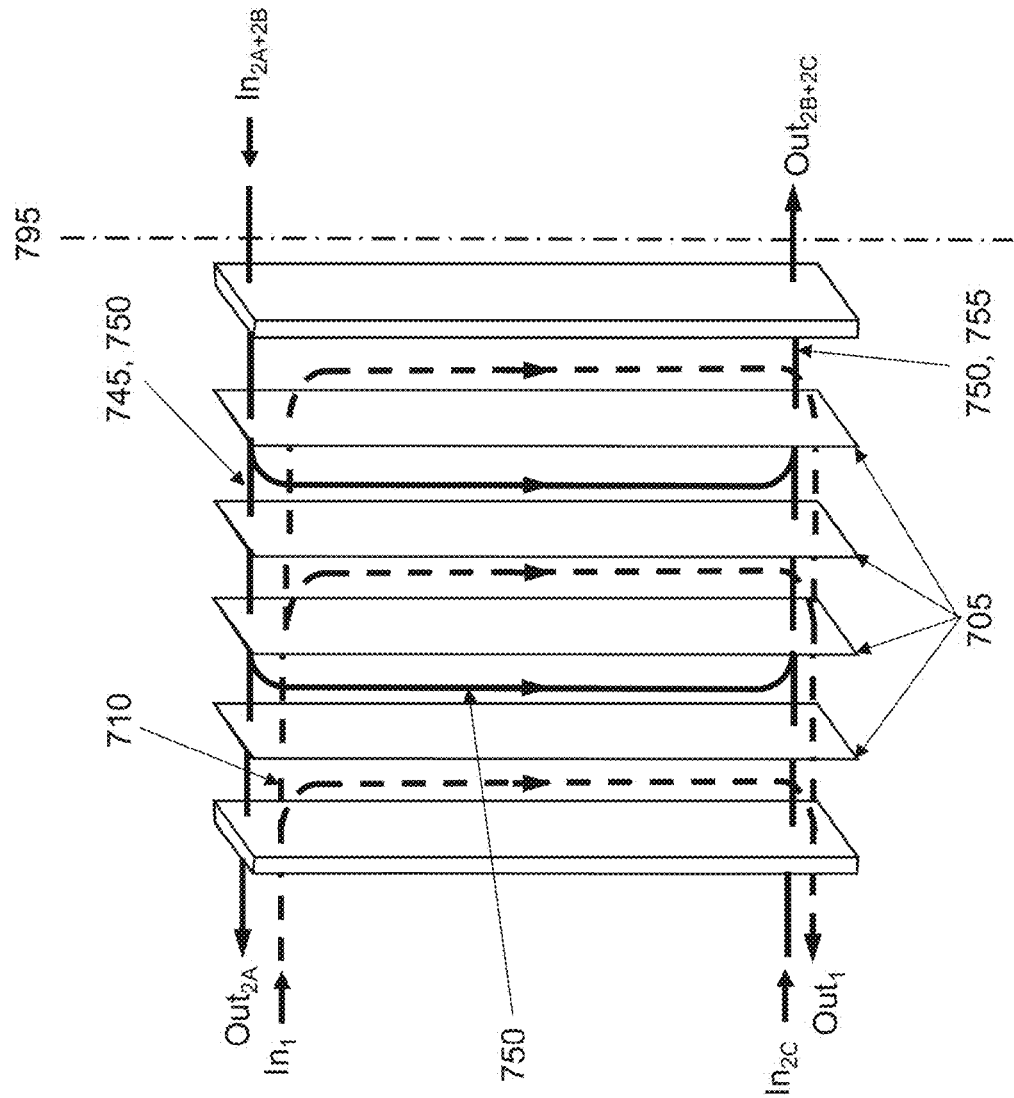

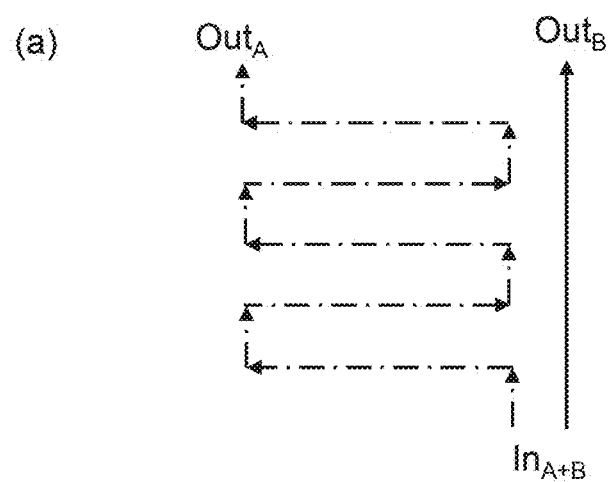
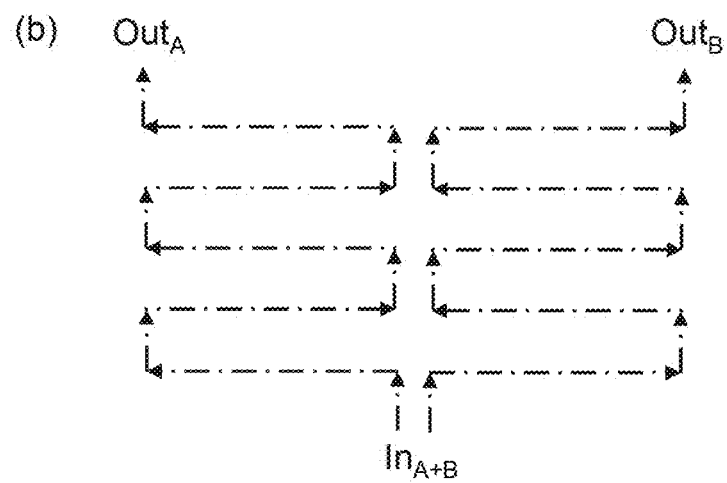
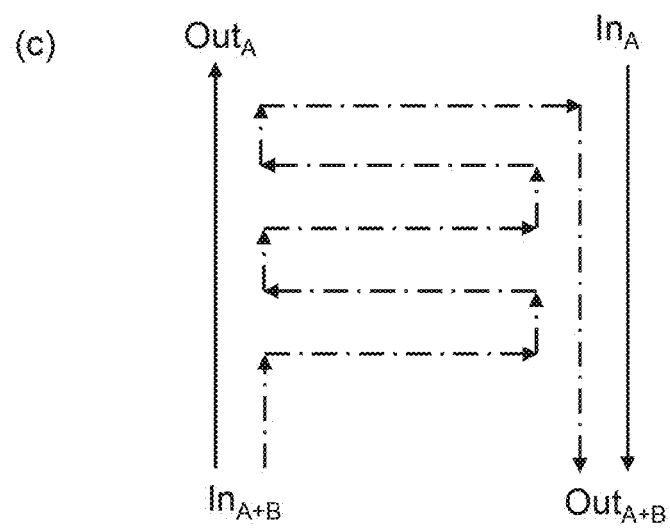
FIGURE 23

SYSTEM FOR COOLING ELECTRONIC DEVICES IN AN ELECTRONIC MODULE

FIELD OF THE INVENTION

The disclosure concerns a system for cooling one or more electronic devices, the electronic devices being housed in an electronic module. The system comprises first and second cooling circulatory arrangements, in which coolant circulating within the first cooling circulatory arrangement is cooled by transfer of heat, via a heat exchanger, to coolant circulating in the second cooling circulatory arrangement. There is further described a method for cooling a plurality of electronic devices housed in an electronic module.

BACKGROUND TO THE INVENTION

Within computers, servers, or other devices used for data processing (referred to as IT, or Information Technology), are a number of electronic devices called Integrated Circuits (IC). The electronic devices within the integrated circuits may include central processing units (CPUs), Application Specific Integrated Circuits (ASICs), Graphical Processing Units (GPUs), Random Access Memory (RAM), etc. Each of these devices produce heat when in use. In order to maintain the devices at an optimum temperature for correct operation, it is important for this heat to be transferred away from the devices. As the processing power of IT increases and so the number of electronic devices within a computer, server or other IT grows, the challenge of removing sufficient heat created by the electronic devices increases.

The electronic devices, normally mounted on a printed circuit board (PCB), are usually housed or enclosed within a case, housing or chassis, to form an electronic module. A computer server often comprises a number of electronic modules, mounted in a rack and connected together in order to provide the required IT facilities. A method for removal of heat from each case or chassis is required, in order to maintain the electronic devices within the chassis at an appropriate temperature.

It is common to cool an electronic module by passing air over or through each case or chassis. The flow of air may be sufficient to remove some heat from inside the enclosure, to the surrounding environment. This method of cooling has, until recently, been used almost exclusively for mass-manufactured IT and server equipment. However, it has been found that, as technology size decreases for the same computing performance, the heat produced by electronic devices is increasing even as the footprint decreases. As such, the peak performance of IT systems has been throttled or constrained by the limitations of cooling an electronic module with air cooled systems.

Accordingly, more complex systems and methods for cooling electronic modules have been proposed. In some cases, liquid cooling has been used, in which a liquid coolant is flowed over, or flowed in proximity to a heat sink coupled to, the electronic devices. The heat can then be transferred away from the electronic devices, to an area or element at which the heat can be removed from the liquid coolant. Liquid cooling can in some cases provide more efficient transfer of heat away from the electronic devices or components, and so a greater cooling power than air cooled systems. However, state of the art liquid cooling systems often require customised systems, which are complex and expensive to install. Furthermore, improvements to the cooling performance will always be desired.

Thus, it is an objective of the present invention to provide a system for cooling an electronic module, and furthermore a method of cooling such a system, which overcomes these drawbacks of prior art systems.

SUMMARY OF THE INVENTION

In view of the above objectives, there is described a system for cooling a plurality of electronic devices, housed in a housing or chassis of an electronic module. The system comprises a first and a second cooling circulatory arrangement, through which a respective first and a second liquid coolant flows. Each circulatory arrangement receives heat transferred from one or more respective electronic devices housed within the electronic module. The first liquid coolant (or first coolant liquid) is cooled by transfer of heat to the second liquid coolant at a heat exchanger. The second liquid coolant (or second coolant liquid) can be a facility level supply, such as a cooling water supply.

Each of the cooling circulatory arrangements are used to cool electronic devices of the plurality of devices within an electronic module. However, the second cooling circulatory arrangement is further configured to cool the coolant circulating in the first cooling circulatory system, by exchange of heat between the first and second liquid coolants via a heat exchanger. The second cooling circulatory arrangement can be configured in a number of different ways. In a first example of the second cooling circulatory arrangement, the cooling modules and heat exchanger (more specifically, the thermally conductive interface for heat transfer within the heat exchanger), are arranged in series, so that, between the first input of the second liquid coolant to the electronic module (through which the lowest temperature second liquid coolant is passed) and the final output of the second liquid coolant from the electronic module (through which the highest temperature second liquid coolant is passed), the cooling module is arranged before the heat exchanger. In a second example of the second cooling circulatory arrangement, the cooling modules and heat exchanger (more specifically, the thermally conductive interface for heat transfer within the heat exchanger) are arranged in series, so that, between the first input of the second liquid coolant to the electronic module (through which the lowest temperature second liquid coolant is passed) and the final output of the second liquid coolant from the electronic module (through which the highest temperature second liquid coolant is passed), the heat exchanger is arranged before the cooling module. In a third example of the second cooling circulatory arrangement, the cooling modules and heat exchanger (specifically, the thermally conductive interface for heat transfer within the heat exchanger) are arranged in parallel between the input of the second liquid coolant to the electronic module (through which the lowest temperature second liquid coolant is passed) and the output of the second liquid coolant from the electronic module (through which the highest temperature second liquid coolant is passed). In a fourth example of the second cooling circulatory arrangement, the cooling modules and the thermally conductive interface for heat transfer within the heat exchanger are arranged in parallel between the input of the second liquid coolant to the electronic module (through which the lowest temperature second liquid coolant is passed) and the output of the second liquid coolant from the electronic module (through which the highest temperature second liquid coolant is passed). Both branches of the second cooling circulatory arrangement pass through the body of the heat exchanger, which has an input and output directly connected to (or acting as) the input and output of the second liquid coolant from the electronic module.

Beneficially, the first example has been shown to provide greater cooling of the particular electronic devices coupled to the cooling module, than compared to the second example. However, the second example has been found to provide greater cooling of the electronic module overall, than compared to the first example. The third example allows for balancing of the cooling power at the cooling module compared to the cooling of the first liquid coolant at the heat exchanger. The fourth example has all the benefits at the third example, for instance for balancing of the cooling power at the cooling module compared with the thermally conductive interface for heat transfer within the heat exchanger (and so balancing the cooling of the device thermally coupled to the cooling module, versus cooling of the devices thermally coupled to the first liquid coolant). However, the third example further offers a configuration with fewer joins and connectors, and so increases the reliability of the system by reducing complexity and potential leakage points.

For each of the described examples, the first cooling circulatory arrangement may provide immersive cooling. In other words, a volume of the first liquid coolant is contained within the chassis or housing of the electronic module, and the first device is at least partially immersed in the volume of first liquid coolant. The first cooling circulatory arrangement causes the first liquid coolant to circulate within the chassis or housing of the electronic module and through the heat exchanger (for instance, by means of a pump within the housing or chassis).

In a particular example, the respective position of the electronic devices and cooling module within an electronic module, as well as the volume of first liquid coolant, can be arranged so that, when the system is in use, the liquid level of the volume of first liquid coolant contained in the housing or chassis is lower than the cooling module. In other words, under normal operation the cooling modules are not in direct contact with the first liquid coolant. This has been found to improve the overall cooling power of the present system.

As such, there is disclosed a combined or hybrid cooling system that uses two cooling loops—a loop which circulates coolant through a cold plate coupled to specific electronic devices, and a immersive cooling loop for cooling a large number of partially immersed electronic devices. The cold plates provide higher performance cooling than the immersive cooling, and focus on cooling the hottest components. However, the cold plates need to be directly mounted to each component to be cooled, and so it would not be practical to mount the cold plate to every hot component within the electronic module. Therefore, the combined cooling approach offered by the described system offers a cooling via a cold plate for the hottest components (usually processors or CPUs) while the rest of the components are cooled by the immersive cooling approach using dielectric coolant. Following this combined approach, by using cold plates to cool the hottest components and immersive cooling to cool other components, this also allows appropriate selection of the coolant level to be as low as possible, instead of relying on a high fill level to completely submerse all elements within the electronic device. This in turn saves on weight and cost.

In a first aspect there is described a system for cooling a plurality of electronic devices, the electronic devices housed in a housing of an electronic module, the system comprising:

a first cooling circulatory arrangement, configured to cause a first liquid coolant to circulate between a first electronic device of the plurality of electronic devices and a heat exchanger, wherein the first electronic device is arranged to be thermally coupled to the first liquid coolant such that, when the system is in use, heat generated at the first electronic device is transferred to the first liquid coolant;

a second cooling circulatory arrangement, configured to cause a second liquid coolant to flow through the heat exchanger, and to cause the second liquid coolant to flow through a cooling module thermally coupled to a second electronic device of the plurality of electronic devices, wherein, when the system is in use, heat generated by the second electronic device is transferred to the second liquid coolant via a surface of the cooling module;

wherein the first cooling circulatory arrangement and the second cooling circulatory arrangement are thermally coupled via the heat exchanger, such that the heat exchanger is configured to transfer heat from the first liquid coolant to the second liquid coolant.

The electronic devices may be any heat generating devices or components, including Integrated Circuits (IC) comprising central processing units (CPUs), Application Specific Integrated Circuits (ASICs), Graphical Processing Units (GPUs), Random Access Memory (RAM), etc. Together the devices may be connected to form a server or other computer processing function, or other IT.

The electronic modules, or server modules, may be a module forming part of a computer server. The electronic module may have a chassis or housing, in which each of the electronic devices are mounted. The electronic module may be configured for mounting or installation into a rack. For instance, the electronic module may conform to the industry standard dimensions required to fit into a standard server rack (known as 1RU (one rack unit) or 1OU (one open unit). Such units may be referred to as a blade server. However, the electronic modules may also be dimensioned to fit other types or sizes or server rack, or made to custom sizes.

The system comprises a first and a second cooling circulatory arrangement (or first and second cooling loop). The cooling circulatory arrangements provide a configuration for flow of a respective first and second coolant through the electronic module.

Specifically, the first cooling circulatory arrangement provides a flow of a first liquid coolant. The first cooling circulatory arrangement may be contained entirely within the housing or chassis of the electronic module, so that the first liquid coolant is circulated around and within the electronic module. Specifically, the first cooling circulatory arrangement circulates or flows the first liquid coolant between the heat exchanger (which may be arranged inside the electronic module) and the first electronic, heat generating device (from which heat is absorbed by the first liquid coolant).

The first cooling circulatory arrangement may provide immersive cooling, so that a pump circulates first liquid coolant from a reservoir contained within the housing of the electronic module, through a pump and the heat exchanger, and then onwards to flow in the vicinity of the first electronic device. Alternatively, the first cooling circulatory arrangement could contain the first liquid coolant in pipes or conduits, for circulation between a heat exchanger and the first electronic device coupled to a cold plate or similar cooling module. In either case, the first liquid coolant is a closed loop, in which the first liquid coolant circulates and is not replaced or replenished.

The second cooling circulatory arrangement provides a flow of a second liquid coolant. In particular, the second cooling circulatory arrangement causes flow of the second liquid coolant through an input to the electronic module to an output to the electronic module, via a heat exchanger and/or one or more cooling modules. The cooling modules may be cold plates or other modules for coupling to specific electronic, heat generating devices such that heat is transferred from the coupled electronic device to the second liquid coolant via the cooling module. The heat exchanger acts to receive heat transferred from the first liquid coolant.

The cooling module may be a specific component for efficient heat transfer from an electronic device (such as a second electronic device) to the second liquid coolant. The cooling module may be coupled to the second electronic device via a mounting surface of the cooling module, so that heat is transferred from the second electronic device to the second liquid coolant through the mounting surface. The cooling module may be a cold plate, as discussed below.

Although in some cases the second cooling circulatory arrangement may be a closed loop (in other words, the liquid coolant is recirculated and recycled within the loop), this is not always the case. In alternative cases, the second cooling circulatory arrangement can describe an open loop, in which liquid coolant is received, flowed around the described pathway, and then passed to a drain. For instance, after passing through the electronic module the second liquid coolant in the second cooling circulatory arrangement is then either cooled (by passing through a cooling system before passing back to the electronic module), or is replenished (for example, where the second liquid coolant is part of a facility wide coolant supply, such as a facility water supply).

Beneficially, the described system is a hybrid system of two cooling circulatory arrangements. The use of such a hybrid system allows a higher performance, more efficient cooling arrangement to be targeted at particularly high temperature components (for instance, the second cooling circulatory arrangement, targeted to cool at least the second electronic device), as well as using a further cooling arrangement to cool other devices. However, more than simply using two entirely separate cooling systems in parallel, the present inventors have recognised that the higher performance cooling arrangement can also be used to remove heat from the other cooling arrangement. To some extent, the first cooling circulatory arrangement may be considered to be nested with the second cooling circulatory arrangement.

Optionally, the first liquid coolant is a dielectric liquid, and the second liquid coolant is water. It will be understood that although the term liquid coolant is used herein, any suitable fluid coolant could be used.

Optionally, the second cooling circulatory arrangement is configured to cause the second liquid coolant to flow through the heat exchanger and from the heat exchanger through the cooling module when the system is in use. More specifically, the flow is from a thermally conductive interface for heat transfer from the first coolant liquid to the second coolant liquid within the heat exchanger. In this configuration, the heat exchanger (or thermally conductive interface for heat transfer at the heat exchanger) and cooling modules are arranged in series within the second cooling circulatory arrangement. In particular, considering the flow of the second liquid coolant within the electronic module, the second liquid coolant is caused to flow from the heat exchanger (or from the thermally conductive interface for heat transfer at the heat exchanger) and towards the cooling module. In other words, between an initial input of the second liquid coolant to the electronic module (when the second liquid coolant is of lowest temperature) and the final output of the second liquid coolant from the electronic module (when the second liquid coolant is of highest temperature), then the second liquid coolant flows from the heat exchanger to the cooling module. This configuration demonstrates a slightly reduced cooling performance at the cooling modules because the second liquid coolant has already received heat from the first liquid coolant via the heat exchanger. However, because the first liquid coolant is cooled through the heat exchanger with second liquid coolant that has just entered the electronic module (and is so at its lowest temperature and not preheated by the cooling module), then the overall cooling of the electronic module is better. This configuration appears to offer improved overall cooling performance, and may be especially useful for electronic modules having a large number of high temperature auxiliary components on a PCB (mounted within the housing of the electronic module and cooled via the first cooling circulatory arrangement).

Alternatively, the second cooling circulatory arrangement is configured to cause the second liquid coolant to flow through the cooling module and from the cooling module through the heat exchanger. More specifically, the flow is through the cooling module to a thermally conductive interface for heat transfer from the first coolant liquid to the second coolant liquid within the heat exchanger. In this configuration, the heat exchanger (or thermally conductive interface for heat transfer at the heat exchanger) and cooling modules are arranged in series within the second cooling circulatory arrangement. In particular, considering the flow of the second liquid coolant within the electronic module, the second liquid coolant is caused to flow from the cooling module and towards the heat exchanger (or towards the thermally conductive interface for heat transfer at the heat exchanger). In other words between an initial input of the second liquid coolant to the electronic module (when the second liquid coolant is of lowest temperature) and the final output of the second liquid coolant from the electronic module (when the second liquid coolant is of highest temperature), then the second liquid coolant flows from the cooling module to the heat exchanger. Beneficially, this system provides higher cooling performance at the cooling module, because the second liquid coolant is fed directly into the cooling module, prior to the heat exchanger. This configuration could be useful in an electronic module where the main processors (or equivalent) operate at a very high temperature and the auxiliary components on the PCB operate at a relatively low temperature. This configuration could also be used in a system where there is particular concern for the processor performance.

Alternatively, the heat exchanger and the cooling module are arranged on parallel branches of the second cooling circulatory arrangement, so that the second cooling circulatory arrangement is configured to cause the second liquid coolant to flow through the heat exchanger and to cause the second liquid coolant to flow through the cooling module in parallel. More specifically, the second cooling circulatory arrangement is configured to cause the second liquid coolant to flow, in a first branch, to make contact with a thermally conductive interface for heat transfer from the first coolant liquid to the second coolant liquid within the heat exchanger, and in a second branch through the cooling module. In other words, considering the flow of the second liquid coolant within the electronic module, the second liquid coolant is caused to flow through the cooling module in parallel to the flow through the heat exchanger. Beneficially, this arrangement may provide better control of the flow of the second liquid coolant through the electronic module, as the flow through the heat exchanger can be balanced against the flow directly through the cooling modules.

Preferably, the housing is configured to contain the first liquid coolant, wherein, when the system is in use, the first electronic device is at least partially immersed in the first liquid coolant contained within the housing. In other words, the first cooling circulatory arrangement is an immersion cooling arrangement. Heat may be transferred directly to the first liquid coolant from a surface of the first electronic device that is at least partially immersed in the first liquid coolant.

In contrast, the second cooling circulatory arrangement may be configured to circulate the second liquid coolant through a cooling module and the heat exchanger (specifically, the thermally conductive interface for heat transfer at the heat exchanger), where the cooling module is coupled to the second electronic device at a mounting surface of the cooling module. Therefore, heat is exchanged between the second electronic device and the second liquid coolant via the mounting surface of the second cooling module. The cooling module forming part of the second cooling circulatory arrangement is discussed in more detail below.

Preferably, the first cooling circulatory arrangement is housed entirely within the housing. In other words, the first cooling circulatory arrangement is arranged so that the first liquid coolant does not leave the confines of the housing or chassis of the electronic module when in normal operation.

The first cooling circulatory arrangement may be at least partially insulated from the second cooling circulatory arrangement, except at the heat exchanger at which the first and second cooling circulatory arrangement are thermally coupled. This avoids increasing the temperature of the second liquid coolant except in the specific regions of the cooling device and the heat exchanger, in order to maximise the cooling power (or more specifically, the temperature gradient) at the cooling device and heat exchanger.

Preferably, the housing is configured to contain a volume of first liquid coolant which, when the system is in use, fills the housing to a liquid level, wherein the cooling module is arranged within the housing to be above the liquid level of the first liquid coolant, and the first electronic device is arranged within the housing to be at least partially immersed in the first liquid coolant contained within the housing. In other words, the sides and top of the cooling module are not in contact with the first liquid coolant when the system is in use. Preferably, the cooling module is not submersed nor partially immersed in the first liquid coolant. Preferably, the majority of heat exchange between the first and second liquid coolant takes place within the heat exchanger, such that the first and second liquid coolants are substantially thermally uncoupled except at heat exchanger. Providing heat exchange only at the heat exchanger provides greater control of the temperature of the second (and first) liquid coolant at different elements of each circulatory system, and so the temperature gradient for heat exchange at each element. The overall first liquid coolant level can be very low, ensuring that there is minimal contact with the outer walls of the cooling module. In some instances the first liquid coolant level could be low enough that it does not contact the cooling module at all. As such, this offers a cost effective and simple solution to prevent heat transfer from the first liquid coolant to the second liquid coolant via the cooling module.

Preferably, the heat exchanger comprises at least a first chamber and a second chamber separated from each other by a thermally conductive interface, wherein the heat exchanger is configured for flow of the first liquid coolant through at least the first chamber, and flow of the second liquid coolant through at least the second chamber, such that heat is transferred from the first liquid coolant to the second liquid coolant through the thermally conductive interface. The heat exchanger is a dedicated element configured for exchange of heat between the first and second liquid coolant. Each of the first and the second liquid coolant may pass through one or more respective chambers of the heat exchanger, wherein heat can pass from the first to the second liquid coolant via a thermal interface between the chambers. The heat exchanger may be of any suitable design, and may provide a plurality of chambers and a plurality of thermal interfaces, in order to improve the efficiency of heat exchange. Fins or other protrusions may be provided at the thermal interface, to increase the surface area of the thermal interface and promote efficiency of heat exchange between the first and second liquid coolant. Optionally, the heat exchanger is a plate heat exchanger. Optionally, a specific configuration for the heat exchanger may be used, having two or more pathways through the second chamber, wherein some of the pathways do not make contact with, or cause the second liquid coolant to flow past, the thermally conductive interface. Thus, only second liquid coolant at some of the pathways through the second chamber receives heat transferred from the first liquid coolant.

Preferably, the heat exchanger is arranged within the housing of the electronic module. In particular, the heat exchanger is contained within the electronic module. This allows at least the first liquid coolant to be entirely retained within the electronic module. This reduces the complexity of connections into and out of the electronic module. It also allows provision of the electronic module as a sealed module, which may be advantageous where the second liquid coolant is a dielectric, and which may be harmful to humans if released from the module, and which may be expensive to replace if leaked or lost.

Preferably, the first cooling circulatory arrangement further comprises a weir, the weir comprising:
 a base and a retaining wall extending from the base, the base and retaining wall defining a volume for holding some of the first liquid coolant;
 a weir inlet, through which the first liquid coolant flows into the volume;
 wherein the flow of sufficient first liquid coolant through the weir inlet into the volume causes the first liquid coolant to overflow the retaining wall and collect with first liquid coolant contained in the housing of the electronic module and exterior the weir. In an alternative, the a base and a retaining wall extending from the base further comprise one or more holes, such that the flow of sufficient first liquid coolant through the weir inlet into the volume causes the first liquid coolant to flow through the one or more holes and collect with first liquid coolant contained in the housing of the electronic module and exterior the weir.

The base and retaining walls may provide a container or 'bath tub' from which the first liquid coolant may overflow. In an alternative, holes may be provided in the base or retaining walls, through which the first liquid coolant can flow. The weir may be coupled to the surface of a first electronic device, in order to act as a heat sink for the first electronic device. Alternatively, the first electronic device can be arranged inside the volume of the weir. In either case, the weir provides a volume for holding or retaining liquid coolant against the heat-generating electronic device. Alternatively, or in addition, the weir may be mounted on a PCB that is raised compared to other components in the electronic device, and/or compared to the level of first coolant within the cavity of the housing of the electronic module. In this way, the first liquid coolant then acts to flow over the first electronic device and a number of other electronic devices or components housed in the electronic module, as it overflows or flows out of the weir.

The weir may be configured to direct the flow of the first liquid coolant circulating through the first cooling circulatory arrangement. In other words, the weir may be configured such that first liquid coolant overflowing or flowing out of the weir flows on to or over specific electronic devices housed within the electronic module. Advantageously, by inclusion of the weir in the first cooling circulatory arrangement the liquid coolant can be applied more effectively to the place or places where the most heat is generated. Less coolant can therefore be used. Since the coolant is expensive and heavy, reducing the quantity of coolant can improve flexibility, efficiency and reliability (for example, since coolant leakages are less likely and because the coolant in the volume can resist instant temperature changes caused by the failure of other components in the system). Reducing the overall liquid level of the first coolant in the housing of the electronic module also allows separation between the first liquid coolant and the cooling module, as discussed elsewhere.

In respect of the weir, the volume for holding or retaining the first liquid coolant can be defined by a base and a retaining wall (which may be integral or separate). The base is the part of the weir which may be mounted on top of an electronic device (more specifically, a heat-transmitting surface of an electronic device) or to which an electronic device within the weir may be attached. As such, the base acts to transfers heat from the heat-transmitting surface. The base typically has a planar surface defining the volume (and the base itself may be planar in shape). Heat transferred (typically conducted) through the base (in particular its surface defining the volume) is transferred to the liquid coolant held in the volume. The retaining wall extends from the base.

One effect of the weir is to raise the level of the coolant held within the weir's volume above that of the reservoir of first liquid coolant within the electronic module (at least when the cooling module is operated with the plane of the electronic device and/or circuit board horizontal). The weir may be upon raised PCBs that are raised above the first liquid coolant in the housing of the electronic module. The flow of first liquid coolant form the weir then cools all other components as it returns to the pump inlet. The raised weir heat sinks mean that the fill level of coolant can be just enough to cover any electronic device mounted in the electronic module. As such, the quantity of coolant within the container of the cooling module can be lower than the height of the retaining wall, and a lower liquid level for the reservoir of the first liquid coolant can be achieved.

Preferably, the weir inlet comprises a nozzle arrangement, for directing the first liquid coolant flowing into the volume. The nozzle arrangement may comprise one or more nozzles (which may be push-fit), each of which directs the flowing or pumped first liquid coolant to a respective part of the volume of the weir, particularly a part of the weir's base. The one or more nozzle may each be arranged in the base, in the retaining wall or arranged over the top of the volume to cause first liquid coolant to flow into the volume. For instance, each nozzle may direct the flowing or pumped liquid coolant to a respective part of the volume of the weir adjacent a part of a heat-transmitting surface of an electronic device having a maximum temperature or a temperature above a threshold level (that is, one of the hottest parts of the device). Most preferably, the nozzle arrangement directs the flowing or pumped liquid coolant in a direction perpendicular to the base of the weir. This may force the coolant directly into the volume and improve heat dissipation.

Preferably, the weir further comprises projections (such as pins and/or fins) extending from the base (or from the retaining wall) within the volume. The projections may cause the liquid coolant to spread in a radial direction away from a predetermined point on a surface of the base (for example coincident with a hottest part of the electronic device). In particular, the projections may be formed in a non-linear pattern.

Preferably, the weir is coupled to a surface of the first electronic device, to act as a heat sink, or the first electronic device is located within the volume of the weir.

Preferably, the first cooling circulatory arrangement further comprises a pump configured to circulate the first liquid coolant around the first cooling circulatory arrangement. The pump may be arranged to receive first liquid coolant from the reservoir of liquid coolant contained within the electronic module, and in which at least the first electronic device is at least partially immersed. The pump may then move the received first liquid coolant to another region of the electronic module, for instance to the heat exchanger, and then onwards to the inlet of the weir. The pump may be at least partially immersed in the first liquid coolant, the first liquid coolant thereby also assisting in the cooling of the pump.

Preferably, the first cooling circulatory arrangement further comprises a pump inlet, arranged to receive first liquid coolant contained in the housing of the electronic module and exterior the weir. In other words, first liquid coolant contained within the electronic module may be received by the pump inlet, to be passed to the pump.

Preferably, the first cooling circulatory arrangement further comprises at least a first and a second pipe, arranged to transport the first liquid coolant from the pump to the heat exchanger and from the heat exchanger to the weir inlet, respectively.

Preferably, the cooling module comprises a cold plate, the cold plate comprising a cold plate housing, a surface of the cold plate housing being arranged to provide a thermal interface for cooling the second electronic device which is thermally coupled thereto; and at least one channel within the cold plate housing and proximate to the surface of the cold plate housing, the at least one channel arranged for the second liquid coolant to flow therethough such that heat received from the second electronic device through the surface of the cold plate housing is transferred to the second liquid coolant.

Advantageously, the cold plate provides an efficient and effective mechanism for cooling specific electronic devices in the electronic module. The cold plate provides high performance cooling for the second electronic device to which it is thermally coupled. Therefore, the cold plate can be coupled to the hottest component or components within the electronic module, in order to provide superior and targeted cooling power to these components Optionally, the surface of the cold plate housing may be directly coupled to a surface of the second electronic device. Alternatively, the housing may be coupled by a further interfacing surface or component. Nevertheless, the cold plate and the second electronic device will be thermally coupled, to promote effective and efficient heat transfer from the second electronic device to the second liquid coolant.

More than one cold plate may be arranged in the electronic module, as part of the second cooling circulatory arrangement. Two or more cold plates may be arranged in the second cooling circulatory arrangement in parallel or in series, or where three or more cold plates are used, a combination of parallel and series configurations could be implemented.

Preferably, the second cooling circulatory arrangement further comprises a plurality of conduits arranged to transport the second liquid coolant between the cooling module, the heat exchanger and any external cooling system or coolant supply that is external to the electronic module.

Optionally, the second cooling circulatory arrangement further comprises a cooling system, wherein the second cooling circulatory arrangement is configured to circulate the second liquid coolant between the cooling modules and heat exchanger (or more specifically the thermally conductive interface at the heat exchanger) within the electronic device and the cooling system (which is external to the electronic module). The cooling system removes heat from the second liquid coolant via the cooling system. In other words, the second cooling circulatory arrangement forms a closed loop, in which the second liquid coolant received from the electronic module is cooled by a cooling system, before being returned to the electronic module.

Alternatively, the second cooling circulatory arrangement is connected to a second liquid coolant supply, wherein the second cooling circulatory arrangement is configured to circulate the second liquid coolant received from the second liquid coolant supply between the cooling modules and heat exchanger (or more specifically the thermally conductive interface at the heat exchanger) within the electronic device, and then to be returned to the second liquid coolant supply. In other words, the second cooling circulatory arrangement is an open loop, and the second liquid coolant is fed from a facility level supply, and constantly replenished. For instance, the second liquid coolant supply may be a water supply, from which water is received (as the second liquid coolant), circulated through the second cooling circulatory arrangement, and then allowed to exit the second cooling circulatory arrangement to facility drainage.

In a second aspect there is described a method for cooling a plurality of electronic devices, the electronic devices housed in a housing of an electronic module, the system comprising:
  circulating a first liquid coolant around a first cooling circulatory arrangement, comprising causing a first liquid coolant to circulate between a first electronic device of the plurality of electronic devices and a heat exchanger, wherein the first electronic device is arranged to be thermally coupled to the first liquid coolant such that heat generated at the first electronic device is transferred to the first liquid coolant;
  transporting a second liquid coolant around a second cooling circulatory arrangement, comprising causing a second liquid coolant to flow through the heat exchanger, and causing the second liquid coolant to flow through a cooling module thermally coupled to a second electronic device of the plurality of electronic devices, wherein heat generated by the second electronic device is transferred to the second liquid coolant via a surface of the cooling module;
  wherein the first cooling circulatory arrangement and the second cooling circulatory arrangement are thermally coupled via the heat exchanger, such that heat from the first liquid coolant is transferred to the second liquid coolant via the heat exchanger.

In other words, the method may comprise circulating a first liquid coolant around a first cooling circulatory arrangement, and circulating a second liquid coolant around a second cooling circulatory arrangement. Each of the first and second cooling circulatory arrangements are configured to cool at least respective first and second electronic devices. Moreover, the second cooling circulatory arrangement is configured such that the second liquid coolant receives heat transferred from the first liquid coolant at a heat exchanger. Advantageously, this hybrid cooling system provides the benefits of a high performance cooling system in relation to the hottest components (the second cooling circulatory arrangement, targeting the second electronic device), but then uses a further cooling system for cooling the other components in the electronic module. In particular, it may not be practical to mount a targeted cooling system (such as provided by the second cooling circulatory arrangement) to every component within the electronic module, and so the first cooling circulatory arrangement may provide an additional cooling system for the remaining components and to lower the temperature of the general environment within the electronic module.

It will be understood that the features discussed above with respect to the system, can also be considered to be disclosed with respect to the method for cooling the plurality of electronic devices housed in the housing of the electronic module. Any characteristics or benefits of a feature described above (with respect to the system) can also be considered to apply to a corresponding feature in relation to the method, as described below.

Preferably, transporting the second liquid coolant around the second cooling circulatory arrangement comprises causing the second liquid coolant to flow through the heat exchanger and from the heat exchanger through the cooling module when the system is in use. More specifically, the flow is from a thermally conductive interface for heat transfer from the first coolant liquid to the second coolant liquid within the heat exchanger, through the cooling module. In other words, considering the flow of the second liquid coolant inside the electronic module, the second liquid coolant flows from the heat exchanger (or thermally conductive interface for heat transfer at the heat exchanger) to the cooling module. This configuration provides better overall cooling of the electronic module (although at the expense of some cooling power at the cooling module).

Preferably, transporting the second liquid coolant around the second cooling circulatory arrangement comprises causing the second liquid coolant to flow through the cooling module and from the cooling module through the heat exchanger. More specifically, the flow is through the cooling module to a thermally conductive interface for heat transfer from the first coolant liquid to the second coolant liquid within the heat exchanger. In other words, considering the flow of the second liquid coolant inside the electronic module, the second liquid coolant flows from the cooling module to the heat exchanger (or to the thermally conductive interface for heat transfer at the heat exchanger). This configuration provides the maximum cooling power for any electronic device coupled directly to the cooling module.

Preferably, the heat exchanger and the cooling module are arranged on parallel branches of the second cooling circulatory arrangement, and wherein transporting the second liquid coolant around the second cooling circulatory arrangement comprises causing the second liquid coolant to flow through the heat exchanger and causing the second liquid coolant to flow through the cooling module in parallel. More specifically, the transporting the second liquid coolant around the second cooling circulatory arrangement comprises causing the second liquid coolant to flow on a first branch to make contact with a thermally conductive interface for heat transfer from the first coolant liquid to the second coolant liquid within the heat exchanger, and on a second branch through the cooling module. In other words, considering the flow of the second liquid coolant inside the electronic module, the second liquid coolant flows through the heat exchanger in parallel to flow through the cooling module. Beneficially, this configuration allows balancing of the flow of the second liquid coolant through the cooling module compared to the heat exchanger.

Preferably, the housing is configured to contain the first liquid coolant and the first electronic device is at least partially immersed in the first liquid coolant contained within the housing. In other words, the housing of the electronic device contains a reservoir of the first liquid coolant, in which the first electronic device (and possibly other electronic devices) is/are at least partially immersed. Heat is therefore transferred directly to the first liquid coolant from a surface of the first electronic device or other device that is at least partially immersed in the first liquid coolant. The housing may be a sealable chassis, to contain the first liquid coolant. A volume or reservoir of first liquid coolant is contained within the housing of the electronic module, which at least partially fills the cavity enclosed within the chassis. As such, the first liquid coolant is directly in contact with the at least partially immersed electronic devices, so that heat can be transferred from the electronic devices to the first liquid coolant.

Preferably, the housing is configured to contain a volume of first liquid coolant which fills the housing to a liquid level, wherein the cooling module is arranged within the housing to be above the liquid level of the first liquid coolant, and the first electronic device is arranged within the housing to be at least partially immersed in the first liquid coolant contained within the housing. In other words, the first liquid coolant is not in contact with the top or sides of the cooling module. Ideally, the cooling module may not be in contact with the first liquid coolant directly. Preferably, the cooling module is thermally uncoupled from the first liquid coolant.

The heat exchanger may comprise at least a first and a second chamber separated by a thermal interface, wherein the heat exchanger is configured for flow of the first liquid coolant through at least the first chamber, and flow of the second liquid coolant through at least the second chamber, such that heat is transferred from the first liquid coolant to the second liquid coolant through the thermal interface. The heat exchanger is a specific element configured for efficient transfer of heat between the first and second liquid coolant. The heat exchanger may be of any suitable design to allow the separate flow of the first and second liquid coolant therethrough and to exchange heat therebetween. Optionally the heat exchanger is a plate heat exchanger. Optionally, a specific configuration for the heat exchanger may be used, having two or more pathways through the second chamber, wherein some of the pathways do not make contact with, or cause the second liquid coolant to flow past, the thermally conductive interface.

Preferably, the heat exchanger is arranged within, or contained within, the housing of the electronic module. Beneficially, this avoids the first liquid coolant from passing out of the electronic module. This both reduces the complexity of connections at the housing of the electronic module, and also reduces the risk for leaks or loss of the first liquid coolant.

Preferably, the cooling module may be mounted or coupled to a surface of a second electronic device. The cooling module may provide a mechanism for indirect transfer of heat from the second electronic device to the second liquid coolant, via the cooling module (in other words, the second liquid coolant does not make direct contact with surfaces of the second electronic device, but instead heat is transferred from the second electronic device through a portion of the cooling module, to be received at the second liquid coolant). The cooling module may provide a higher cooling power, and assist in more efficient cooling of the coupled electronic device than could otherwise be provided by the first cooling circulatory arrangement.

In a preferred example, providing the cooling module within the second cooling circulatory arrangement comprises providing a cold plate, the cold plate comprising:
  a cold plate housing, a surface of the cold plate housing being arranged to provide a thermal interface for cooling the second electronic device which is thermally coupled thereto; and
  at least one channel within the cold plate housing and proximate to the surface of the cold plate housing, the at least one channel arranged for the second liquid coolant to flow therethough such that heat received from the second electronic device through the surface of the cold plate housing is transferred to the second liquid coolant.

More than one cold plate can be provided, which may be arranged in parallel or in series within the second cooling circulatory arrangement. The surface of the cold plate housing may be directly coupled to a surface of the second electronic device, or may be coupled via an interface to promote effective heat transfer.

The method may further comprise providing, within the second cooling circulatory arrangement, a plurality of conduits or pipes arranged to transport the second liquid coolant between the cold plate, the heat exchanger and the cooling system.

Preferably the first cooling circulatory arrangement may comprise a weir. The weir may comprise:
  a base and a retaining wall extending from the base, the base and retaining wall defining a volume for holding some of the first liquid coolant;
  an inlet, through which the first liquid coolant flows into the volume;
  wherein flowing sufficient first liquid coolant through the inlet into the volume causes the first liquid coolant to overflow the retaining wall and collect with first liquid coolant contained in the housing of the electronic module and exterior the weir. In an alternative, the a base and a retaining wall extending from the base further comprise one or more holes, such that the flow of sufficient first liquid coolant through the weir inlet into the volume causes the first liquid coolant to flow through the one or more holes and collect with first liquid coolant contained in the housing of the electronic module and exterior the weir.

Advantageously, the weir acts to promote flow of the first liquid coolant within the electronic module. The weir may further be arranged to direct the flow of the first liquid coolant circulating through the first cooling circulatory arrangement to specific electronic components.

In a particular example, the base of the weir may be thermally coupled to the first electronic device. The first electronic device may be positioned within the volume of the weir. In this way, the weir acts as an effective heat sink for the first electronic device. The weir also maintains a flow of first liquid coolant which may cool heat generating components arranged around the first electronic device to which the weir is coupled.

The inlet may further comprise a nozzle arrangement for directing the first liquid coolant flowing into the volume. The nozzle arrangement comprises one or more nozzle.

The weir may further comprise projections extending from the base and/or retaining wall within the volume of the weir.

The method may further comprise providing a pump within the first cooling circulatory arrangement, the pump configured to circulate the first liquid coolant around the first cooling circulatory arrangement. The first cooling circulatory arrangement may further comprise a pump inlet, for receiving first liquid coolant contained in the housing of the electronic module and exterior the weir.

The method may further comprise providing a plurality of pipes within the first cooling circulatory arrangement, arranged to transport the first liquid coolant from the pump to the heat exchanger and the from the heat exchanger to the inlet of the weir, respectively.

Preferably, the second cooling circulatory arrangement further comprises a cooling system, wherein the transporting the second liquid coolant around the second cooling circulatory arrangement comprises transporting the second liquid coolant to the cooling module, to the heat exchanger (or thermally conductive interface at the heat exchanger) and to the cooling system, where heat is removed from the second liquid coolant by the cooling system. The cooling system may be external to the electronic module, and configured to transfer heat out of the second liquid coolant. For instance, the cooling system may comprise a heat exchanger to transfer heat to a further (third) liquid coolant or medium.

Alternatively, the second cooling circulatory arrangement further comprises a second liquid coolant supply, wherein transporting the second liquid coolant around the second cooling circulatory arrangement comprises receiving the second liquid coolant from the second liquid coolant supply, transporting the second liquid coolant to the second electronic device of the plurality of electronic devices and to the heat exchanger (or thermally conductive interface at the heat exchanger), to then be returned to the second liquid coolant supply. For instance, the second liquid coolant may be water, and the second cooling circulatory arrangement may be connected to a facility water supply. Once the water is circulated through the second cooling circulatory arrangement, it may be allowed to pass into a drainage system (and so would not be recirculated through the second cooling circulatory arrangement).

In a third aspect, there is a system for cooling a plurality of electronic devices, the electronic devices housed in a housing of an electronic module, the system comprising:
  a first cooling circulatory arrangement, configured to cause a first liquid coolant to circulate between a first electronic device of the plurality of electronic devices and a first chamber of a heat exchanger, wherein the first electronic device is arranged to be thermally coupled to the first liquid coolant such that, when the system is in use, heat generated at the first electronic device is transferred to the first liquid coolant;
  a second cooling circulatory arrangement, configured to cause a second liquid coolant to flow through a second chamber of the heat exchanger, and to cause the second liquid coolant to flow through a cooling module thermally coupled to a second electronic device of the plurality of electronic devices, wherein, when the system is in use, heat generated by the second electronic device is transferred to the second liquid coolant via a surface of the cooling module;
  wherein the first cooling circulatory arrangement and the second cooling circulatory arrangement are thermally coupled via a thermally conductive interface separating the first and the second chamber of the heat exchanger, such that, in use, the heat exchanger is configured to transfer heat from the first liquid coolant in the first chamber to the second liquid coolant in the second chamber via the thermally conductive interface.

As in the system described further above, in this system the first cooling circulatory system provides an arrangement for the flow of the first coolant liquid. In particular the first coolant liquid may circulate or flow entirely within the housing or chassis of the electronic module. The flow may be between the thermally conductive interface at the first chamber of the heat exchanger and the first electronic, heat generating device. The first electronic, heat generating device may be at least partially immersed in the first liquid coolant, so that the housing or chassis of the electronic module act as a bath or reservoir for the first liquid coolant. In this arrangement, the first liquid coolant is circulated around the reservoir from the first electronic device to the heat exchanger (and more specifically, the thermally conductive interface at the heat exchanger) by use of a pump.

The second cooling circulatory arrangement provides an arrangement for flow of the second liquid coolant. The second cooling circulatory arrangement causes flow of a second liquid coolant to cooling modules and past a thermally conductive interface at the second chamber of the heat exchanger. The second cooling liquid receives heat transferred from an electronic device coupled to the cooling modules, and receives heat from the first liquid coolant via the thermally conductive interface.

The cooling modules are a particular component providing efficient heat transfer from an electronic device to the second liquid coolant, without the second liquid coolant making direct contact with the electronic device. The cooling module may be a cold plate having channels for the second liquid coolant to pass therethrough. A surface of the cold plate may be mounted on or coupled to a surface of the electronic device, so that heat can pass through the coupled surfaces.

The system uses a heat exchanger, having at least a first and a second chamber that are separated, at least in part, by the thermally conductive interface. First liquid coolant is arranged to flow through the first chamber as part of the first cooling circulatory arrangement, and second liquid coolant is arranged to flow through the second chamber as part of the second cooling circulatory arrangement. As the liquid coolants flow past or make contact with the thermally conductive interface, heat transfers from the hotter to the cooler liquid. By this mechanism, heat transfers through the thermally conductive interface from the first to the second liquid coolant. The heat exchanger may be a plate heat exchanger. The plate heat exchanger may be of typical design, or may be of the design described below, having six input/output ports and/or at least two channels through one of the chambers (such as the second chamber).

Beneficially, the described system is a hybrid system, or nested system, of two cooling circulatory arrangements. The use of such a hybrid system allows a higher performance, more efficient cooling arrangement to be targeted at particularly high temperature components (for instance, the second cooling circulatory arrangement, targeted to cool at least the second electronic device), as well as using a further cooling arrangement to cool other devices. The system provides a mechanism for energy efficient cooling of the various heat generating components within an electronic module, and is space efficient within the volume of the housing of the electronic module.

Optionally, the first liquid coolant is a dielectric liquid, and the second liquid coolant is water. It will be understood that although the term liquid coolant is used herein, any suitable fluid coolant could be used.

Preferably, the second cooling circulatory arrangement is configured to cause the second liquid coolant to flow through the second chamber of the heat exchanger and from the second chamber of the heat exchanger through the cooling module when the system is in use. Preferably, the second cooling circulatory arrangement is configured to cause the second liquid coolant to flow from the thermally conductive interface at the second chamber of the heat exchanger to the cooling module when the system is in use. In other words, the second cooling circulatory arrangement is configured having the thermally conductive interface at the second chamber of the heat exchanger (where heat is transferred from the first liquid coolant) and the cooling module arranged in series. The thermally conductive interface at the heat exchanger precedes the cooling module in the direction of flow of the second liquid coolant in this arrangement. Although this arrangement slightly reduces the cooling power at the cooling modules (as the temperature of the second liquid coolant passing through the cooling modules is higher than compared to other described configurations), this configuration provides especially efficient cooling to the first liquid coolant. This configuration may be especially useful for electronic modules having a large number of high temperature auxiliary components on a PCB (mounted within the housing of the electronic module and cooled via the first cooling circulatory arrangement).

Alternatively, the second cooling circulatory arrangement is configured to cause the second liquid coolant to flow through the cooling module and from the cooling module through the second chamber of the heat exchanger, when the system is in use. Preferably, the second cooling circulatory arrangement is configured to cause the second liquid coolant to flow from the cooling modules to the thermally conductive interface at the second chamber of the heat exchanger when the system is in use. In other words, the second cooling circulatory arrangement is configured having the cooling modules and the thermally conductive interface at the second chamber of the heat exchanger (where heat is transferred from the first liquid coolant) arranged in series. The cooling module precedes the thermally conductive interface at the heat exchanger in the direction of flow of the second liquid coolant in this arrangement. Beneficially, this system provides higher cooling performance at the cooling module. This configuration could be useful in an electronic module where the main processors (or equivalent) operate at a very high temperature and the auxiliary components on the PCB operate at a relatively low temperature.

Alternatively, the cooling module and the thermally conductive interface at the heat exchanger are arranged on parallel first and second branches of the second cooling circulatory arrangement, wherein the second cooling circulatory arrangement is configured to cause the second liquid coolant to flow through the first branch of the second cooling circulatory arrangement comprising the cooling module and to cause the second liquid coolant to flow through the second branch of the second cooling circulatory arrangement comprising the thermally conductive interface at the heat exchanger. In other words, the cooling modules and the thermally conductive interface at the heat exchanger are arranged in parallel. This configuration can allows for balancing of the cooling power of the second cooling circulatory arrangement between the cooling modules and the cooling of the first liquid coolant, for instance if different proportions of the second liquid coolant are passed through each branch of the second cooling circulatory arrangement. Furthermore, in this configuration both the cooling modules and thermally conductive interface receive the second liquid coolant at its lowest temperature, and so provide the maximum cooling power at each entity.

Preferably, the heat exchanger comprises a plurality of pathways through the second chamber, wherein the first branch of the second cooling circulatory arrangement is configured to cause the second liquid coolant to flow through a first pathway through the second chamber of the heat exchanger and through the cooling module, and the second branch of the second cooling circulatory arrangement is configured to cause the second liquid coolant to flow through a second pathway through the second chamber of the heat exchanger past the thermally conductive interface. In an example, both branches of the second cooling circulatory arrangement pass through the body, and more specifically the second chamber, of the heat exchanger, but only one branch passes or makes contact with the thermally conductive interface therein. Thus, only one branch directly receives heat transferred from the first liquid coolant via the thermally conductive interface. This configuration allows use of a heat exchanger that is more space efficient within the volume of the housing or chassis of the electric module.

Preferably, the first pathway through the second chamber of the heat exchanger does not flow past the thermally conductive interface. In other words, the second pathway flows past the thermally conductive interface, in order for second liquid coolant flowing in the second pathway to receive heat from the first liquid coolant, whereas second liquid coolant flowing through the first pathway does not directly receive heat from the first liquid coolant via the thermally conductive interface.

Preferably, the housing is configured to contain the first liquid coolant and wherein, when the system is in use, the first electronic device is at least partially immersed in the first liquid coolant contained within the housing. In other words, the first cooling circulatory arrangement is arranged so that the first liquid coolant does not leave the confines of the housing or chassis of the electronic module when in normal operation. The first liquid coolant may be a reservoir within the housing of the electronic module, and in which the first electronic device is at least partially immersed. Partial immersion allows direct contact between the first liquid coolant and the first device, and so efficient heat transfer therebetween.

The first cooling circulatory arrangement may be at least partially insulated from the second cooling circulatory arrangement, except at the thermally conductive interface at the heat exchanger at which the first and second cooling circulatory arrangement are thermally coupled. This avoids increasing the temperature of the second liquid coolant except in the specific regions of the cooling modules and the heat exchanger, in order to maximise the cooling power (or more specifically, the temperature gradient) at the cooling modules and heat exchanger.

Preferably, the housing is configured to contain a volume of first liquid coolant which, when the system is in use, fills the housing to a liquid level, wherein the cooling module is arranged within the housing to be above the liquid level of the first liquid coolant, and the first electronic device is arranged within the housing to be at least partially immersed in the first liquid coolant contained within the housing. In other words, the sides and top of the cooling module are not in contact with the first liquid coolant when the system is in use. Preferably, the cooling module is not submersed nor partially immersed in the first liquid coolant. Preferably, the majority of heat exchange between the first and second liquid coolant takes place within the heat exchanger, such that the first and second liquid coolants are substantially thermally uncoupled except at the heat exchanger. Providing heat exchange only at the heat exchanger provides greater control of the temperature of the second (and first) liquid coolant at different elements of each circulatory system, and so the temperature gradient for heat exchange at each element. The overall first liquid coolant level can be very low, ensuring that there is minimal contact with the outer walls of the cooling module. In some instances the first liquid coolant level could be low enough that it does not contact the cooling module at all. As such, this offers a cost effective and simple solution to prevent heat transfer from the first liquid coolant to the second liquid coolant via the cooling module.

Preferably, the first cooling circulatory arrangement further comprises a weir, the weir comprising:
 a base and a retaining wall extending from the base, the base and retaining wall defining a volume for holding some of the first liquid coolant;
 a weir inlet, through which the first liquid coolant flows into the volume;
 wherein the flow of sufficient first liquid coolant through the weir inlet into the volume causes the first liquid coolant to overflow the retaining wall and collect with first liquid coolant contained in the housing of the electronic module and exterior the weir. In an alternative, the base and retaining wall extending from the base further comprise one or more holes, such that the flow of sufficient first liquid coolant through the weir inlet into the volume causes the first liquid coolant to flow through the one or more holes and collect with first liquid coolant contained in the housing of the electronic module and exterior the weir.

The base and retaining walls may provide a container or 'bath tub' from which the first liquid coolant may overflow. In an alternative, holes may be provided in the base or retaining walls, through which the first liquid coolant can flow. The weir may be coupled to the surface of a first electronic device, in order to act as a heat sink for the first electronic device. Alternatively, the first electronic device can be arranged inside the volume of the weir. In either case, the weir provides a volume for holding or retaining liquid coolant against the heat-generating electronic device. Alternatively, or in addition, the weir may be mounted on a PCB that is raised compared to other components in the electronic device, and/or compared to the level of first coolant within the cavity of the housing of the electronic module. In this way, the first liquid coolant then acts to flow over the first electronic device and a number of other electronic devices or components housed in the electronic module, as it overflows or flows out of the weir.

The weir may be configured to direct the flow of the first liquid coolant circulating through the first cooling circulatory arrangement. In other words, the weir may be configured such that first liquid coolant overflowing or flowing out of the weir flows on to or over specific electronic devices housed within the electronic module. Advantageously, by inclusion of the weir in the first cooling circulatory arrangement the liquid coolant can be applied more effectively to the place or places where the most heat is generated. Less coolant can therefore be used. Since the coolant is expensive and heavy, reducing the quantity of coolant can improve flexibility, efficiency and reliability (for example, since coolant leakages are less likely and because the coolant in the volume can resist instant temperature changes caused by the failure of other components in the system). Reducing the overall liquid level of the first coolant in the housing of the electronic module also allows separation between the first liquid coolant and the cooling module, as discussed elsewhere.

In respect of the weir, the volume for holding or retaining the first liquid coolant can be defined by a base and a retaining wall (which may be integral or separate). The base is the part of the weir which may be mounted on top of an electronic device (more specifically, a heat-transmitting surface of an electronic device) or to which an electronic device within the weir may be attached. As such, the base acts to transfers heat from the heat-transmitting surface. The base typically has a planar surface defining the volume (and the base itself may be planar in shape). Heat transferred (typically conducted) through the base (in particular its surface defining the volume) is transferred to the liquid coolant held in the volume. The retaining wall extends from the base.

One effect of the weir is to raise the level of the coolant held within the weir's volume above that of the reservoir of first liquid coolant within the electronic module (at least when the cooling module is operated with the plane of the electronic device and/or circuit board horizontal). The weir may be upon raised PCBs that are raised above the first liquid coolant in the housing of the electronic module. The flow of first liquid coolant form the weir then cools all other components as it returns to the pump inlet. The raised weir heat sinks mean that the fill level of coolant can be just enough to cover any electronic device mounted in the electronic module. As such, the quantity of coolant within the container of the cooling module can be lower than the height of the retaining wall, and a lower liquid level for the reservoir of the first liquid coolant can be achieved.

Preferably, the weir inlet further comprises a nozzle arrangement, for directing the first liquid coolant flowing into the volume. The nozzle arrangement may comprise one or more nozzles (which may be push-fit), each of which directs the flowing or pumped first liquid coolant to a respective part of the volume of the weir, particularly a part of the weir's base. The one or more nozzle may each be arranged in the base, in the retaining wall or arranged over the top of the volume to cause first liquid coolant to flow into the volume. For instance, each nozzle may direct the flowing or pumped liquid coolant to a respective part of the volume of the weir adjacent a part of a heat-transmitting surface of an electronic device having a maximum temperature or a temperature above a threshold level (that is, one of the hottest parts of the device). Most preferably, the nozzle arrangement directs the flowing or pumped liquid coolant in a direction perpendicular to the base of the weir. This may force the coolant directly into the volume and improve heat dissipation.

Preferably, the weir further comprises projections extending from the base and/or retaining wall within the volume of the weir. The projections may cause the liquid coolant to spread in a radial direction away from a predetermined point on a surface of the base (for example coincident with a hottest part of the electronic device). In particular, the projections may be formed in a non-linear pattern.

Preferably, the weir is coupled to a surface of the first electronic device, to act as a heat sink, or wherein the first electronic device is located within the volume of the weir.

Preferably, the first cooling circulatory arrangement further comprises a pump configured to circulate the first liquid coolant around the first cooling circulatory arrangement. The pump may be arranged to receive first liquid coolant from the reservoir of liquid coolant contained within the electronic module, and in which at least the first electronic device is at least partially immersed. The pump may then move the received first liquid coolant to another region of the electronic module, for instance to the heat exchanger, and then onwards to the inlet of the weir. The pump may be at least partially immersed in the first liquid coolant, the first liquid coolant thereby also assisting in the cooling of the pump.

Preferably, the first cooling circulatory arrangement further comprises a pump inlet, arranged to receive first liquid coolant contained in the housing of the electronic module and exterior the weir. In other words, first liquid coolant contained within the electronic module may be received by the pump inlet, to be passed to the pump.

Preferably, the cooling module comprises a cold plate, the cold plate comprising a cold plate housing, a surface of the cold plate housing being arranged to provide a thermal interface for cooling the second electronic device which is thermally coupled thereto; and at least one channel within the cold plate housing and proximate to the surface of the cold plate housing, the at least one channel arranged for the second liquid coolant to flow therethough such that heat received from the second electronic device through the surface of the cold plate housing is transferred to the second liquid coolant.

Advantageously, the cold plate provides an efficient and effective mechanism for cooling specific electronic devices in the electronic module. The cold plate provides high performance cooling for the second electronic device to which it is thermally coupled. Therefore, the cold plate can be coupled to the hottest component or components within the electronic module, in order to provide superior and targeted cooling power to these components Optionally, the surface of the cold plate housing may be directly coupled to a surface of the second electronic device. Alternatively, the housing may be coupled by a further interfacing surface or component. Nevertheless, the cold plate and the second electronic device will be thermally coupled, to promote effective and efficient heat transfer from the second electronic device to the second liquid coolant.

More than one cold plate may be arranged in the electronic module, as part of the second cooling circulatory arrangement. Two or more cold plates may be arranged in the second cooling circulatory arrangement in parallel or in series to each other, or where three or more cold plates are used, a combination of parallel and series configurations could be implemented.

Preferably, the heat exchanger is arranged within the housing of the electronic module. In other words, the body of the heat exchanger, and particularly the thermally conductive interface at which the heat exchange between the first and the second coolant liquid takes place, is entirely located inside the housing or chassis of the electronic module. This means that the first coolant liquid does not leave or exit the volume of the housing of the electronic module, which may prevent leaks or loss of the first coolant liquid. In some examples, an input port and an output port of the heat exchanger may be the input or output port for the second liquid coolant to the housing, and so these ports (only) of the heat exchanger may extend through the wall of the housing of the electronic module.

Preferably, the heat exchanger comprises at least the first chamber and the second chamber separated from each other by the thermally conductive interface, wherein the heat exchanger is configured for flow of the first liquid coolant through at least the first chamber, and flow of the second liquid coolant through at least the second chamber, such that heat is transferred from the first liquid coolant to the second liquid coolant through the thermally conductive interface. The heat exchanger may be a plate heat exchanger. A plate heat exchanger provides efficient heat exchange between liquid coolant in the first chamber and liquid coolant in the second chamber. The plate heat exchanger may be of a conventional construction, or may have additional input or output ports at one or both of the first and second chamber, as described below.

Preferably, the heat exchanger comprises two or more inputs and/or two or more outputs at the second chamber. The inputs may be input ports, or inlet ports, and the outputs may be output ports or outlet ports. The heat exchanger may comprise two inputs and two outputs at the second chamber. Therefore, in this example the heat exchanger has six inputs and outputs in total (having also an input and an output at the first chamber). Optionally, two or more inputs and/or two or more outputs may be provided at one or more chamber of the at least first chamber or second chamber.

The second chamber may have a first pathway and a second pathway for the second liquid coolant to flow therethrough. A pathway may be considered as a route or passage through the chamber having a certain starting point (input) and ending point (output). Different pathways have different combinations of starting points (inputs) and ending points (outputs), although some of the individual inputs and outputs may be shared or common to different pathways. Each chamber of the heat exchanger is considered to be a region that is fluidly connected, and that is fluidly separate to any other chamber. Different pathways through a chamber are fluidly connected, although specific pairs of pathways through the same chamber may not necessarily join or cross at any point (but instead be joined via another pathway in the same chamber).

Preferably, at least one of the two or more inputs and/or outputs is common to the first and second pathway through the second chamber. In other words, the first and second pathway may have a common input but separate outputs, for instance. In a beneficial example, this allows the second liquid coolant to pass through the heat exchanger, but have parallel branches to pass to the cooling module or flow past the thermally conductive interface. For instance, a first pathway may pass from a first input of the second chamber to a first output, and then direct the first liquid coolant onwards to the cooling module, whereas a second pathway may pass from a first input of the second chamber, past the thermally conductive interface, and then direct the first liquid coolant out of a second output. In a still further example, the second chamber may comprise a third pathway, which receives the second liquid coolant on return from the cooling module at a second input to the second chamber, and then directs the first liquid coolant out of the second output from the second chamber (wherein the second output is common to the second and third pathway).

Preferably, the first pathway has an input or an output that is common with the second pathway and the other of an input or an output that is not common with the second pathway. For instance, the first and second pathway may be joined at either a common input or an output, but then may pass to a different, separate respective output or input.

Preferably, the relative rate of flow of the second liquid coolant through the first and the second pathway is determined by a pressure gradient across the input or output at the first pathway that is not common with the second pathway. For instance, the relative pressure change or drop at a first output and a second output to the second chamber may determine the rate of flow though the first and the second output, and in turn the rate of flow through the first and the second pathway. In this way, the proportion of the second liquid coolant passing though each pathway of the second chamber can be adjusted.

Preferably, the pressure gradient across the input or the output at the first pathway that is not common with the second pathway is determined by the size of an aperture at the input or the output at the first pathway that is not common with the second pathway, the aperture being an opening through which the second liquid coolant flows into or out of the second chamber. The size of the aperture may be changed by use of an orifice plate, or by substitution of different size nozzles at the input or output. For instance, the aperture at the first output connected to the first pathway through the heat exchanger may be smaller than compared to the aperture at the second output connected to the second pathway through the heat exchanger, which may result in a lower rate of flow through the first pathway than through the second pathway.

Preferably, the rate of flow of the second liquid coolant through the first pathway is less than the rate of flow of the second liquid coolant through the second pathway. Preferably, the rate of flow of the second liquid coolant through the first pathway is 50% or less of the rate of flow of the second liquid coolant through the second pathway. Preferably, the rate of flow of the second liquid coolant through the first pathway is 35% or less of the rate of flow of the second liquid coolant through the second pathway. In other words, the rate of flow through the first pathway (which is output to the cooling modules) is lower than the rate of flow thorough the second pathway (that makes contact with, or passes, the thermally conductive interface at the heat exchanger). This changes the proportion of the second liquid coolant passing to the cooling modules compared to the thermally conductive interface. This in turn increases the cooling performance at the thermally conductive interface, than compared to the cooling modules. In one example, around 20% of the volume of second liquid coolant entering the heat exchanger is passed via the cooling modules, and around 80% of the second liquid coolant entering the heat exchanger is passed via the thermally conductive interface. However, different proportions could be used.

Optionally, the second cooling circulatory arrangement further comprises a cooling system, wherein the second cooling circulatory arrangement is configured to circulate the second liquid coolant between the cooling modules and heat exchanger (or more specifically the thermally conductive interface at the heat exchanger) within the electronic device and the cooling system (which is external to the electronic module). The cooling system removes heat from the second liquid coolant via the cooling system. In other words, the second cooling circulatory arrangement forms a closed loop, in which the second liquid coolant received from the electronic module is cooled by a cooling system, before being returned to the electronic module.

Alternatively, the second cooling circulatory arrangement is connected to a second liquid coolant supply, wherein the second cooling circulatory arrangement is configured to circulate the second liquid coolant received from the second liquid coolant supply to the cooling modules and heat exchanger (or more specifically the thermally conductive interface at the heat exchanger) within the electronic device, and then to be returned to the second liquid coolant supply. In other words, the second cooling circulatory arrangement is an open loop, and the second liquid coolant is fed from a facility level supply, and constantly replenished. For instance, the second liquid coolant supply may be a water supply, from which water is received (as the second liquid coolant), circulated through the second cooling circulatory arrangement, and then allowed to exit the second cooling circulatory arrangement to facility drainage.

Characteristics of features described above with respect to the system will also apply to like or corresponding features of the method. Any characteristics or benefits of a feature described above (with respect to the system) can also be considered to apply to a corresponding feature in relation to the method, as described below.

In a fourth aspect there is a method for cooling a plurality of electronic devices, the electronic devices housed in a housing of an electronic module, the system comprising:

circulating a first liquid coolant around a first cooling circulatory arrangement, comprising causing a first liquid coolant to circulate between a first electronic device of the plurality of electronic devices and a first chamber of a heat exchanger, wherein the first electronic device is arranged to be thermally coupled to the first liquid coolant such that heat generated at the first electronic device is transferred to the first liquid coolant;

transporting a second liquid coolant around a second cooling circulatory arrangement, comprising causing a second liquid coolant to flow through a second chamber of the heat exchanger, and causing the second liquid coolant to flow through a cooling module thermally coupled to a second electronic device of the plurality of electronic devices, wherein heat generated by the second electronic device is transferred to the second liquid coolant via a surface of the cooling module;

wherein the first cooling circulatory arrangement and the second cooling circulatory arrangement are thermally coupled via a thermally conductive interface separating the first and the second chamber of the heat exchanger, such that heat from the first liquid coolant in the first chamber of the heat exchanger is transferred to the second liquid coolant in the second chamber of the heat exchanger via the thermally conductive interface.

The method provides a hybrid system for cooling, incorporating two coolant loops, wherein a first loop cools a first electronic device, and wherein the second loop cools a second electronic device (via a cooling module) as well as liquid coolant in the first loop. The described system provides an efficient mechanism for cooling, and allows focused cooling (via the cooling module at the second loop) of certain electronic devices that may generate more heat.

Preferably, transporting the second liquid coolant around the second cooling circulatory arrangement comprises causing the second liquid coolant to flow through the second chamber of the heat exchanger and from the second chamber of the heat exchanger through the cooling module. More specifically, the second liquid coolant flows in series from a thermally conductive interface at the second chamber of the heat exchanger, and then to the cooling module.

Preferably, transporting the second liquid coolant around the second cooling circulatory arrangement comprises causing the second liquid coolant to flow through the cooling module and from the cooling module through the second chamber of the heat exchanger. More specifically, the second liquid coolant flows in series through the cooling module and then past a thermally conductive interface at the second chamber of the heat exchanger.

Preferably, the cooling module and the thermally conductive interface at the heat exchanger are arranged on parallel first and second branches of the second cooling circulatory arrangement, wherein transporting the second liquid coolant around the second cooling circulatory arrangement comprises causing the second liquid coolant to flow through the first branch of the second cooling circulatory arrangement comprising the cooling module, and causing the second liquid coolant to flow through the second branch of the second cooling circulatory arrangement comprising the thermally conductive interface at the heat exchanger.

Preferably, the heat exchanger comprises a plurality of pathways through the second chamber, wherein transporting the second liquid coolant around the second cooling circulatory arrangement comprises causing the second liquid coolant to flow through the first branch of the second cooling circulatory arrangement comprising a first pathway through the second chamber of the heat exchanger and the cooling module, and causing the second liquid coolant to flow through the second branch of the second cooling circulatory arrangement comprising a second pathway through the second chamber of the heat exchanger past the thermally conductive interface.

Preferably, the first pathway through the second chamber of the heat exchanger does not flow past the thermally conductive interface.

Preferably, around 30% or less of the second liquid coolant is passed through the first pathway, and 70% or more of the second liquid coolant is passed through the second pathway.

Preferably, the housing is configured to contain the first liquid coolant and wherein the first electronic device is at least partially immersed in the first liquid coolant contained within the housing.

Preferably, the housing is configured to contain a volume of first liquid coolant which fills the housing to a liquid level, wherein the cooling module is arranged within the housing to be above the liquid level of the first liquid coolant, and the first electronic device is arranged within the housing to be at least partially immersed in the first liquid coolant contained within the housing.

In a fifth aspect there is a heat exchanger, comprising:
- at least a first chamber and a second chamber, the first chamber and the second chamber separated from each other by a thermally conductive interface, wherein the heat exchanger is configured for flow of a first liquid coolant through at least the first chamber, and flow of a second liquid coolant through at least the second chamber, such that heat is transferred from the first liquid coolant to the second liquid coolant through the thermally conductive interface;
- two or more inputs and/or two or more outputs at one or more chamber of the at least first chamber or second chamber. The inputs may be input ports, or inlet ports, and the outputs may be output ports or outlet ports. In an example, the second chamber has two input ports and two output ports, and the first chamber has an input port and an output port, such that the heat exchanger has six ports overall.

Preferably, the one or more chamber having two or more inputs and/or outputs further comprises two or more pathways for liquid coolant through the respective chamber. For instance, the chamber may have a first pathway and a second pathway for passage of the second liquid coolant therethrough. A pathway may be considered as a route or passage through the chamber having a certain starting point (input) and ending point (output). Different pathways have different combinations of starting points (inputs) and ending points (outputs), although some of the individual inputs and outputs may be shared or common to different pathways. Each chamber of the heat exchanger is considered to be a region that is fluidly connected within the chamber, but that is fluidly separate to another chamber. Different pathways through a chamber are fluidly connected, although specific pairs of pathways through the same chamber may not necessarily join or cross at any point (but instead be joined via another pathway in the same chamber).

Preferably, at least one of the two or more inputs and/or outputs is common to two or more of the two or more pathways. Preferably, at least one of the two or more pathways has one of an input or output that is common to at least one other of the two or more pathways, and the other of an input or output that is not common to any other of the two or more pathways. In an example, a first and a second pathway may have a common input but separate outputs, for instance. For instance, a first pathway may pass from a first input of the chamber to a first output, whereas a second pathway may pass from a first input of the chamber and then direct the first liquid coolant out of a second output. In a still further example, the chamber may comprise a third pathway, which receives the second liquid coolant at a second input to the chamber, and then directs the first liquid coolant out of the second output from the chamber (wherein the second output is common to the second and third pathway). Only one or some of the pathways may pass or make contact with the thermally conductive interface at the heat exchanger.

Preferably, the at least one of the two or more pathways has a different rate of flow than another of the two or more pathways. For instance, the different pathways may have a different rate of flow of the liquid coolant therethrough. This allows different proportions of the liquid coolant entering a chamber of the heat exchanger to pass through the different pathways, and so different proportions of the liquid coolant to pass out of different outputs.

Preferably, the rate of flow through the at least one of the two or more pathways is determined by a pressure gradient across the input or output that is not common to any other of the two or more pathways. For instance, a first and second pathway may have a common input but separate outputs. The rate of flow through each of the first and the second pathway may be determined by the relative pressure (or pressure drop) at each of the separate outputs.

Preferably, the pressure gradient across the input or output that is not common to any other of the two or more pathways is determined by the size of an aperture at the input or output that is not common to any other of the two or more pathways, the aperture being an opening through which the liquid coolant flows into or out of the chamber. The size of the aperture may be modified by substitution of a nozzle at the output, or use of an orifice plate. A larger aperture at an output allows a greater rate of flow therethrough. Therefore, a first pathway having a smaller aperture at the output compared to the output at the second pathway causes the first pathway to have a lower flow rate than the second pathway.

Preferably, the rate of heat transfer through the thermally conductive interface from the first liquid coolant to the second liquid coolant is less at one of the two or more pathways than another of the two or more pathways. Preferably, the rate of heat transfer at the one of the two or more pathways is 50% or less than the rate of heat transfer through the another of the two or more pathways.

Preferably, at least one of the pathways does not make contact, or flow past the thermally conductive interface at the heat exchanger. Preferably, the one of the two or more pathways has a flow rate that is less than the flow rate through another of the two or more pathways that does make contact with the thermally conductive interface through which heat is transferred to the second liquid coolant from the first liquid coolant. In other words, a greater proportion of the liquid coolant entering a chamber of the heat exchanger can be passed by a thermally conductive interface than the proportion of the liquid coolant that is not passed by the thermally conductive interface. Preferably, the flow rate through the one of the two or more pathways that does make contact with the thermally conductive interface is less than half the flow rate through the another of the two or more pathways that does make contact with the thermally conductive interface.

Preferably, the one of the two or more pathways has one of an input or output that is common to the another of the two or more pathways, and the other of an input or output that is not common to the another of the two or more pathways, and wherein the flow rate through the one of the two or more pathways is determined by a pressure gradient across the input or output that is not common to the another of the two or more pathways. As discussed above, the relative size of the aperture at a separate output or input at different pathways determines the change in fluid pressure at the output, and so the relative rate of flow through each pathway.

In a sixth aspect, there is a heat exchanger comprising:
six ports, wherein the ports are a combination of inlet and outlet ports. The heat exchanger may be a plate heat exchanger. The heat exchanger may comprise a first chamber, through which a first liquid coolant flows, and a second chamber through which a second liquid coolant flows, and the first and the second chamber may be separated by a thermally conductive interface. Heat may pass through the thermally conductive interface from the first liquid coolant to the second liquid coolant, or to the first liquid coolant from the second liquid coolant, dependent on the temperature gradient across the thermally conductive interface. The six ports may be arranged across each of the first and the second chamber, wherein each of the first and second chamber have at least one inlet port and at least one outlet port.

Preferably, the six ports comprise three inlet ports and three outlet ports. The three inlet ports and three outlet ports may be arranged across each of the first and the second chamber, wherein each of the first and second chamber have at least one inlet port and at least one outlet port.

Preferably, the heat exchanger comprises at least a first chamber and a second chamber, the first chamber and the second chamber separated from each other by a thermally conductive interface, wherein the heat exchanger is configured for flow of a first liquid coolant through at least the first chamber, and flow of a second liquid coolant through at least the second chamber, such that heat is transferred from the first liquid coolant to the second liquid coolant through the thermally conductive interface.

Preferably, two of the inlet ports are for input of the second liquid coolant to the second chamber, and two of the outlet ports are for output of the second liquid coolant from the second chamber.

Preferably, the second chamber comprises at least two pathways for second liquid coolant therethrough. A pathway may be considered as a route or passage through the chamber having a certain starting point (input) and ending point (output). Different pathways have different combinations of starting points (inputs) and ending points (outputs), although some of the individual inputs and outputs may be shared or common to different pathways. Each chamber of the heat exchanger is considered to be a region that is fluidly connected within the chamber, but that is fluidly separate to any other chamber. Different pathways through a chamber are fluidly connected, although specific pairs of pathways through the same chamber may not necessarily join or cross at any point (but instead be joined via another pathway in the same chamber).

Preferably, the second chamber comprises three pathways for second liquid coolant therethrough, wherein second liquid coolant flowing on a first pathway passes from a first inlet port to a first outlet port, wherein second liquid coolant flowing on a second pathway passes from the first inlet port to a second outlet port, and wherein second liquid coolant flowing on a third pathway passes from the second inlet port to the second outlet port.

Preferably, only the second pathway flows past the thermally conductive interface at the heat exchanger. The second pathway flows past the thermally conductive interface when flowing between the first inlet port and the second outlet port.

Preferably, the rate of flow of the second liquid coolant through the first pathway is less than the rate of flow of the second liquid coolant through the second pathway. In other words, the rate of flow though the second pathway past the thermally conductive interface may be different from, or optionally less than, the rate of flow through the first pathway. This allows a different proportion of the volume of the coolant to pass through different pathways, and so a different proportion of the volume of the coolant to pass in contact with the thermally conductive interface at the heat exchanger.

Preferably, the rate of flow is determined by the pressure change at the first outlet port. The rate of flow may be determined by the pressure change at the first outlet port relative to the second outlet port.

Preferably, the pressure change at the first outlet port is determined by the size of an aperture or opening through the first outlet port. The size of the aperture may be adjusted by use of an orifice plate, or by interchangeable nozzles of different size at one or both of the first and the second outlet port.

Preferably, the size of the aperture or opening at the first outlet port is less than the size of an aperture or opening at the second outlet port. Thus, the rate of flow (as a volume of coolant liquid per unit time) through the first outlet port (and so through the first pathway of the second chamber) is less than the rate of flow through the second outlet port (and so through the second pathway of the second chamber).

In a further aspect, there is a system for cooling a plurality of electronic devices as described in the third aspect above, wherein the heat exchanger comprises the heat exchanger of the fifth aspect or the sixth aspect. The heat exchanger of the sixth aspect may be of a particularly appropriate configuration for use in the system of the third aspect or the method of the fourth aspect.

The following numbered clauses show illustrative examples only:
1. A system for cooling a plurality of electronic devices housed in a housing of an electronic module, the system comprising:

a first cooling circulatory arrangement, configured to circulate a first liquid coolant between a first electronic device of the plurality of electronic devices and a heat exchanger, the first electronic device being thermally coupled to the first liquid coolant such that heat is transferred from the first electronic device to the first liquid coolant; and a second cooling circulatory arrangement, configured to circulate a second liquid coolant between a second electronic device of the plurality of electronic devices and the heat exchanger, the second electronic device being thermally coupled to the second liquid coolant such that heat is transferred from the second electronic device to the second liquid coolant;

wherein the first cooling circulatory arrangement and the second cooling circulatory arrangement are thermally coupled at least via the heat exchanger, such that heat is transferred from the first liquid coolant to the second liquid coolant via the heat exchanger.

2. The system of clause 1, wherein the second cooling circulatory arrangement further comprises a cooling system, wherein the second cooling circulatory arrangement is configured to circulate the second liquid coolant between the second electronic device of the plurality of electronic devices, the heat exchanger and the cooling system, wherein heat is removed from the second liquid coolant by the cooling system.

3. The system of clause 1, wherein the second cooling circulatory arrangement is connected to a second liquid coolant supply, wherein the second cooling circulatory arrangement is configured to circulate the second liquid coolant received from the second liquid coolant supply between the second electronic device of the plurality of electronic devices and the heat exchanger, and to be returned to the second liquid coolant supply.

4. The system of any one of clauses 1 to 3, wherein the heat exchanger comprises at least a first and a second chamber separated by a thermal interface, wherein the heat exchanger is configured for flow of the first liquid coolant through at least the first chamber, and flow of the second liquid coolant through at least the second chamber, such that heat is transferred from the first liquid coolant to the second liquid coolant through the thermal interface.

5. The system of any one of clauses 1 to 4, wherein the heat exchanger is arranged within the housing of the electronic module.

6. The system of any one of clauses 1 to 5, wherein the housing of the electronic module contains the first liquid coolant, and wherein the first electronic device is at least partially immersed in the first liquid coolant.

7. The system of clause 6, wherein the first cooling circulatory arrangement further comprises a weir, the weir comprising:

a base and a retaining wall extending from the base, the base and retaining wall defining a volume for holding some of the first liquid coolant;

an inlet, through which the first liquid coolant flows into the volume;

wherein the flow of sufficient first liquid coolant through the inlet into the volume causes the first liquid coolant to overflow the retaining wall and collect with first liquid coolant contained in the housing of the electronic module and exterior the weir.

8. The system of clause 7, wherein the inlet further comprises a nozzle arrangement, for directing the first liquid coolant flowing into the volume.

9. The system of clause 7 or clause 8, wherein the weir further comprises projections extending from the base and/or retaining wall within the volume of the weir.

10. The system of any one of clauses 7 to 9, wherein the weir is coupled to a surface of the first electronic device, to act as a heat sink.

11. The system of any one of clauses 1 to 10, wherein the first cooling circulatory arrangement further comprises:

a pump configured to circulate the first liquid coolant around the first cooling circulatory arrangement.

12. The system of clauses 11, wherein the first cooling circulatory arrangement further comprises a pump inlet, arranged to receive first liquid coolant contained in the housing of the electronic module and exterior the weir.

13. The system of clauses 11 or clauses 12, wherein the first cooling circulatory arrangement further comprises:

at least a first and a second pipe, arranged to transport the first liquid coolant from the pump to the heat exchanger and from the heat exchanger to the inlet of the weir, respectively.

14. The system of any of clauses 1 to 13, the second cooling circulatory arrangement further comprising a cooling module configured to thermally couple the second electronic device to the second liquid coolant.

15. The system of clause 14, wherein the cooling module comprises a cold plate, the cold plate comprising:

a cold plate housing, a surface of the cold plate housing being arranged to provide a thermal interface for cooling the second electronic device which is thermally coupled thereto; and at least one channel within the cold plate housing and proximate to the surface of the cold plate housing, the at least one channel arranged for the second liquid coolant to flow therethough such that heat received from the second electronic device through the surface of the cold plate housing is transferred to the second liquid coolant.

16. The system of clause 15, the second cooling circulatory arrangement further comprising a plurality of conduits arranged to transport the second liquid coolant between the cold plate, the heat exchanger and the cooling system.

17. A method for cooling a plurality of electronic devices housed in a housing of an electronic module, the method comprising:

circulating a first liquid coolant around a first cooling circulatory arrangement, comprising circulating a first liquid coolant between a first electronic device of the plurality of electronic devices and a heat exchanger, the first electronic device being thermally coupled to the first liquid coolant such that heat is transferred from the first electronic device to the first liquid coolant; and circulating a second liquid coolant around a second cooling circulatory arrangement, comprising circulating a second liquid coolant between a second electronic device of the plurality of electronic devices and the heat exchanger, the second electronic device being thermally coupled to the second liquid coolant such that heat is transferred from the second electronic device to the second liquid coolant;

wherein the first cooling circulatory arrangement and the second cooling circulatory arrangement are thermally coupled at least via the heat exchanger, such that heat is transferred from the first liquid coolant to the second liquid coolant via the heat exchanger.

18. The method of clause 17, wherein the second cooling circulatory arrangement further comprises a cooling system, wherein the circulating the second liquid coolant around the second cooling circulatory arrangement comprises circulating the second liquid coolant between the second electronic device of the plurality of electronic devices, the heat exchanger and the cooling system, where heat is removed from the second liquid coolant by the cooling system.

19. The method of clause 17, wherein the second cooling circulatory arrangement further comprises a second liquid coolant supply, wherein the circulating the second liquid coolant around the second cooling circulatory arrangement comprises receiving the second liquid coolant from the second liquid coolant supply, circulating the second liquid coolant between the second electronic device of the plurality of electronic devices and the heat exchanger and to be returned to the second liquid coolant supply.

20. The method of any one of clauses 17 to 19, wherein the heat exchanger comprises at least a first and a second chamber separated by a thermal interface, wherein the heat exchanger is configured for flow of the first liquid coolant through at least the first chamber, and flow of the second liquid coolant through at least the second chamber, such that heat is transferred from the first liquid coolant to the second liquid coolant through the thermal interface.

21. The method of any one of clauses 17 to 20, wherein the heat exchanger is arranged within the housing of the electronic module.

22. The method of any one of clauses 17 to 21, wherein the housing of the electronic module contains the first liquid coolant, and wherein the first electronic device is at least partially immersed in the first liquid coolant.

23. The method of any one of clauses 17 to 22, wherein the first cooling circulatory arrangement further comprises a weir, the weir comprising:
 a base and a retaining wall extending from the base, the base and retaining wall defining a volume for holding some of the first liquid coolant;
 an inlet, through which the first liquid coolant flows into the volume;
 wherein flowing sufficient first liquid coolant through the inlet into the volume causes the first liquid coolant to overflow the retaining wall and collect with first liquid coolant contained in the housing of the electronic module and exterior the weir.

24. The method of any one of clauses 17 to 23, wherein the second cooling circulatory arrangement further comprises a cooling module, configured to thermally couple the second electronic device to the second liquid coolant.

25. The method of any one of clauses 17 to 24, wherein the cooling module comprises a cold plate, the cold plate comprising:
 a cold plate housing, a surface of the cold plate housing being arranged to provide a thermal interface for cooling the second electronic device which is thermally coupled thereto; and
 at least one channel within the cold plate housing and proximate to the surface of the cold plate housing, the at least one channel arranged for the second liquid coolant to flow therethough such that heat received from the second electronic device through the surface of the cold plate housing is transferred to the second liquid coolant.

BRIEF DESCRIPTION OF THE DRAWINGS

The disclosure may be put into practice in a number of ways, and preferred embodiments will now be described by way of example only and with reference to the accompanying drawings, in which:

FIG. 10A is a perspective view and FIGS. 10B and 10C are cross-sectional views of a cold plates used as the cooling module in the second cooling circulatory arrangement;

FIG. 14 illustrates the preferred liquid level for the first liquid coolant in the chassis or housing of the electronic module;

FIG. 16 is a schematic representation of the pathways for flow of first and second liquid coolant through a heat exchanger having a total of six input and output ports;

FIGS. 23(a), 23(b) and 23(c) illustrate schematic representations of a single chamber of a heat exchanger having at least two inputs and/or outputs, and with two pathways through the given chamber.

In the drawings, like parts are denoted by like reference numerals. The drawings are not drawn to scale.

DETAILED DESCRIPTION OF PREFERRED EMBODIMENTS

Electronic modules, suitable for placement in a server rack, are described. The electronic modules may have a sealable housing or chassis, comprising a base, lid and side walls. The electronic modules house a plurality of electronic devices (computer hardware devices) which, under normal operation, generate heat. The electronic devices may be coupled directly to the housing or chassis of the electronic module or may be connected to one or more printed circuit boards (PCB). The electronic devices and/or PCB are then connected or mounted within the housing or chassis of the electronic module. Electrical connections are made to the electronic devices for power or data transfer. Said electrical connections may be passed through sealable ports at a wall of the housing of the electronic module (usually at the rear). Said connections, as well as mechanical fixtures on the outer surface of the housing or chassis, may connect to cooperating fixings and connectors at a server rack.

The present description is directed to cooling systems, to remove heat generated by the electronic devices housed within the electronic module when in operation. As the electronic modules are typically sealed or enclosed when in use, the heat generated can be enclosed within the housing or chassis for the electronic module, and so efficient heat transfer out of and away from the electronic module is of particular importance. Described below are examples of an electronic module having a hybrid cooling system, including two cooperating circulatory loops of liquid coolant. FIGS. 1A and 1B, FIGS. 2A and 2B and FIGS. 3A and 3B, as well as FIGS. 17A and 17B, each illustrate alternative configurations for the two cooperating circulatory loops within the electronic module.

Figure 1A:
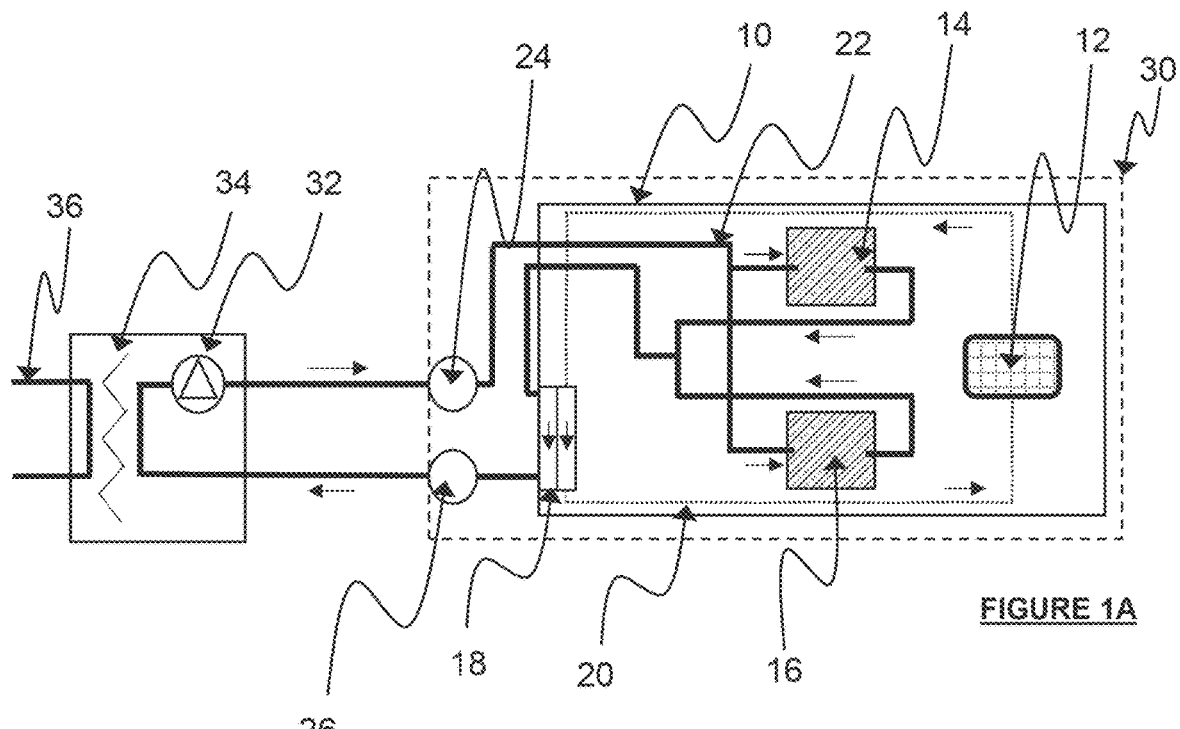
FIGS. 1A and 1B are schematic representations of implementations of a first example of the system for cooling a plurality of electronic devices housed in a chassis or housing of an electronic module.
Figure 1B:
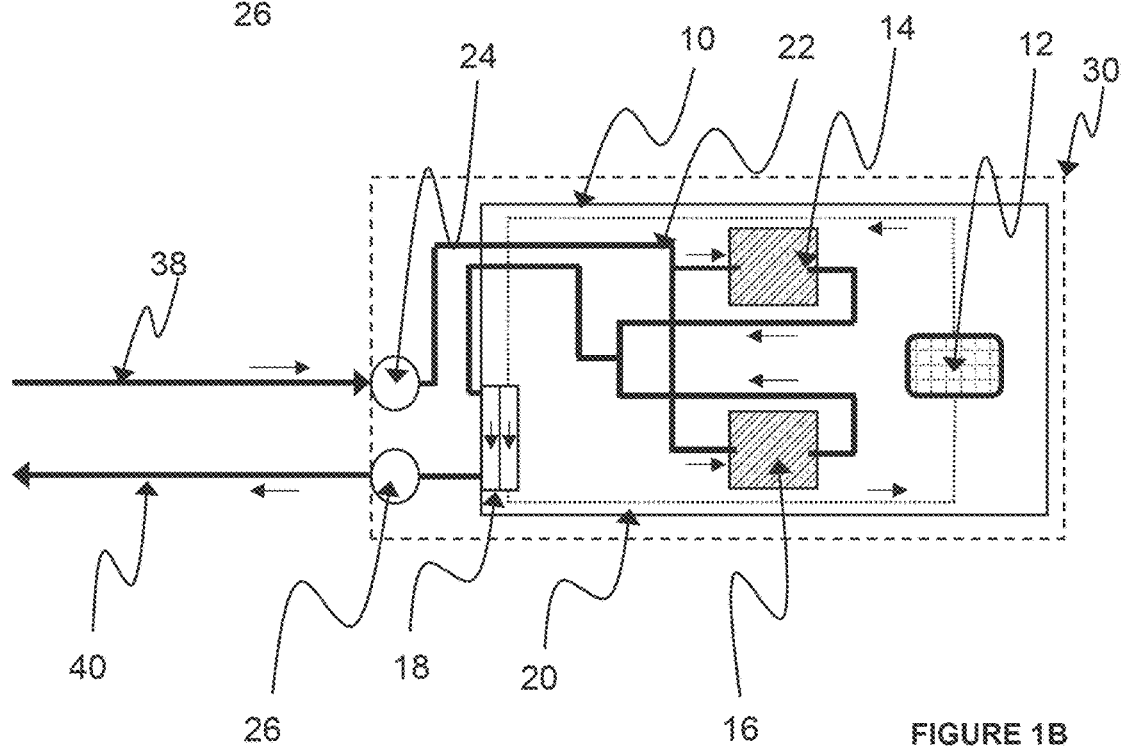

A first example of the system is shown in FIGS. 1A and 1B. In both FIGS. 1A and 1B, the configuration of components within an electronic module are the same, and FIGS. 1A and 1B differ only by the system external to the electronic modules, as discussed below.

In the example of FIGS. 1A and 1B, the electronic module 10 comprises first electronic device 12, a first 14 and a second 16 cooling module (coupled to a respective second and third electronic device, not shown in FIGS. 1A and 1B), and a heat exchanger 18.

A first cooling circulatory arrangement 20 is entirely enclosed within the housing or chassis of the electronic module 10. When the system is in use, the first cooling circulatory arrangement 20 circulates (or transports) a first liquid coolant from the heat exchanger 18 to the first electronic device 12, and then from the first electronic device back to the heat exchanger 18. The first cooling circulatory arrangement 20 is a closed loop (in other words, the coolant is perpetually circulated, and is not replaced or removed within the loop).

A second cooling circulatory arrangement 22, when in use, receives a second liquid coolant at a first input to the electronic module 10. The second liquid coolant is then transported to the first 14 and second 16 cooling modules (coupled to a second and third electronic device, respectively). The second liquid coolant is passed through the first 14 and second 16 cooling modules and then onwards to the heat exchanger 18 (more specifically, the thermally conductive interface for heat transfer at the heat exchanger). Finally, after passing through the heat exchanger 18 (past the thermally conductive interface for heat transfer at the heat exchanger) the second liquid coolant exits the electronic module 10.

In the particular example of FIGS. 1A and 1B, the second liquid coolant is passed out of the electronic module 10 between the cooling modules and the heat exchanger. In particular, after passing through the cooling modules 14, 16 the second liquid coolant is passed through a first output in the wall of the housing of the electronic module. The second liquid coolant is then passed through a bulkhead connector, to then re-enter the electronic module 10 at a second input in the wall of the housing of the electronic module. After passing through the second input, the second liquid coolant is enters directly into the heat exchanger 18. Nevertheless, in other examples the second liquid coolant could be passed directly to the heat exchanger 18 from the first 14 and second 16 cooling modules, without exit and re-entry to the electronic module 10.

The first electronic device 12 is thermally coupled to the first liquid coolant, so that, when the system is in use, heat generated by the first electronic device 12 is transferred to the first liquid coolant. The second and third electronic devices are thermally coupled to the second liquid coolant via a surface of the first 14 and second 16 cooling module. For instance, the first 14 and second 16 cooling modules may be physically coupled to the second and third electronic devices, respectively, or may be thermally coupled with optionally with intervening layers therebetween. When the system is in use, heat generated by the second and third electronic devices is transferred to the second liquid coolant.

The heat exchanger 18 typically comprises at least a first and a second chamber, with a thermally conductive interface therebetween. The first liquid coolant passes through the first chamber, and the second liquid coolant passes through the second chamber. Heat may be transferred from the hotter liquid coolant to the cooler liquid coolant via the thermal interface. The two liquid coolants will not mix. In normal operation, the first liquid coolant will be at a higher temperature than the second liquid coolant. Therefore, when the system is in use, heat will transfer from the first liquid coolant to the second liquid coolant. By this means, the first liquid coolant is cooled, and the heat from the first electronic device is eventually transferred to the second liquid coolant and transported out of the electronic module.

In the examples of FIGS. 1A and 1B, the electronic modules 10 are each connected to a cooling system external to the electronic module, for providing and/or cooling the second liquid coolant. In both examples, connectors 24, 26 at a rack 30 (capable of housing a plurality of electronic modules) connect the second cooling circulatory arrangement 22 of the electronic module to the external cooling system. It will be understood that the same external cooling system may be connected to a plurality of electronic modules housed within the rack 30, and the plurality of electronic modules may be connected to the external cooling system either in series or in parallel.

In the example of FIG. 1A, between the connectors 24, 26 and external to the rack 30 is a cooling system comprising a pump 32 and a heat exchanger 34. The pump 32 is used to circulate the second liquid coolant, and to cause flow of the second liquid coolant through the second cooling circulatory arrangement of the electronic module 10. The heat exchanger is used to transfer heat from the second liquid coolant to a further coolant medium 36 (which may be a third liquid coolant). In one example, the further coolant medium may be a facility level supply of cooling water. In an alternative, the heat exchanger may be a liquid-to-air heat exchanger, in which heat from the second liquid coolant is transferred to a moving air source. In either case, the second liquid coolant is circulated in a closed loop, and heat is removed from the second liquid coolant and transferred away from the electronic modules 10.

In the example of FIG. 1B, the second liquid coolant is provided from a facility level supply (such as a cooling water source). The facility level supply is connected to an input 38 and an output 40 at the rack 30. The second liquid coolant is circulated in an open loop, in which the second liquid coolant is passed through the electronic module 10 and subsequently replaced by a new supply of second liquid coolant.

Figure 2A:
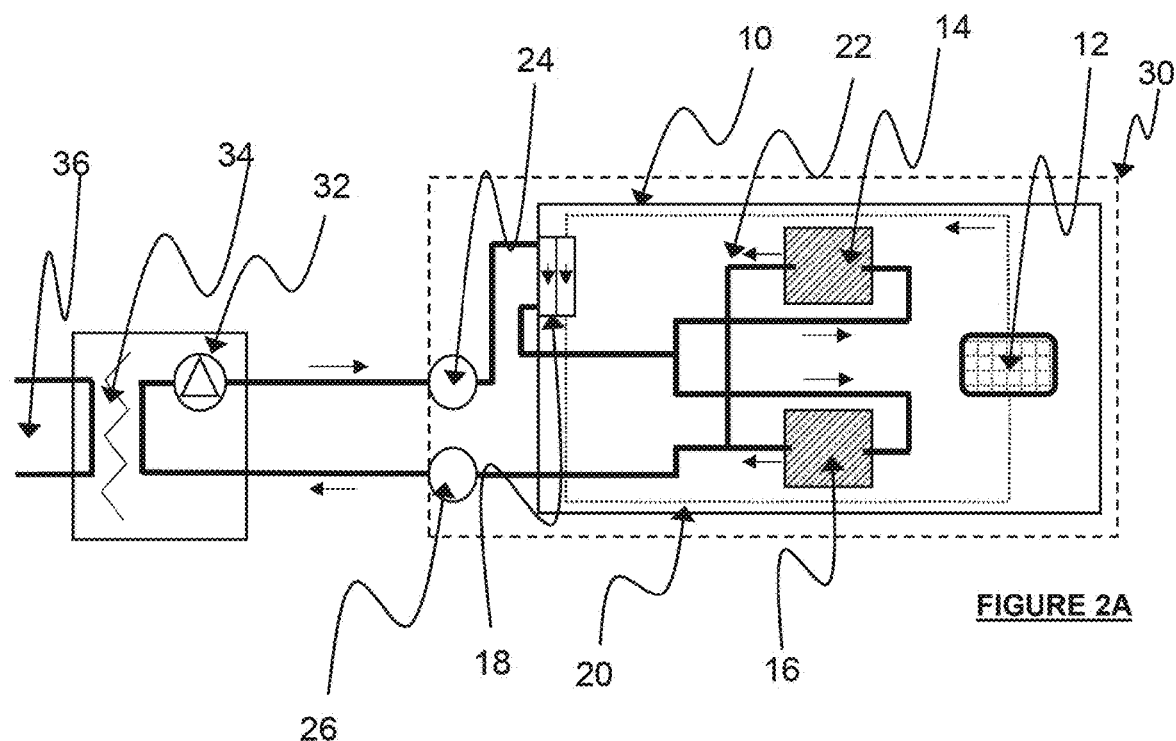
FIGS. 2A and 2B are schematic representations of implementations of a second example of the system for cooling a plurality of electronic devices housed in a chassis or housing of an electronic module.
Figure 2B:
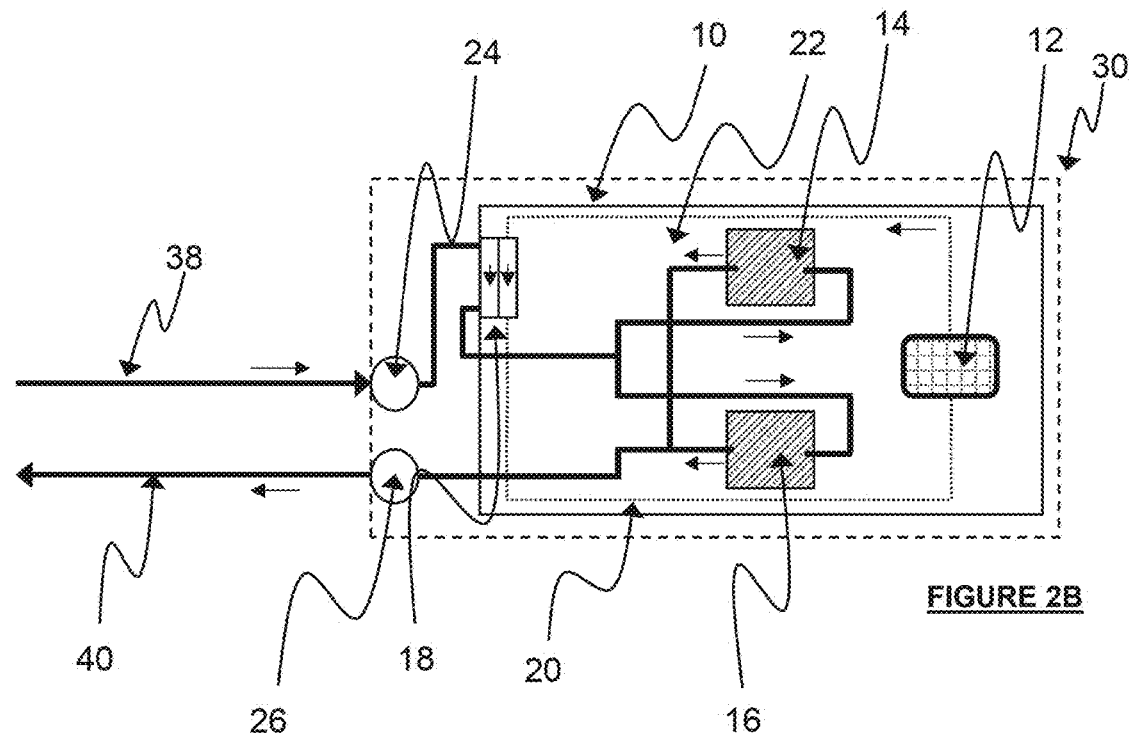

The electronic module of FIGS. 2A and 2B share common features with the examples of FIGS. 1A and 1B. In particular, the electronic modules 10 of FIGS. 2A and 2B also comprise a first electronic device 12, a first 14 and a second 16 cooling module (coupled to a respective second and third electronic device, not shown), and a heat exchanger 18. The configuration of the first cooling circulatory arrangement 20 in the examples of FIGS. 2A and 2B are substantially the same as that described above with respect to FIGS. 1A and 1B. However, the configuration of the second cooling circulatory arrangement 22 differs. In particular, in the examples of FIGS. 2A and 2B, the second cooling circulatory arrangement causes the second liquid coolant to pass through the heat exchanger 18 prior to passing through the cooling modules 14, 16 (wherein in the examples of FIGS. 1A and 1B, the second cooling circulatory arrangement causes the second liquid coolant to pass through the cooling modules 14, 16 prior to passing through the heat exchanger 18).

In the second cooling circulatory arrangement 22 of the electronic modules 10 illustrated in FIGS. 2A and 2B, when the system is in use the second liquid coolant enters the electronic module 10 through a first input to the housing or chassis of the electronic module. After passing through the first input the second liquid coolant is received directly at a heat exchanger 18. The second liquid coolant is passed though the heat exchanger 18 (specifically past the thermally conductive interface for heat transfer at the heat exchanger) and onwards to the cooling modules 14, 16.

In the particular examples of FIGS. 2A and 2B, after passing through the heat exchanger the second liquid coolant is passed directly through a first output of the electronic module. The second liquid coolant subsequently re-enters the electronic module via a bulkhead connector and through a second input. From here, the second liquid coolant is passed to the first 14 and the second 16 cooling modules (coupled to the second and third electronic devices, respectively). Although in this example, the second liquid coolant is passed out of and back into the electronic modules between the heat exchanger and cooling modules, it will be understood that the system could be configured so that the second liquid coolant passes directly from the heat exchanger 18 to the cooling modules 14, 16, without exiting and re-entering the electronic module 10.

Referring back to the examples of FIGS. 2A and 2B, once passed through first 14 and second 16 cooling modules, the second liquid coolant is directed out of the electronic module 10 via a second output from the chassis or housing.

In view of the arrangement of FIGS. 2A and 2B, heat from the first liquid coolant is transferred to the second liquid coolant prior to the second liquid coolant passing through the cooling modules 14, 16 (and so prior to the second liquid coolant receiving heat generated by the second and third electronic devices). In view of this, the temperature of the second liquid coolant will be lower at the heat exchanger than the temperature of the second liquid coolant in the heat exchanger in the examples of FIGS. 1A and 1B. As such, the cooling performance of the second liquid coolant to cool the first liquid coolant at the heat exchanger will be greater in the example of FIGS. 2A and 2B than compared to the example of FIGS. 1A and 1B. However, this may be at the expense of the cooling power at the cooling modules 14, 16, which will be greater in the example of FIGS. 1A and 1B.

The electronic module 10 according to FIG. 2A is connected to an external cooling system, via a rack 30, that is identical to the external cooling system described above with respect to FIG. 1A (i.e. heat transfer from the second liquid coolant to a third coolant medium, via a further heat exchanger). The electronic module 10 according to FIG. 2B is connected to an external cooling system, via a rack 30, that is identical to the external cooling system described above with respect to FIG. 1B (i.e. supply of the second liquid coolant from a facility level supply, such as a cooling water supply).

Figure 3A:
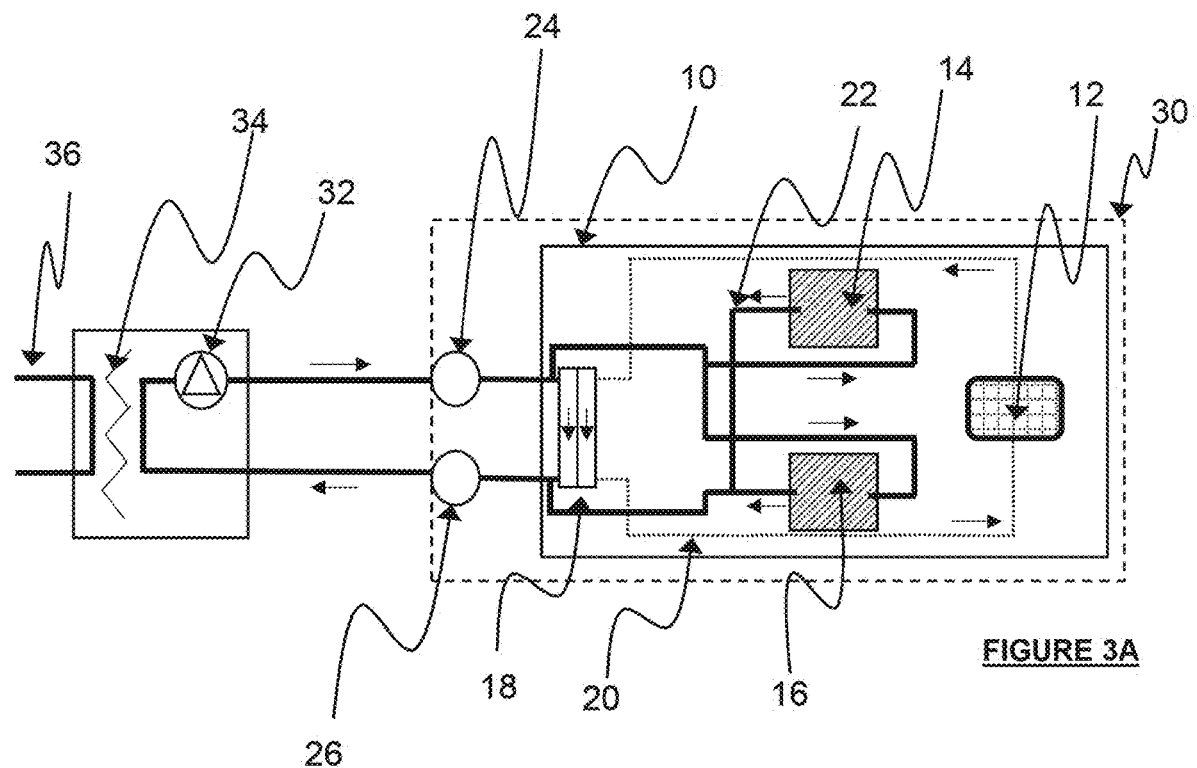
FIGS. 3A and 3B are schematic representations of implementations of a third example of the system for cooling a plurality of electronic devices housed in a chassis or housing of an electronic module.
Figure 3B:
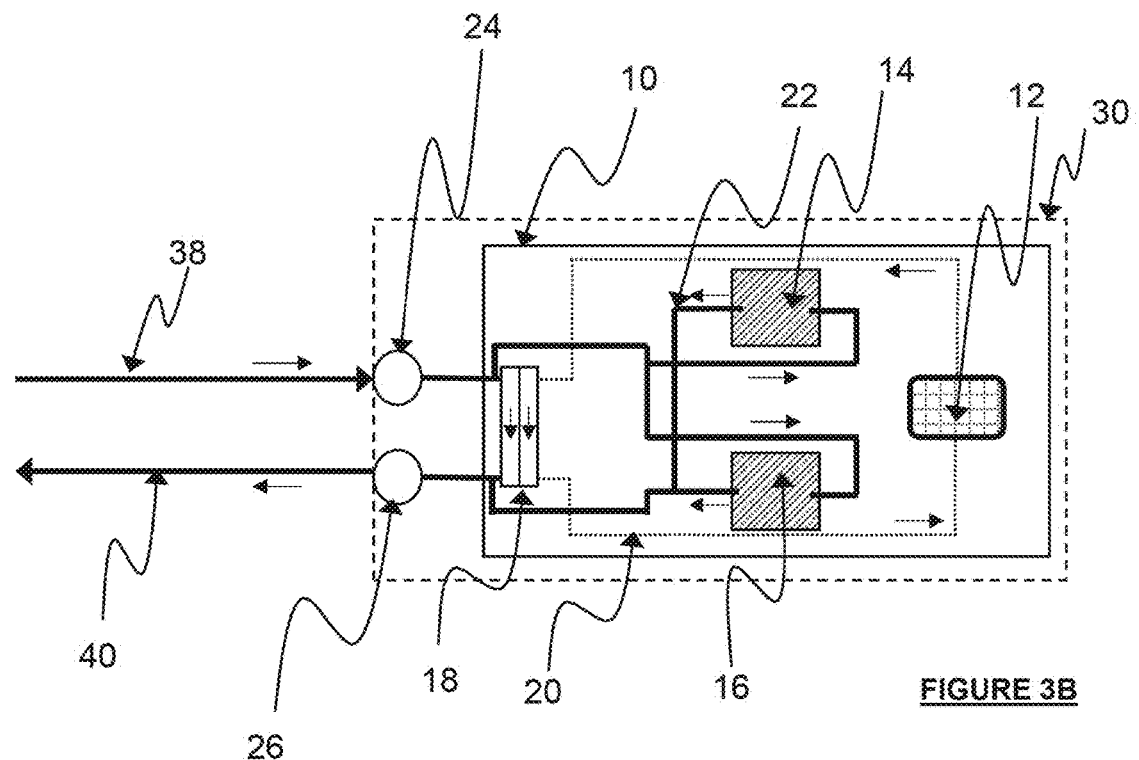

The electronic modules of FIGS. 3A and 3B share common features with the examples of FIGS. 1A and 1B, and FIGS. 2A and 2B. In particular, the electronic modules 10 of FIGS. 3A and 3B also comprise a first electronic device 12, a first 14 and a second 16 cooling module (coupled to a respective second and third electronic device, not shown), and a heat exchanger 18. The configuration of the first cooling circulatory arrangement 20 in the examples of FIGS. 3A and 3B are substantially the same as that described above with respect to FIGS. 1A and 1B, and FIGS. 2A and 2B. However, the configuration of the second cooling circulatory arrangement 22 differs compared to each of the above described examples. In particular, in the examples of FIGS. 3A and 3B, the heat exchanger 18 is arranged in parallel to the cooling modules 14, 16 within the second cooling circulatory arrangement.

In the second cooling circulatory arrangement 22 of the electronic modules 10 illustrated in FIGS. 3A and 3B, when the system is in use the second liquid coolant enters the electronic module through a first input at the housing of the electronic module to be divided into two parallel branches. A first branch is passed through a heat exchanger 18 (specifically, past the thermally conductive interface for heat transfer at the heat exchanger), and then re-joins the second branch to be conducted to an output from the housing of the electronic module. The second branch is passed directly to the first 14 and the second 16 cooling modules (coupled to the second and third electronic devices, respectively). Once passed through the cooling modules 14, 16, the second branch re-joins the first branch, and the second liquid coolant is directed out of the electronic modules.

In view of the arrangement of the second cooling circulatory arrangement 22 in FIGS. 3A and 3B, a separate portion of the second liquid coolant receives heat from the second and third electronic device (via the cooling modules) than the portion that receives heat from the first liquid coolant at the heat exchanger (via the thermally conductive interface). The flow of the second liquid coolant through each branch can be carefully controlled, in order to balance the cooling performance of the cooling modules compared to the heat exchanger.

The electronic module 10 according to FIG. 3A is connected to an external cooling system, via a rack 30, that is identical to the external cooling system described above with respect to FIG. 1A. The electronic module according to FIG. 3B is connected to an external cooling system, via a rack 30, that is identical to the external cooling system described above with respect to FIG. 1B.

In the examples of FIGS. 1A to 3B, as well as the examples of FIGS. 17A and 17B below, the first cooling circulatory arrangement 20 may provide immersive cooling. In other words, the first liquid coolant may be contained within the housing or chassis of the electronic module 10 so the first electronic device 12 (and in some cases, others of the plurality of electronic devices) are at least partially immersed in the first liquid coolant when the system is in use. By at least partially immersing some of the electronic devices (such as first electronic device 12), the electronic devices are in direct contact with the first liquid coolant, allowing heat to transfer directly from the electronic device 12 to the first liquid coolant. When the first cooling circulatory arrangement 20 provides immersive cooling in this way, the first liquid coolant is still circulated to flow around the housing or chassis and through the heat exchanger 18, so that heat can be transferred from the first liquid coolant to the second liquid coolant via the heat exchanger.

In an advantageous embodiment, the first cooling circulatory arrangement 20 can provide immersive cooling as described above. In this case, the first cooling circulatory arrangement 20 comprises a volume of first liquid coolant contained within the housing or chassis of the first electronic module 10. The first liquid coolant is a dielectric. A reservoir of the first liquid coolant is contained within the housing or chassis, and a portion of the first liquid coolant is pumped around the housing or chassis, to and from the reservoir and causing flow past the first electronic device 12. In this way, heat is transferred to the first liquid coolant from the first electronic device 12. The flow of the first liquid coolant may be enabled by receiving the first liquid coolant through a pump inlet and a pump, housed within the electronic module 10, and then pumping the first liquid coolant to another region of the housing of the electronic module 10. In an example, the first liquid coolant is pumped to flow over the first electronic device 12. In a still further example, a weir heat sink could be implemented, coupled to the first electronic device 12, as discussed in more detail below. Where immersive cooling is used, the first electronic device 12 (and other of the plurality of electronic devices) may be partially immersed, or completely immersed (submersed) in the first liquid coolant.

In a particular example, the relative arrangement within the housing of the electronic module of the first electronic device 12 compared to the first and second cooling module, as well as the liquid level of the first liquid coolant, is configured such that the first liquid coolant does not make direct contact with the first 14 and second 16 cooling module. In particular, the cooling modules 14, 16 are arranged above the uppermost liquid level of the first liquid coolant when the system is in operation. As a consequence of this configuration, the first liquid coolant and the cooling modules 14, 16 are not directly thermally coupled, and heat does not transfer directly from the first liquid coolant to the cooling modules 14, 16 (or vice versa). The inventors have recognised that by spatially separating the cooling modules 14, 16 from the first liquid coolant, more efficient cooling of the electronic module 10 overall can be achieved. As such, the majority of heat transfer from the first liquid coolant to the second liquid coolant takes place at the heat exchanger 18, which is a separate and specific component that can be configured to provide the optimum conditions for heat transfer between the two coolant liquids.

As will be understood by the person skilled in the art, each of the examples discussed above with reference to FIGS. 1A and 1B, FIGS. 2A and 2B, and FIGS. 3A and 3B, and described below with reference to FIGS. 17A and 17B, describe a first 20 and a second 22 cooling circulatory arrangement in which heat is transferred from a first electronic device 12 to a first liquid coolant, at least a second electronic device to a second liquid coolant, and then from a first liquid coolant to a second liquid coolant via a heat exchanger 18. However, in each of the examples of FIGS. 1A and 1B, FIGS. 2A and 2B, FIGS. 3A and 3B, and FIGS. 17A and 17B the arrangement of the second cooling circulatory arrangement is different. More specifically, in FIGS. 1A and 1B, the cooling modules 14, 16 are arranged serially with the heat exchanger 18, having the cooling modules 14, 16 before the heat exchanger 18 in the direction of flow of the second liquid coolant. In FIGS. 2A and 2B, the cooling modules 14, 16 are arranged serially with the heat exchanger 18, having the heat exchanger 18 before the cooling modules 14, 16 in the direction of flow of the second liquid coolant. In FIGS. 3A and 3B, the cooling modules 14, 16 are arranged in parallel with the heat exchanger 18. In FIGS. 3A and 3B, the cooling modules 14, 16 are arranged in parallel specifically with the thermally conductive interface within the heat exchanger 18.

Each described configuration has advantages. In the configuration of FIGS. 1A and 1B, the second liquid coolant provides the greatest cooling power to the electronic devices coupled to the cooling modules 14, 16. Typically, these electronic devices are selected to be devices that generate the most heat within the electronic module 10. As the second liquid coolant is at its lowest temperature at the point of entry to the electronic modules 10, as a result of the second liquid coolant being passed through the cooling modules 14, 16 before the heat exchanger 18, the greatest possible heat gradient is provided between the cooling modules 14, 16 and the coupled electronic devices. Accordingly, the efficiency of heat transfer from the electronic devices coupled to the cooling modules 14, 16 will be greater in the configuration of FIGS. 1A and 1B, than of FIGS. 2A and 2B.

Nevertheless, in the configuration of FIGS. 1A and 1B the temperature of the second liquid coolant will be comparatively higher when passing through the heat exchanger 18 than compared to the configuration of FIGS. 2A and 2B. Therefore, the heat gradient between the first and second liquid coolant in the heat exchanger 18 will be comparatively less steep in the configuration of FIGS. 1A and 1B than compared to the configuration of FIGS. 2A and 2B. Therefore, the configuration of FIGS. 1A and 1B may provide less efficient cooling to the first liquid coolant than the configuration of FIGS. 2A and 2B.

In fact, the inventors have recognised that, although the configuration of FIGS. 1A and 1B can be particularly useful to target electronic devices of especially high heat generation, the overall cooling power of the electronic module 10 is comparatively greater for the configuration of FIGS. 2A and 2B. The configuration of FIGS. 2A and 2B may provide less efficient heating to the specific electronic devices coupled to the cooling modules 14, 16, but, by providing more efficient cooling to the first liquid coolant, can remove the greater amount of heat from the electronic module 10 overall. It can be envisaged that either the configurations of FIGS. 1A and 1B, or of FIGS. 2A and 2A could be advantageous in different scenarios.

The configuration of FIGS. 3A and 3B provide a further possibility, in which the cooling modules 14, 16 and the heat exchanger are arranged in parallel in the second cooling circulatory arrangement. This arrangement which offers the maximum possible temperature differential between both the first and second liquid coolant at the heat exchanger 18, as well as between the second liquid coolant and cooling modules 14, 16 and the coupled electronic modules. It also allows for better control of the flow of the second liquid coolant through the cooling modules 14, 16 and the heat exchanger 18, so that different proportions of the flow can be passed through each element. This allows balancing of the cooling performance of the cooling modules 14, 16 and the heat exchanger 18. This configuration may be best for systems housing a large number of high temperature auxiliary components on a PCB board (which typically would be cooled by the first cooling circulatory arrangement).

The configuration of FIGS. 17A and 17B, described below, provides an alternative configuration in which the cooling modules 14, 16 and the thermally conductive interface at the heat exchanger are arranged in parallel in the second cooling circulatory arrangement. In other words, the cooling modules are arranged on a parallel branch of the second cooling circulatory arrangement compared to the portion of the heat exchanger at which heat is transferred from the first coolant liquid (in a first chamber) to a second liquid coolant (in a second chamber). This arrangement allows for efficient cooling of both the cooling modules and the first liquid coolant by providing the second liquid coolant at the lowest possible temperature to each element. Adjustment of the relative flow rate between each branch of the second cooling circulatory arrangement allows balancing of the cooling power between the cooling modules and the first liquid coolant, by changing the proportion of the second liquid coolant flowing through each branch. Compared to the parallel configuration of FIGS. 3A and 3B, the novel arrangement of the heat exchanger discussed for use in the system of FIGS. 17A and 17B also provides a number of other benefits. In particular, the amount of pipework and number of connections for the second cooling circulatory system is reduced, as the input and output of the second liquid coolant is directly into or out of the heat exchanger. Not only does this reduce the number of components and the potential leak points within the system, it is also more space efficient for the volume within the housing of the electron module.

Although in each of the examples of FIG. 1A to 3B, described above, and FIGS. 17A and 17B described below, the first and second cooling modules 14, 16 are arranged in parallel with each other within the second cooling circulatory arrangement 22, the first and second cooling modules 14, 16 instead could be arranged serially. Although two cooling modules are shown, one cooling module or any number of cooling modules 14, 16 could be incorporated within the second cooling circulatory arrangement 22, arranged either in parallel, serially, or in a combination of parallel and series arrangements. Furthermore, although the first cooling circulatory arrangement can be configured to provide immersive cooling (as discussed above), it will be understood that the first cooling circulatory arrangements could be configured using a closed loop in which cold plates (or similar) are coupled to at least the first electronic device and provide cooling which is not immersive. In this case, the configuration of the first cooling circulatory arrangement with respect to the second cooling circulatory arrangement would not be changed than compared to the described examples.

Further specific implementations of each of the examples of the system considered above (having different configurations for the second cooling circulatory arrangement) are described below.

Figure 4A:
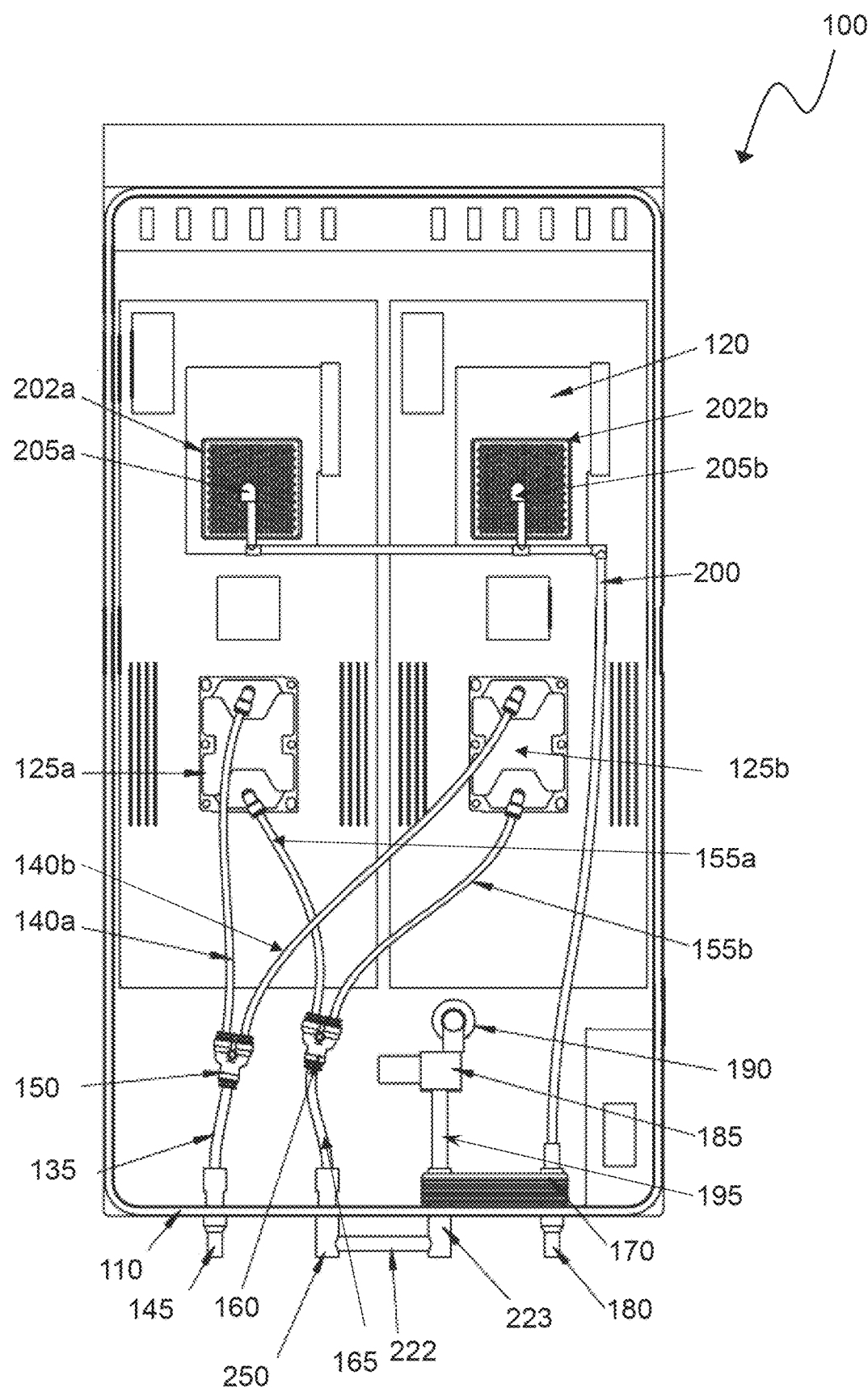
FIG. 4A is a plan view, and 4B and 4C are perspective views, of an electronic module that is a specific implementation of the first example of the system according to FIGS. 1A and 1B.

System Comprising a Second Cooling Circulatory Arrangement with the Cold Plates and Heat Exchanger in Series Wherein the Second Liquid Coolant Passes Though Cold Plates Prior to the Heat Exchanger Referring to FIG. 4A, there is depicted a specific implementation of the example of an electronic module 100 described above with reference to FIGS. 1A and 1B (in which the cooling modules and the heat exchanger are arranged serially, with the cooling module arranged prior to the heat exchanger in the direction of fluid flow). The electronic module 100 may be a module or server blade, having appropriate dimensions and outer connectors to fit within a commonplace server rack (not shown). The same electronic module 100 is shown in FIG. 4B and FIG. 4C, which each depict different perspective views of the module.

The electronic module 100 has an outer housing or enclosure 110, has a base, walls and lid, and may be sealable. A plurality of electronic devices (or heat generating components) are mounted within the housing. In some cases, the components may be mounted on printed circuit boards (PCB) 120 which may be connected to the base, lid or a wall of the housing. The described system looks to remove heat generated by the electronic devices from within the electronic module.

A first cooling circulatory arrangement (or first cooling loop) is used to cool certain electronic devices of the plurality of electronic devices mounted within the electronic module. A second cooling circulatory arrangement (or second cooling loop) is used to cool others of the heat generating components. For instance, the second cooling circulatory arrangement can be provided with a greater cooling power, and so be used to cool specific components which generate greater amounts of heat than those components cooled by the first cooling circulatory arrangement.

Figure 4B:
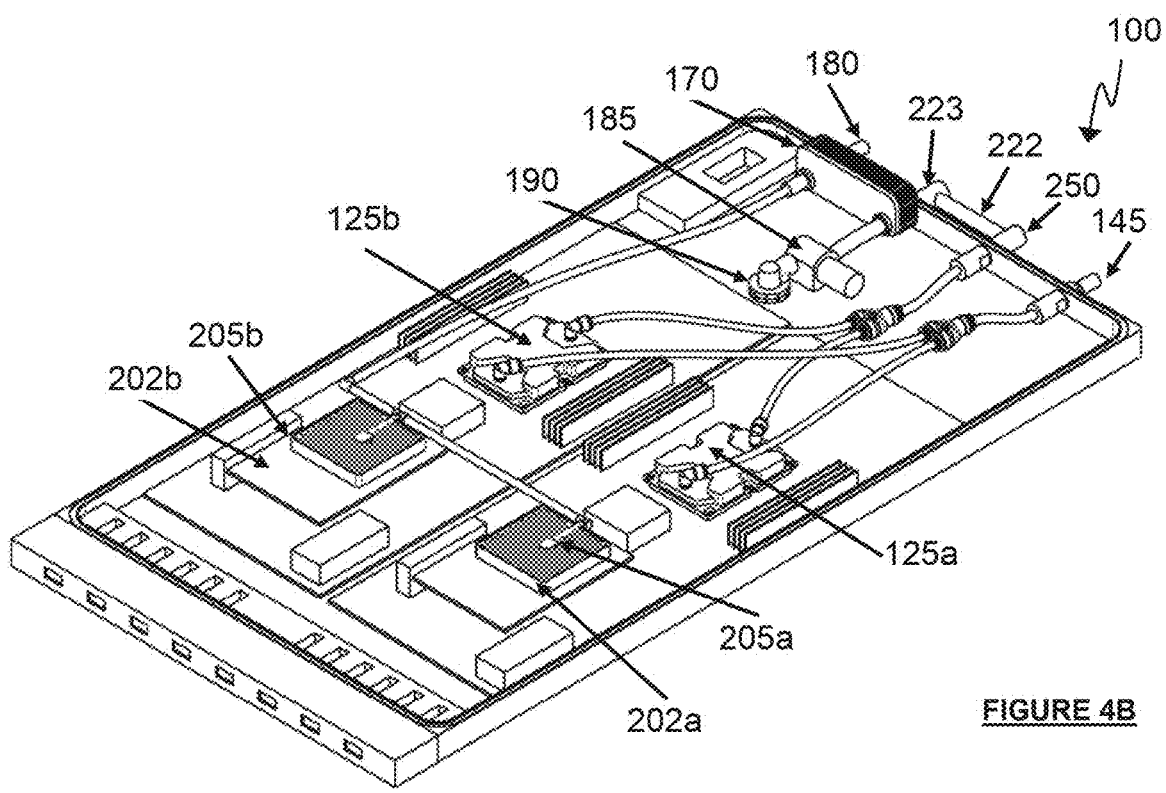
Figure 4C:
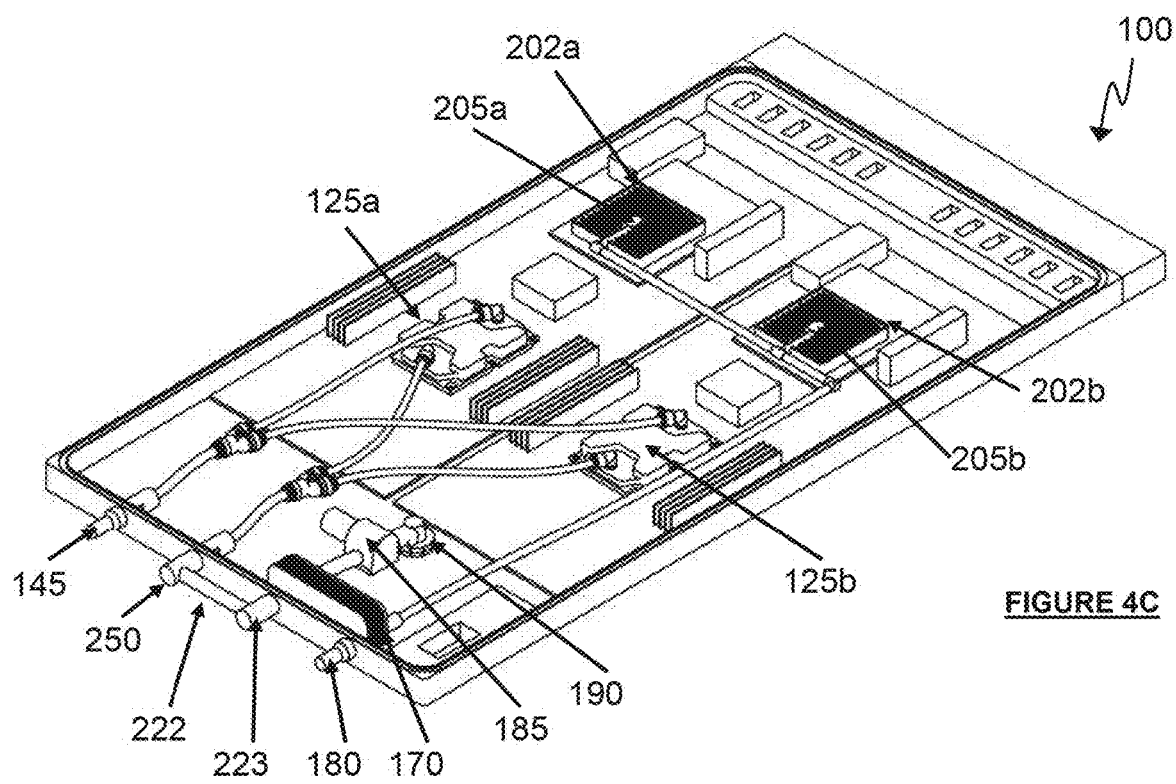

In the example depicted in FIGS. 4A, 4B and 4C, an electronic module has a first cooling circulatory arrangement (or first cooling loop) that provides immersive cooling. The first cooling circulatory arrangement is contained entirely within the housing 110 of the electronic module. In particular, a first liquid coolant (such as a dielectric liquid) is contained within the sealable housing of the electronic module, so that a number of components to be cooled are at least partially immersed in the first liquid coolant. The volume of first liquid coolant contained in the cavity of the housing of the electronic module may be considered as a reservoir of first liquid coolant.

First liquid coolant from the reservoir of first liquid coolant is collected or received at a pump input 190. The pump input 190 may be shaped in order to improve flow of the liquid coolant towards a pump 185. The pump 185 moves the first liquid coolant through the first cooling circulatory arrangement (or first cooling loop). First liquid coolant passed through the pump 185 is moved through a pipe 195 and into a heat exchanger 170 (more specifically, past a thermally conductive interface within the heat exchanger), where it will be cooled. In particular, heat retained in the first coolant fluid may be transferred to the second coolant fluid, which is also passed through the heat exchanger, as described below. As will be understood, first liquid coolant entering the heat exchanger is at a higher temperature to the first liquid coolant passing out of the heat exchanger.

In the example of FIGS. 4A, 4B and 4C, a pipe 200 is connected to the heat exchanger to carry first cooling fluid output from the heat exchanger 170. At the distal end of the pipe 200 are one or more outlets or nozzles 205a, 205b. In the specific example of FIGS. 4A, 4B and 4C, the outlets or nozzles 205a each form the inlet to a weir 202a, 202b. The weirs act as heat sinks, and are part of the first cooling circulatory arrangement. The weir is described below in further detail with respect to FIGS. 12A to 14B. However, the first cooling circulatory arrangement could be configured without use of the described weir heat sink. For instance, nozzles could be arranged to distribute first liquid coolant that has passed out of the heat exchanger to the vicinity of a first electronic device, or to cause flow of first liquid coolant through the reservoir of first liquid coolant in the housing or chassis (in which the first electronic device is at least partially immersed) and towards the pump inlet.

First cooling fluid passes out of outlets or nozzles 205a, 205b and through the weir 202a, 202b (if used), until being collected within the reservoir of first liquid coolant contained within the volume of the housing 110 of the electronic module 100. In this way, the cooler first cooling fluid which has passed through the heat exchanger can be reintroduced to the bath or reservoir of the first cooling fluid within the housing 110, and cool any electronic components partially immersed in the reservoir. Specifically, the cooled first liquid coolant will absorb heat from the surfaces of the electronic devices (including the first electronic device with which it is in contact). Eventually, the first liquid coolant will once again be collected at the pump input, thereby completing the first cooling circulatory arrangement (or first cooling loop).

FIGS. 4A, 4B and 4C also depict a second cooling circulatory arrangement. The second cooling circulatory arrangement incorporates one or more cold plates 125a, 125b, which are each mounted to one or more electronic devices (not visible in FIG. 4A). Ideally, the electronic devices require higher performance cooling. The cold plates 125a, 125b are a module or chamber, through which a second coolant fluid (such as water) can be passed. Heat can be transferred to the second coolant fluid within the cold plate from the electronic devices, by conduction of the heat through the mounting surface of the cold plate, coupled to the given electronic device. The cold plates 125a, 125b of the second cooling circulatory arrangement are discussed in more detail below, with respect to FIGS. 10A, 10B and 10C.

The second cooling circulatory arrangement of FIGS. 4A, 4B and 4C has two cold plates, connected in parallel. In particular, a single input conduit 135 is connected to a first inlet 145 at the wall of the housing, in order to receive a second coolant fluid input to the electronic module. The first inlet 145 comprises a connector, which may be any suitable type of connector, including a quick disconnect connector. At a distal end, the single input conduit 135 is connected to an input manifold 150, to which two further input conduits 140a, 140b are connected. The further input conduits 140a, 140b are each connected to a respective cold plate 125a, 125b. In this way, the second coolant fluid can be transported, in parallel, to each of the cold plates 125a, 125b within the electronic module. The second liquid coolant is then passed through the cold plate, as discussed below in relation to FIGS. 10A, 10B and 10C.

An output conduit 155a, 155b is connected to each of the respective cold plates 125a, 125b. The output conduits 155a, 155b receive the second liquid coolant output from each of the cold plates 125a, 125b, in parallel. The output conduits 155a, 155b are connected to an output manifold 160, to which is also connected a single output conduit 165, for transporting the second liquid coolant out of the output manifold 160.

The single output conduit 165 is connected to a first outlet 250 in the wall of the housing, which routes the second liquid coolant out of the housing through a connector (such as a bulkhead connector 222). From the first outlet 250, the second liquid coolant is passed through the bulkhead connector 222 to a second inlet 223 in the wall of the housing. From here, the second liquid coolant is passed directly to an inlet of the heat exchanger 170 and once inside the heat exchanger is cause to flow past the thermally conductive interface therein. The heat exchanger 170 is arranged entirely within the housing 110 of the electronic module. In the particular example of FIGS. 4A, 4B and 4C, the heat exchanger 170 is a plate heat exchanger and connected to the wall of the housing 110. However, other suitable types of heat exchanger (as discussed further below) could be used, and could be arranged anywhere within the electronic module (and, less preferably, outside the electronic module).

The heat exchanger 170 may be of any suitable type that allows exchange of heat between the first and second coolant fluid whilst maintaining separation (not intermingling) of the two liquid coolants. For instance, the heat exchanger may have a first chamber, through which the first liquid coolant flows, which is separated from a second chamber, through which the second coolant fluid flows. The wall or walls separating the first and second chamber acts as a thermal interface (or thermally conductive interface), through which heat can be transferred. In particular, heat can be transferred from the hotter liquid coolant (which in the present example, will be the second liquid coolant under normal operation) to the cooler liquid coolant (which in the present example, will be the first liquid coolant under normal operation), as a result of the temperature gradient across the thermal interface. As can be envisaged by a person skilled in the art, more than two chambers could be included within the heat exchanger, and more than one thermal interface could be provided to separate the chambers through which the different liquid coolants flow. More than one pathway could be provided through each chamber. The heat exchanger may comprise fins or other features at the thermal interface to promote heat exchange.

Turning back to FIGS. 4A, 4B and 4C, a second outlet 180 in the wall of the housing 110 of the electronic module is connected to an outlet of the heat exchanger 170, and arranged to receive the second liquid coolant passed through the heat exchanger. As will be understood, the second liquid coolant passing out of the heat exchanger 170 will be at a higher temperature than the second liquid coolant entering the heat exchanger 170, as a result of the heat absorbed from the first liquid coolant within the heat exchanger 170. The second outlet 180 comprises a connector, which may be any suitable type of connector, including a quick disconnect connector.

Although not shown in FIGS. 4A, 4B and 4C, the first inlet 145 and the second outlet 180 may each be connected to a cooling system or second liquid coolant supply via the server rack (for instance by pipes attached to or integral to the rack, connected to the inlet 145 and outlet 180, as necessary). This is discussed in further detail below, in relation to FIGS. 5A and 5B.

As will be understood, different devices within an electronic module may produce different amounts of heat than other components, and so require a different rate of cooling. Therefore, the described configuration provides a cooling system which delivers effective and efficient cooling for all electronic devices within an electronic module. In particular, the second cooling circulatory arrangement may provide high performance cooling of the hottest components, whilst the first cooling circulatory arrangement may provide cooling for other components within the electronic module. The use of a heat exchanger to exchange heat between the first and second cooling circulatory arrangement in the present application improves the overall efficiency of cooling. In contrast, in prior art systems, cooling may be limited by the exposure of the reservoir of a first coolant to the cold plate cooled by the second coolant.

Compared to some other configurations described herein, this described configuration provides greater cooling performance at the cold plates because the second liquid coolant (which may be a facility water based coolant) is fed directly into the cold plate, prior to reaching the heat exchanger and so when the second liquid coolant is at its lowest temperature. However, as will be explained below, this configuration does not typically provide a higher overall cooling performance than the configurations described below with reference to FIGS. 6A to 6C and 8A to 8C. Nevertheless, this configuration could be advantageous in a system where the main heat generating electronic devices (such as the main processors or equivalent) are very high temperature and the auxiliary components on the PCB within the electronic module are a relatively low temperature. This could also be used when there is particular concern about the processor performance, or maintaining of the lowest possible temperature for specific electronic devices in the electronic module.

Figure 5A:
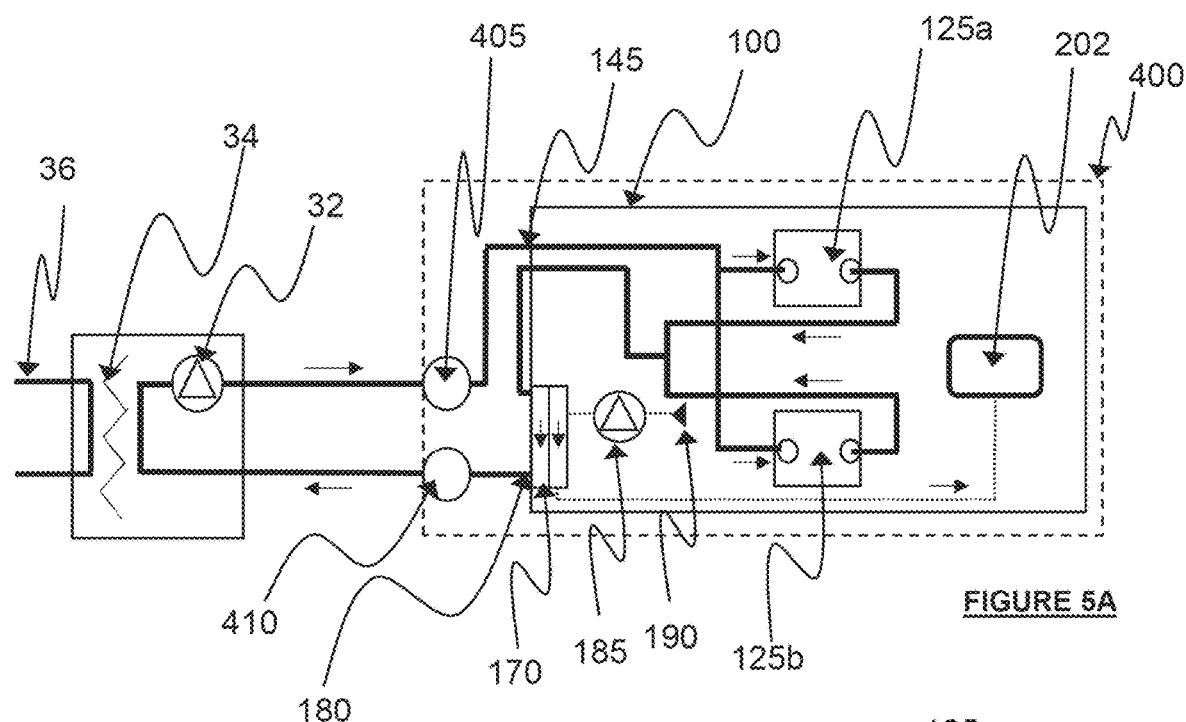
FIGS. 5A and 5B are schematic representations of the system according to the implementation of the electronic module in FIGS. 4A, 4B and 4C.
Figure 5B:
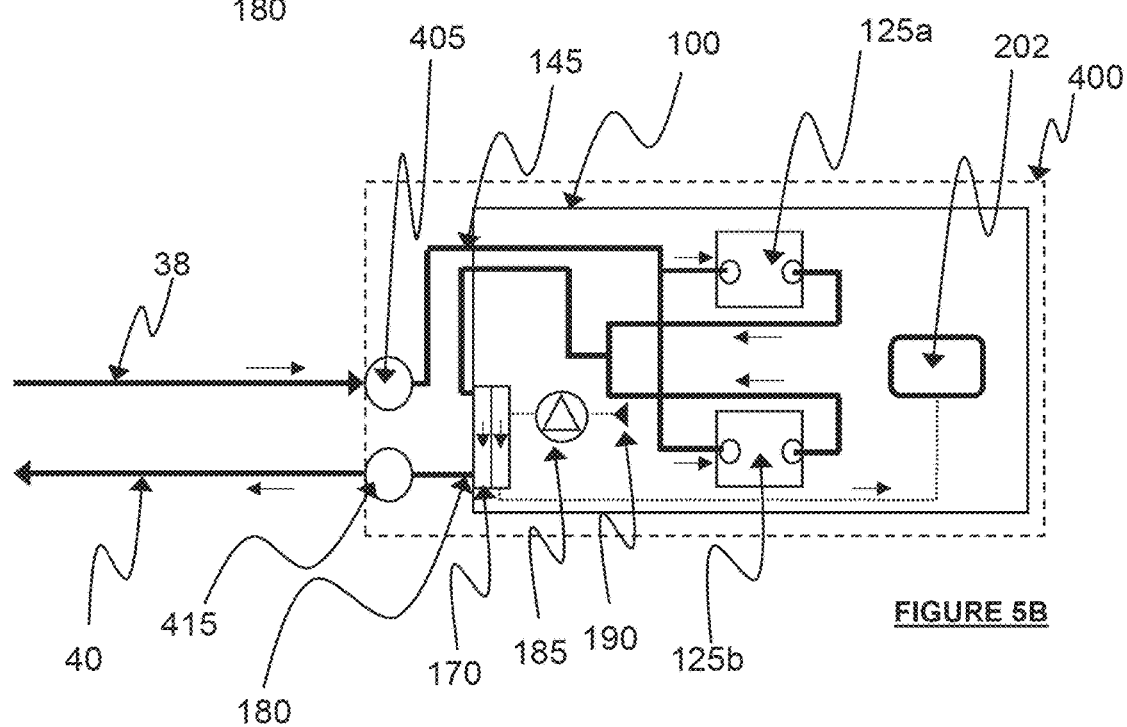

FIGS. 5A and 5B show a schematic view of the first and second cooling circulatory arrangement of FIGS. 4A, 4B and 4C when the electronic module 100 is connected in a rack 400. The arrangement of the first and second cooling circulatory arrangements, within the electronic modules are the same for both the examples of FIGS. 5A and 5B. However, the apparatus for providing low temperature second liquid coolant to the electronic modules is different within the two examples of FIGS. 5A and 5B. In particular, the external cooling system for providing the second liquid coolant in the example of FIG. 5A is the same as the external cooling system described above with reference to FIG. 1A (i.e. heat transfer from the second liquid coolant to a third coolant medium, via a further heat exchanger). The external cooling system for providing the second liquid coolant in the example of FIG. 5B is the same as the external cooling system described above with reference to FIG. 1B (i.e. supply of the second liquid coolant from a facility level supply, such as a cooling water supply).

Considering the common aspects of FIGS. 5A and 5B, there is shown the first cooling circulatory system having a pump inlet 190, pump 185, heat exchanger 170, and weir 202 for circulation of first liquid coolant within the housing of the electronic module 100. FIGS. 5A and 5B further shows the second cooling circulatory arrangement comprising a first and second cooling module (or cold plate), and a heat exchanger.

In use, in which the second liquid coolant is received into the electronic module 100 though a first inlet 145, and through conduits to provide the coolant to two cooling modules (or cold plates) 125*a*, 125*b*, arranged in parallel. After passing through the cooling modules (or cold plates) 125*a*, 125*b*, the second liquid coolant is transported through various conduits to a first outlet, and then transported through a pipe to a second inlet and directly into the heat exchanger 170, where heat is transferred from the first liquid coolant to the second liquid coolant. From the heat exchanger 170, the second liquid coolant is passed out of the electronic module via a second outlet 180. The first inlet 145 and second outlet 180 may each be connected to an inlet 405 or outlet 410 manifold, respectively, at the server rack 400 in which the electronic module 100 is mounted. The first inlet and second outlet may be connected to the inlet and outlet manifold at the server rack via a quick disconnect connector.

Figure 6A:
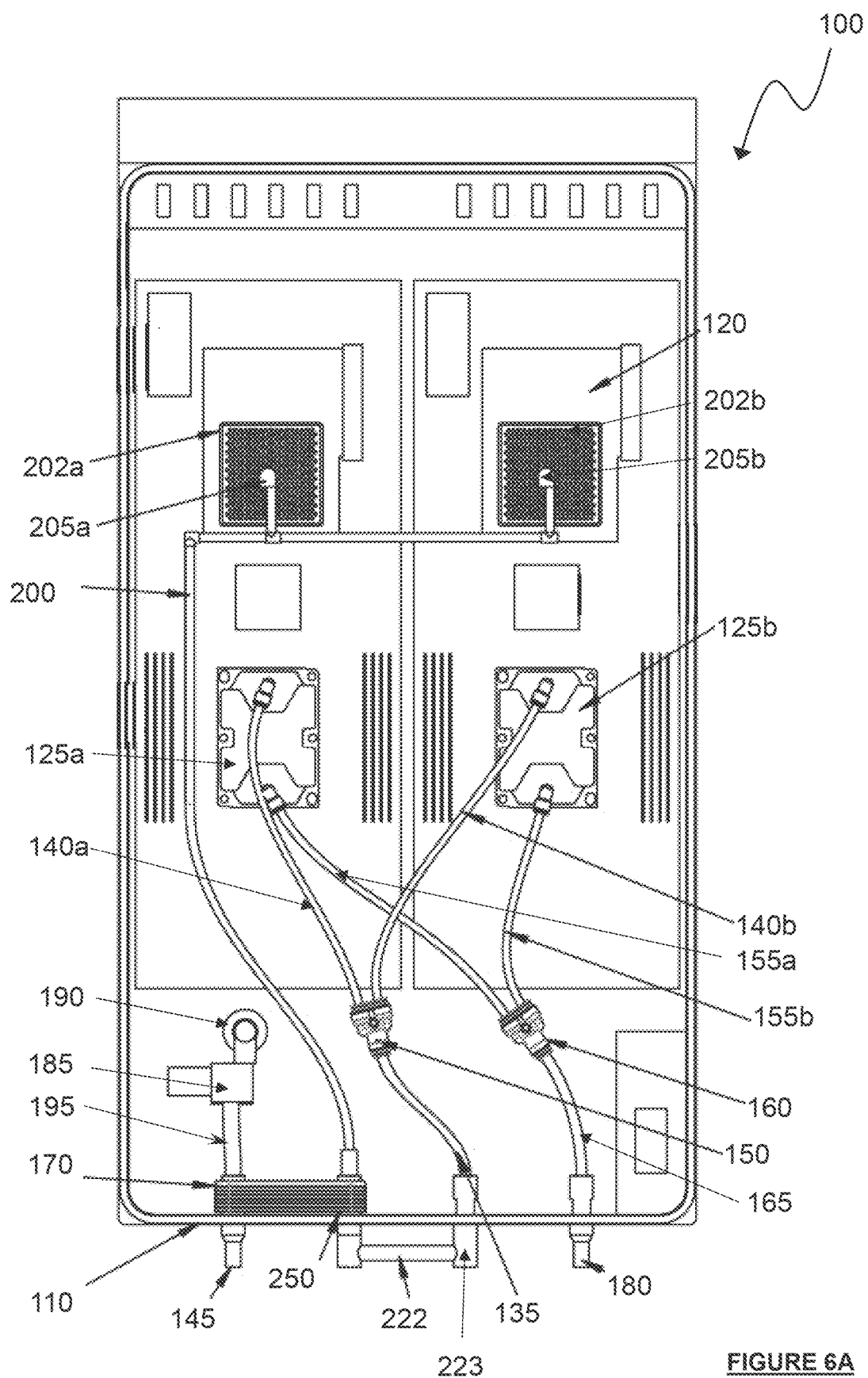
FIG. 6A is a plan view, and 6B and 6C are perspective views, of an electronic module that is a specific implementation of the second example of the system according to FIGS. 2A and 2B.

System Comprising a Second Cooling Circulatory Arrangement with the Cold Plates and Heat Exchanger in Series Wherein the Second Liquid Coolant Passes Though the Heat Exchanger Prior to the Cold Plates Referring to FIG. 6A, there is depicted a specific implementation of the example of an electronic module 100 described above with reference to FIGS. 2A and 2B (in which the cooling modules and the heat exchanger are arranged serially, with the heat exchanger arranged prior to cooling modules in the direction of fluid flow). The electronic modules may be a module or server blade, having appropriate dimensions and outer connectors to fit within a commonplace server rack (not shown). The same electronic module 100 is shown in FIG. 6B and FIG. 6C, which each depict different perspective views of the module.

The electronic module has an outer housing or enclosure 110, has a base, walls and lid, and may be sealable. A plurality of electronic devices (or heat generating components) are mounted within the housing. In some cases, the components may be mounted on printed circuit boards (PCB) 120 which may be connected to the base, lid or a wall of the housing. The described system looks to remove heat generated by the electronic devices from within the electronic module.

A first cooling circulatory arrangement (or first cooling loop) is used to cool certain electronic devices of the plurality of electronic devices mounted within the electronic module. A second cooling circulatory arrangement (or second cooling loop) is used to cool others of the heat generating components. For instance, the second cooling circulatory arrangement can be provided with a greater cooling power, and so be used to cool specific components which generate greater amounts of heat than those components cooled by the first cooling circulatory arrangement.

Figure 6B:
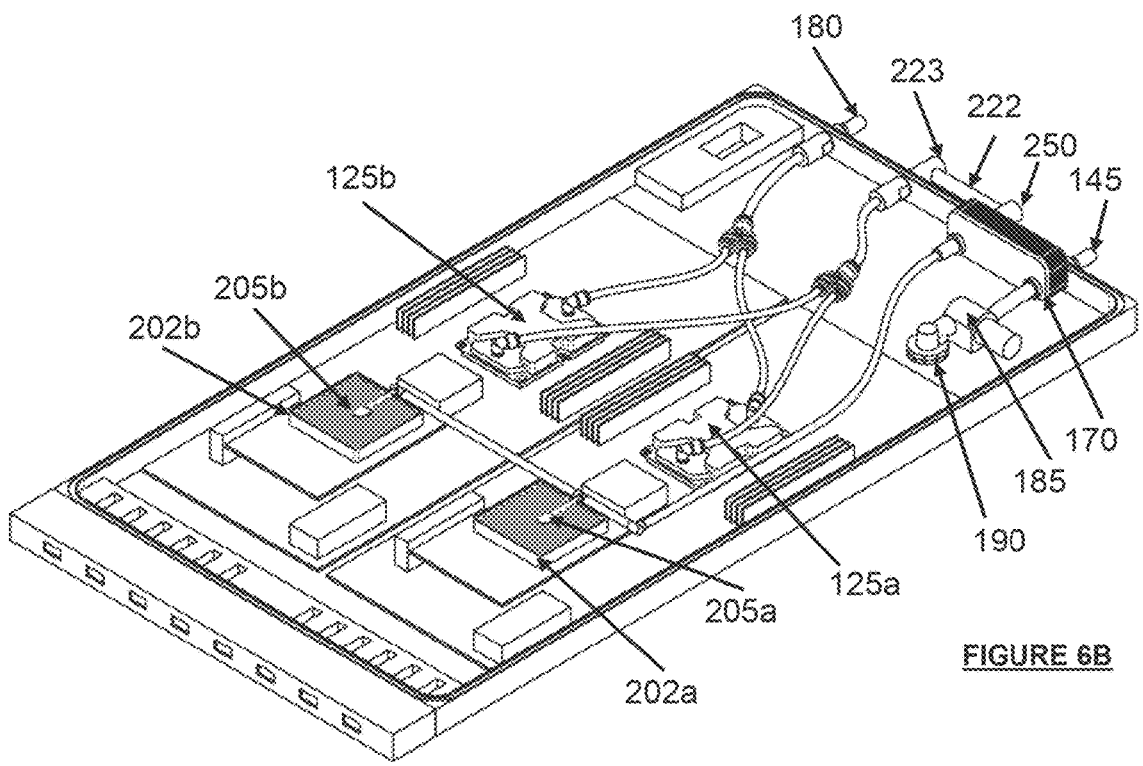
Figure 6C:
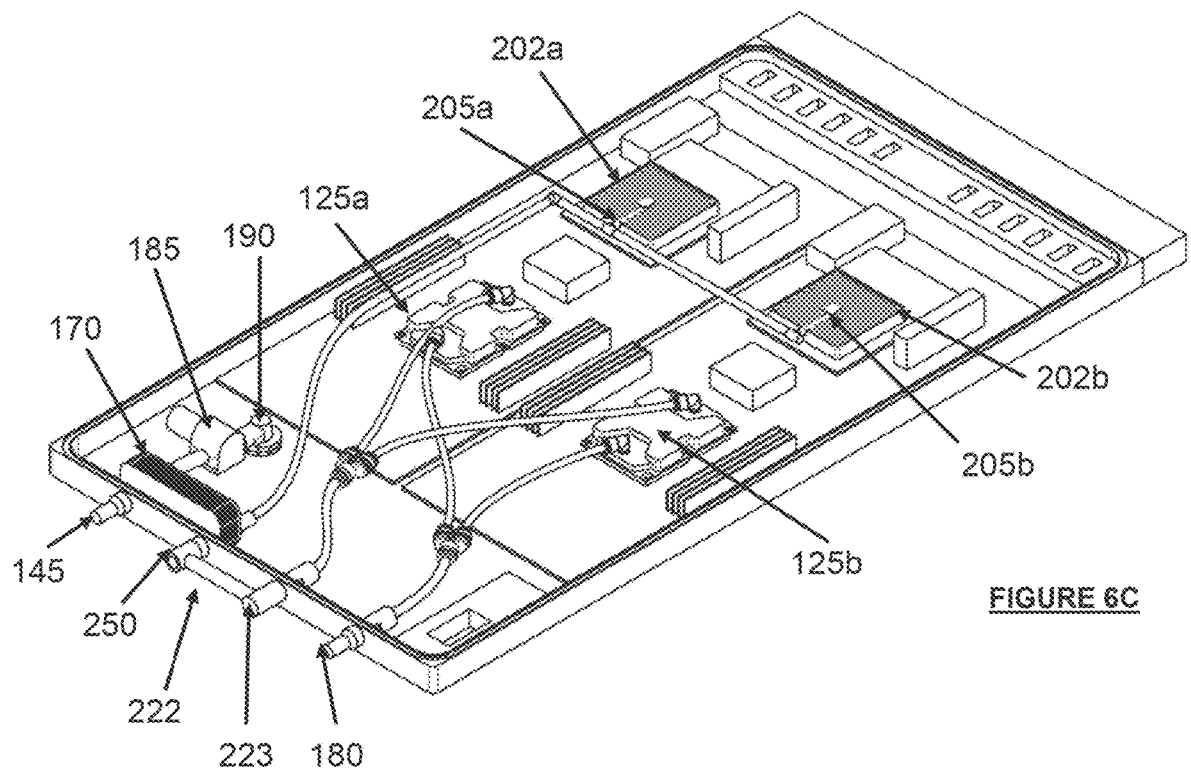

In the example depicted in FIGS. 6A, 6B and 6C, an electronic module has a first cooling circulatory arrangement (or first cooling loop) that provides immersive cooling. The first cooling circulatory arrangement is contained entirely within the housing 110 of the electronic module. In particular, a first liquid coolant is contained within the sealable housing of the electronic module, so that a number of components to be cooled 115 are at least partially immersed in the first liquid coolant. The first liquid coolant is contained in the volume of the housing of the electronic module may be considered as a reservoir of first liquid coolant.

First liquid coolant from the reservoir of first liquid coolant is collected or received at a pump input 190. The pump input 190 may be shaped in order to improve flow of the liquid coolant towards a pump 185. The pump 185 moves the first liquid coolant through the first cooling circulatory arrangement (or first cooling loop). First liquid coolant passed through the pump 185 is moved through a pipe 195 and into a heat exchanger 170 (being caused to flow past a thermally conductive interface therein), where it will be cooled. In particular, heat retained in the first coolant fluid may be transferred to the second coolant fluid, which is also passed through the heat exchanger, as described below. As will be understood, first liquid coolant entering the heat exchanger is at a higher temperature to the first liquid coolant passing out of the heat exchanger.

In the example of FIGS. 6A, 6B and 6C, a pipe 200 is connected to the heat exchanger to carry first cooling fluid output from the heat exchanger 170. At the distal end of the pipe 200 are one or more outlets or nozzles 205a, 205b. In the specific example of FIGS. 6A, 6B and 6C, the outlets or nozzles 205a each form the inlet to a weir 202a, 202b. The weirs act as heat sinks, and are part of the first cooling circulatory arrangement. The weir is described below in further detail with respect to FIGS. 12A to 14B. However, the first cooling circulatory arrangement could be configured without use of the described weir heat sink. For instance, nozzles could be arranged to distribute first liquid coolant that has passed out of the heat exchanger to the vicinity of a first electronic device, or to cause flow of first liquid coolant through the reservoir of first liquid coolant in the housing or chassis (in which the first electronic device is at least partially immersed) and towards the pump inlet.

First cooling fluid passes out of outlets or nozzles 205a, 205b and through the weir 202a, 202b (if used), until being collected within the reservoir of first liquid coolant contained within the volume of the housing 110 of the electronic module 100. In this way, the cooler first cooling fluid which has passed through the heat exchanger can be reintroduced to the bath or reservoir of the first cooling fluid within the housing 110, and cool any electronic components partially immersed in the reservoir. Specifically, the cooled first liquid coolant will absorb heat from the surfaces of the electronic devices (including the first electronic device with which it is in contact). Eventually, the first liquid coolant will once again be collected at the pump input, thereby completing the first cooling circulatory arrangement (or first cooling loop).

FIGS. 6A, 6B and 6C also depict a second cooling circulatory arrangement. The second cooling circulatory arrangement incorporates one or more cold plates 125a, 125b, which are each mounted to one or more electronic devices 130a, 130b. Ideally, the electronic devices 130a, 130b require higher performance cooling. The cold plates 125a, 125b are a module or chamber, through which a second coolant fluid (such as water) can be passed. Heat can be transferred to the second coolant fluid within the cold plate from the electronic devices 130a, 130b, by conduction of the heat through the mounting surface of the cold plate, coupled to the given electronic device. The cold plates 125a, 125b of the second cooling circulatory arrangement are discussed in more detail below, with respect to FIGS. 10A, 10B and 10C. The second cooling circulatory arrangement of FIGS. 6A, 6B and 6C has two cold plates, connected in parallel.

The second cooling circulatory arrangement of FIGS. 6A, 6B and 6C is configured having the heat exchanger prior to the cold plates, in the direction of flow of the second liquid coolant. In particular, second liquid coolant enters the housing 110 of the electronic module via a first inlet 145, and is passed directly into the heat exchanger 170 (which is housed entirely within the housing of the electronic module). The second liquid coolant flows past a thermally conductive interface at the heat exchanger, through which heat can transfer to the second liquid coolant form the first liquid coolant. The heat exchanger 170 may be a plate heat exchanger, or may be of any suitable type, as described above. The first inlet 145 comprises a connector, which may be any suitable type of connector, including a quick disconnect connector.

As will be understood, the second liquid coolant passing out of the heat exchanger 170 will be at a higher temperature than the second liquid coolant entering the heat exchanger 170, as a result of the heat absorbed from the first liquid coolant within the heat exchanger 170 (via the thermally conductive interface). After passing through the heat exchanger 170, the second liquid coolant is directed out of the heat exchanger 170 through a first outlet 250 in the housing of the electronic module. The second liquid coolant is passed to a bulkhead connector 222 and back into the housing through a second inlet 223.

A single input conduit 135 is connected to the second inlet 223 at the wall of the housing, to receive the second liquid coolant. At a distal end, the single input conduit 135 is connected to an input manifold 150, to which two further input conduits 140a, 140b are connected. The further input conduits 140a, 140b are each connected to a respective cold plate 125a, 125b. In this way, the second coolant fluid can be transported, in parallel, to each of the cold plates 125a, 125b within the electronic module. The second liquid coolant is then passed through the cold plate, as discussed below in relation to FIGS. 10A, 10B and 10C.

An output conduit 155a, 155b is connected to each of the respective cold plates 125a, 125b. The output conduits 155a, 155b receive the second liquid coolant output from each of the cold plates 125a, 125b, in parallel. The output conduits 155a, 155b are connected to an output manifold 160, to which is also connected a single output conduit 165, for transporting the second liquid coolant out of the output manifold 160.

The single output conduit 165 is connected to a second outlet 180 at the wall of the housing of the electronic module. The second outlet 180 comprises a connector, which may be any suitable type of connector, such as a quick disconnect connector.

Figure 7A:
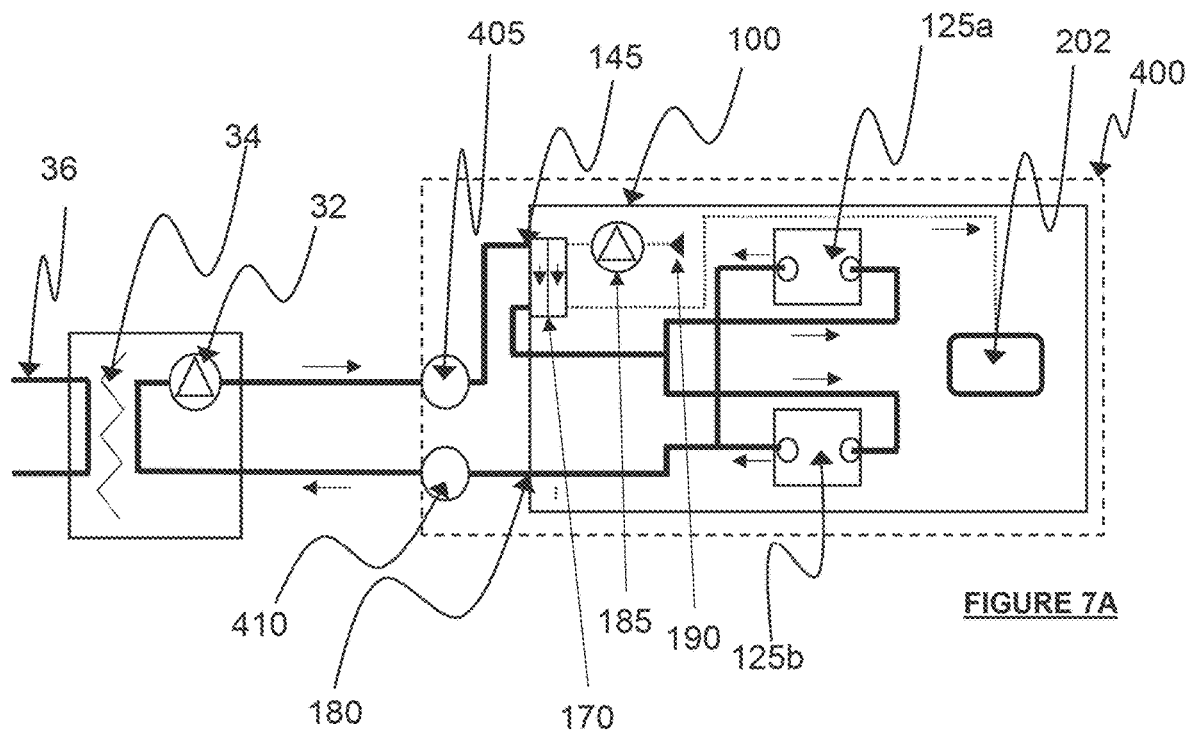
FIGS. 7A and 7B are schematic representations of the system according to the implementation of the electronic module in FIGS. 6A, 6B and 6C.
Figure 7B:
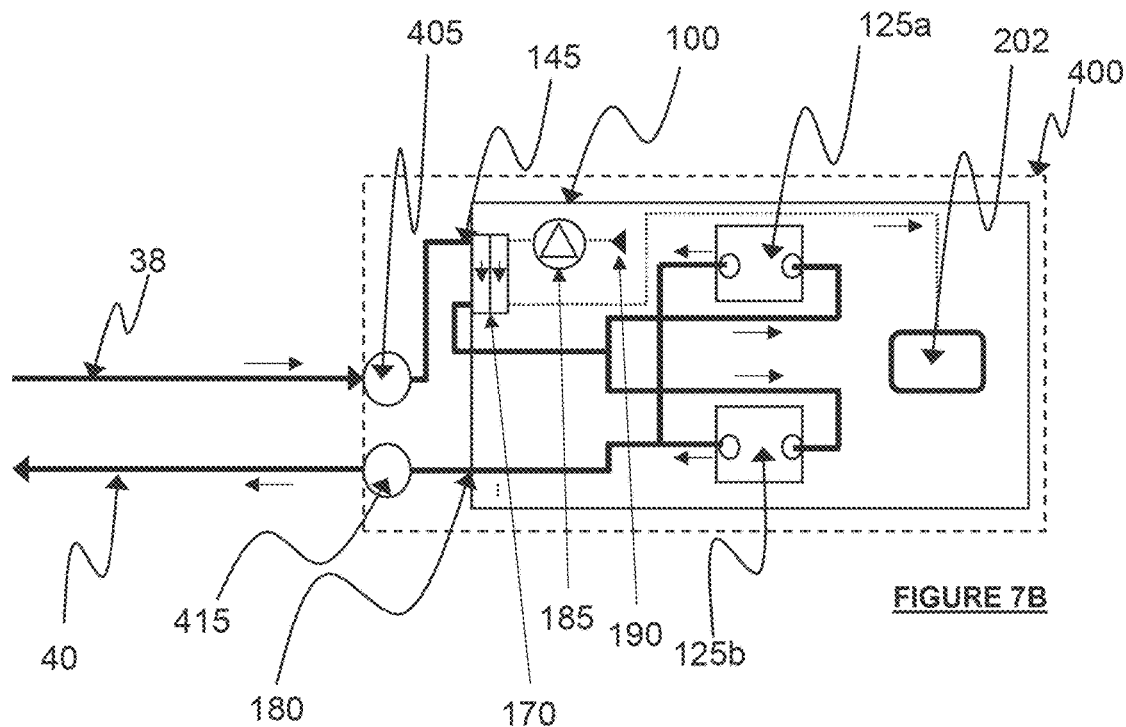

Although not shown in FIGS. 6A, 6B and 6C, the first inlet 145 and the second outlet 180 may each be connected to a cooling system or second liquid coolant supply (for instance via a rack, having connectors for connection to the inlet 145 and outlet 180, as necessary). This is discussed in further detail below, in relation to FIGS. 7A and 7B.

As will be understood by the person skilled in the art, because in this configuration the second liquid coolant is passed through the heat exchanger prior to the cold plates, the temperature of the second liquid coolant passing through the cold plates will be higher than compared to the configuration of FIGS. 4A to 5B (as the second liquid coolant will already have receive heat transferred from the first liquid coolant). As a consequence, the cooling power of the second cooling circulatory arrangement at the cold plates may be reduced compared to the configuration of FIGS. 4A to 5B. However, as the temperature of the second liquid coolant in the heat exchanger will be relatively lower than the second liquid coolant in the heat exchanger in the configuration of FIGS. 4A to 5B, the cooling power of the second liquid coolant at the heat exchanger will be increased relative to the configuration of FIGS. 4A to 5B. In fact, the inventors have recognised that in many scenarios the configuration of FIGS. 4A to 5B can provide a greater overall cooling performance for the whole electronic module. This configuration may be particularly beneficial when a greater number of high temperature auxiliary components are included on a the PCB in the electronic module (and partially immersed in the first liquid coolant).

Figure 8A:
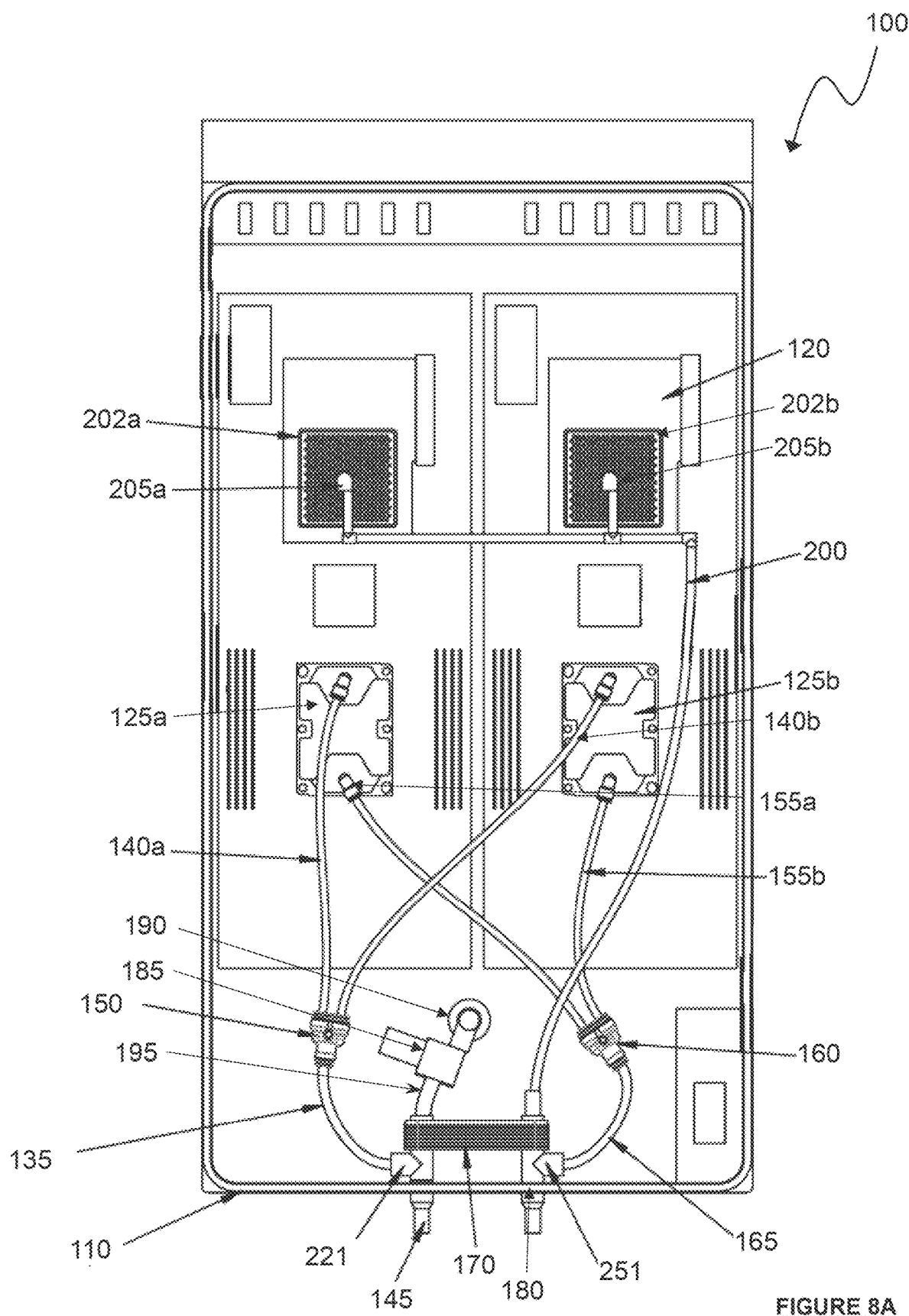
FIG. 8A is a plan view, and 8B and 8C are perspective views, of an electronic module that is a specific implementation of the third example of the system according to FIGS. 3A and 3B.

System Having a Second Cooling Circulatory Arrangement with the Cold Plates and Heat Exchanger in Parallel Referring to FIG. 8A, there is depicted a specific implementation of the example of an electronic module 100 described above with reference to FIGS. 3A and 3B (in which the cooling modules and the heat exchanger are arranged in parallel within the second cooling circulatory arrangement). The electronic modules may be a module or server blade, having appropriate dimensions and outer connectors to fit within a commonplace server rack (not shown). The same electronic module 100 is shown in FIG. 8B and FIG. 8C, which each depict different perspective views of the module.

The electronic module has an outer housing or enclosure 110, has a base, walls and lid, and may be sealable. A plurality of electronic devices (or heat generating components) are mounted within the housing. In some cases, the components may be mounted on printed circuit boards (PCB) 120 which may be connected to the base, lid or a wall of the housing. The described system looks to remove heat generated by the electronic devices from within the electronic module.

A first cooling circulatory arrangement (or first cooling loop) is used to cool certain electronic devices of the plurality of electronic devices mounted within the electronic module. A second cooling circulatory arrangement (or second cooling loop) is used to cool others of the heat generating components. For instance, the second cooling circulatory arrangement can be provided with a greater cooling power, and so be used to cool specific components which generate greater amounts of heat than those components cooled by the first cooling circulatory arrangement.

Figure 8B:
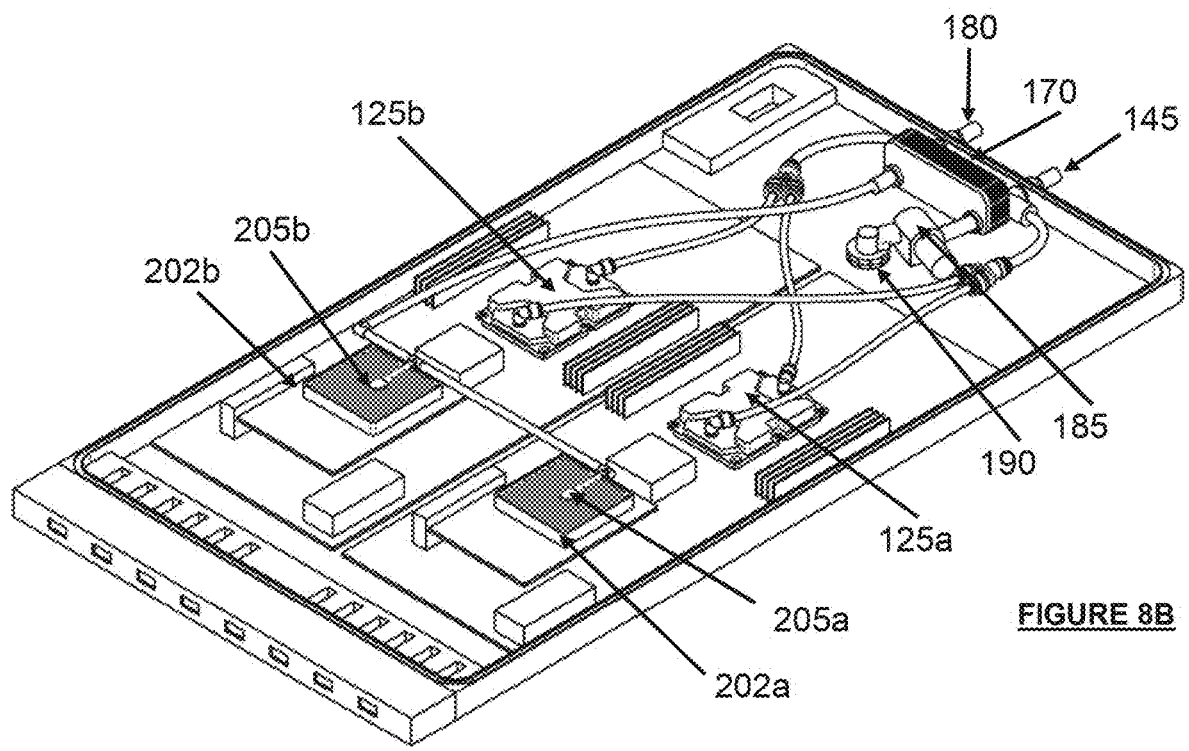
Figure 8C:
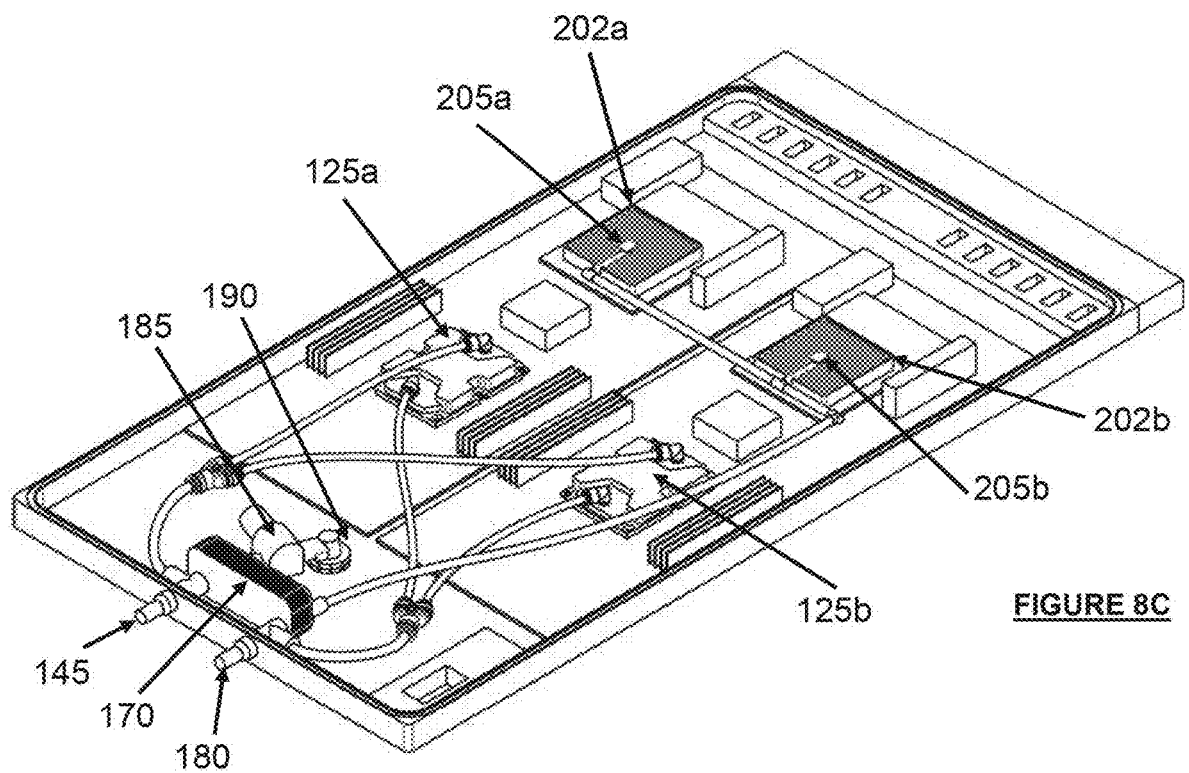

In the example depicted in FIGS. 8A, 8B and 8C, an electronic module has a first cooling circulatory arrangement (or first cooling loop) that provides immersive cooling. The first cooling circulatory arrangement is contained entirely within the housing 110 of the electronic module. In particular, a first liquid coolant is contained within the sealable housing of the electronic module, so that a number of components to be cooled 115 are at least partially immersed in the first liquid coolant. The first liquid coolant is contained in the volume of the housing of the electronic module and may be considered as a reservoir of first liquid coolant.

First liquid coolant from the reservoir of first liquid coolant is collected or received at a pump input 190. The pump input 190 may be shaped in order to improve flow of the liquid coolant towards a pump 185. The pump 185 moves the first liquid coolant through the first cooling circulatory arrangement (or first cooling loop). First liquid coolant is passed through the pump 185, moved through a pipe 195 and into a heat exchanger 170 (and past a thermally conductive interface therein), where it will be cooled. In particular, heat retained in the first coolant fluid may be transferred via the thermally conductive interface to the second coolant fluid, which is also passed through the heat exchanger, as described below. As will be understood, first liquid coolant entering the heat exchanger is at a higher temperature to the first liquid coolant passing out of the heat exchanger.

In the example of FIGS. 8A, 8B and 8C, a pipe 200 is connected to the heat exchanger to carry first cooling fluid output from the heat exchanger 170. At the distal end of the pipe 200 are one or more outlets or nozzles 205a, 205b. In the specific example of FIGS. 8A, 8B and 8C, the outlets or nozzles 205a each form the inlet to a weir 202a, 202b. The weirs act as heat sinks, and are part of the first cooling circulatory arrangement. The weir is described below in further detail with respect to FIGS. 12A to 14B. However, the first cooling circulatory arrangement could be configured without use of the described weir heat sink. For instance, nozzles could be arranged to distribute first liquid coolant that has passed out of the heat exchanger to the vicinity of a first electronic device, or to cause flow of first liquid coolant through the reservoir of first liquid coolant in the housing or chassis (in which the first electronic device is at least partially immersed) and towards the pump inlet.

First cooling fluid passes out of outlets or nozzles 205a, 205b and through the weir 202a, 202b (if used), until being collected within the reservoir of first liquid coolant contained within the volume of the housing 110 of the electronic module 100. In this way, the cooler first liquid coolant which has passed through the heat exchanger can be reintroduced to the bath or reservoir of the first liquid coolant within the housing 110, and cool any electronic components partially immersed in the reservoir. Specifically, the cooled first liquid coolant will absorb heat from the surfaces of the electronic devices (including the first electronic device with which it is in contact). Eventually, the first liquid coolant will once again be collected at the pump input, thereby completing the first cooling circulatory arrangement (or first cooling loop).

FIGS. 8A, 8B and 8C also depict a second cooling circulatory arrangement. The second cooling circulatory arrangement incorporates one or more cooling modules or cold plates 125a, 125b, which are each mounted to one or more electronic devices. Ideally, the electronic devices require higher performance cooling. The cold plates 125a, 125b are a module or chamber, through which a second liquid coolant (such as water) can be passed. Heat can be transferred to the second liquid coolant within the cold plate from the electronic devices 130a, 130b, by conduction of the heat through the mounting surface of the cold plate, coupled to the given electronic device. The cold plates 125a, 125b of the second cooling circulatory arrangement are discussed in more detail below, with respect to FIGS. 10A, 10B and 10C. The second cooling circulatory arrangement of FIGS. 8A, 8B and 8C has two cold plates, connected in parallel, although could also be connected in serial, for instance.

Referring to FIGS. 8A, 8B and 8C, an inlet 145 at the wall of the housing of the electronic module connects to a two-way inlet manifold 221 arranged within the housing of the electronic module. The two-way inlet manifold 221 creates two parallel branches of the second cooling circulatory arrangement within the electronic module. The inlet 145 comprises a connector, which may be any suitable type of connector, including a quick disconnect connector. Second liquid coolant is received into the electronic module via the inlet 145.

In a first branch of the second cooling circulatory arrangement, a first input conduit 135 is connected to the two-way inlet manifold 221 to transport the second liquid coolant to a further input manifold 150. A second and third input conduit 140a, 140b are connected to the further input manifold. The second and third input conduits 140a, 140b are each connected to a respective cold plate 125a, 125b. In this way, the second coolant fluid can be transported, in parallel, to each of the cold plates 125a, 125b within the electronic module. The second liquid coolant is then passed through the cold plate, as discussed below in relation to FIGS. 10A, 10B and 10C.

An output conduit 155a, 155b is connected to each of the respective cold plates 125a, 125b. The output conduits 155a, 155*b* receive the second liquid coolant output from each of the cold plates 125*a*, 125*b*, in parallel. The output conduits 155*a*, 155*b* are connected to a further output manifold 160, which is connected to an output conduit 165. The output conduit 165 directs the second liquid coolant to a two-way outlet manifold 251, at which point the first and second branch of the second cooling circulatory arrangement are joined together.

In a second branch of the second cooling circulatory arrangement, an output to the two-way inlet manifold 221 is connected directly to an inlet of the heat exchanger 170. The second liquid coolant of the second branch of the second cooling circulatory arrangement will flow past the thermally conductive interface at the heat exchanger, through which heat is transferred to the second liquid coolant form the first liquid coolant. The heat exchanger 170 is arranged entirely within the housing 110 of the electronic module. In the particular example of FIGS. 4A, 4B and 4C, the heat exchanger 170 is a plate heat exchanger. However, other suitable types of heat exchanger could be used.

The heat exchanger 170 may be of any suitable type that allows exchange of heat between the first and second coolant fluid whilst maintaining separation (not intermingling) of the two liquid coolants. For instance, the heat exchanger may have a first chamber, through which the first liquid coolant flows, which is separated from a second chamber, through which the second coolant fluid flows. The wall or walls separating the first and second chamber acts as a thermal interface (or thermally conductive interface), through which heat can be transferred. In particular, heat can be transferred from the hotter liquid coolant (which in the present example, will be the second liquid coolant under normal operation) to the cooler liquid coolant (which in the present example, will be the first liquid coolant under normal operation), as a result of the temperature gradient across the thermal interface. As can be envisaged by a person skilled in the art, more than two chambers could be included within the heat exchanger, and more than one thermal interfaces could be provided to separate the chambers through which the different liquid coolants flow. More than one pathway could be provided through a given chamber. The heat exchanger may comprise fins or other features at the thermal interface to promote heat exchange.

Turning back to FIGS. 8A, 8B and 8C, an outlet of the heat exchanger is connected directly to the two-way outlet manifold 251, thereby re-joining the first and second branch of the second cooling circulatory arrangement. The two-way outlet manifold 251 is coupled to an outlet 180 at the wall of the housing of the electronic module. The outlet 180 comprises a connector, which may be any suitable type of connector, including a quick disconnect connector.

Although not shown in FIGS. 8A, 8B and 8C, the inlet 145 and the outlet 180 may each be connected to a cooling system or second liquid coolant supply (for instance by further pipes, connected to the inlet 145 and outlet 180, as necessary). This is discussed in further detail below, in relation to FIGS. 9A and 9B.

Advantageously, the parallel configuration for the second cooling circulatory arrangement allows both the cold plates and the heat exchanger to benefit from the lowest temperature second liquid coolant. Furthermore, this configuration allows balancing of the flow rate (and so the cooling performance) at the heat exchanger compared to the cold plates. Therefore, this configuration may allow greater control of the cooling of the second and third electronic device via the cold plates, and the first electronic device via the first liquid coolant, by adjusting the proportion of the second liquid coolant through each of the first and second branch of the second cooling circulatory arrangement within the housing of the electronic module.

Figure 9A:
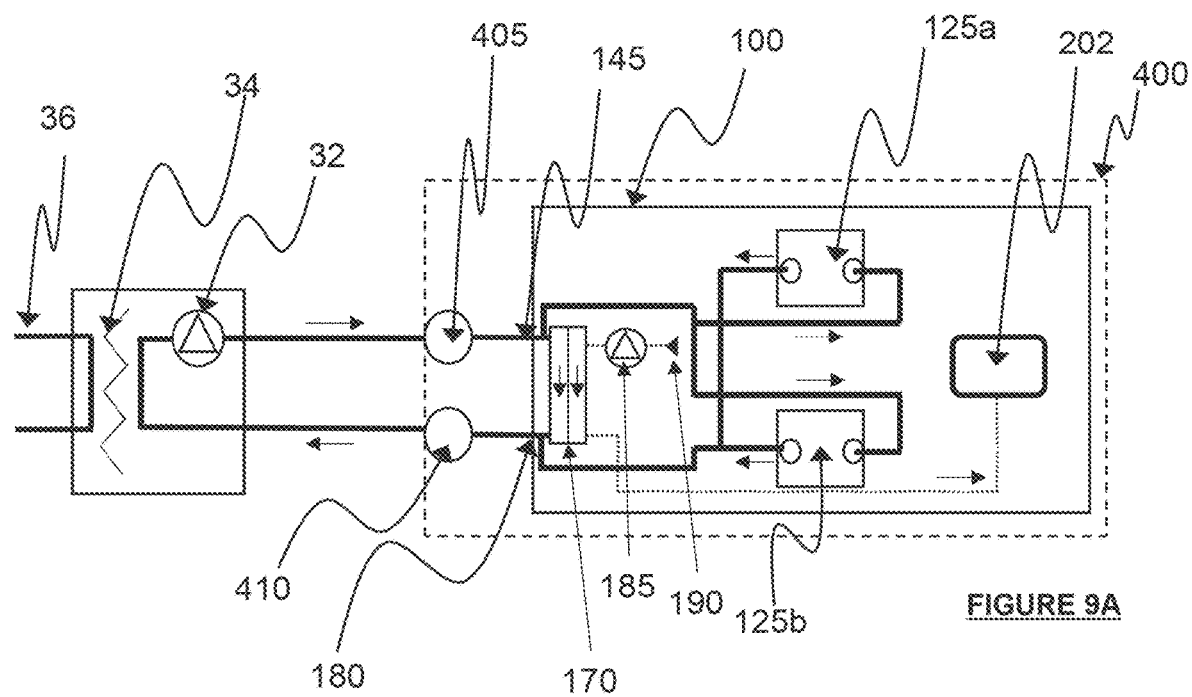
FIGS. 9A and 9B are schematic representations of the system according to the implementation of the electronic module in FIGS. 8A, 8B and 8C.
Figure 9B:
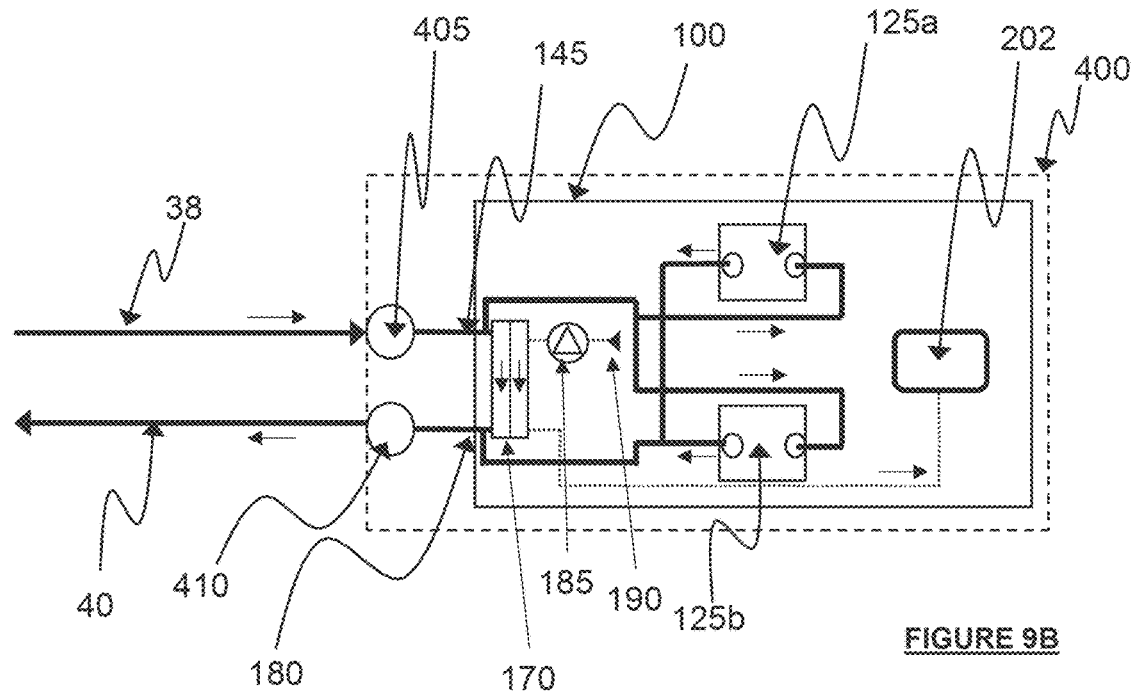

FIGS. 9A and 9B show a schematic view of the first and second cooling circulatory arrangement of FIGS. 8A, 8B and 8C when the electronic module 100 is connected in a rack 400. The arrangement of the first and second cooling circulatory arrangements within the electronic modules are the same for both the examples of FIGS. 9A and 9B. However, the apparatus for providing low temperature second liquid coolant to the electronic modules is different within the two examples of FIGS. 9A and 9B. In particular, the external cooling system for providing the second liquid coolant in the example of FIG. 9A is the same as the external cooling system described above with reference to FIG. 1A (i.e. heat transfer from the second liquid coolant to a third coolant medium, via a further heat exchanger). The external cooling system for providing the second liquid coolant in the example of FIG. 9B is the same as the external cooling system described above with reference to FIG. 1B (i.e. supply of the second liquid coolant from a facility level supply, such as a cooling water supply).

Considering the common aspects of FIGS. 9A and 9B, there is shown the first cooling circulatory system having a pump inlet 190, pump 185, heat exchanger 170, and weir 202 for circulation of first liquid coolant 401 within the housing of the electronic module 100. FIGS. 9A and 9B further shows the second cooling circulatory arrangement comprising a first and second cooling module (or cold plate) 125*a*, 125*b*, and the heat exchanger 170.

In use, the second liquid coolant is received into the electronic module through an inlet 145, and immediately split into a first and second branch. The first branch passes the second liquid coolant to two cooling modules (or cold plates) 125*a*, 125*b*, arranged in parallel. After passing through the cooling modules (or cold plates) 125*a*, 125*b*, the second liquid coolant from the first branch re-joins the second branch, and then is passed out of the electronic module via an outlet 180. The inlet 145 and outlet 180 may each be connected to an inlet 405 or outlet 410 manifold, respectively, at the server rack 400 in which the electronic module 100 is mounted. The inlet 145 and outlet 180 may be connected to the inlet 405 and outlet 410 manifold at the server rack 400 via a quick disconnect connector.

In use, a second branch of the second cooling circulatory arrangement passes a portion of the second coolant through the heat exchanger 170. Within the heat exchanger 170, heat is transferred from the first liquid coolant in the first cooling circulatory arrangement to the second liquid coolant. Once the portion of the second liquid coolant is passed through the heat exchanger 170, then it is re-joined with the first branch of the second cooling circulatory arrangement, and then passed directly out of the electronic module via the outlet 180.

Cooling Modules (or Cold Plates)

The cooling modules of the second cooling circulatory arrangement may be provided as a cold plate. Such cold plates will now be described in more detail with reference to FIGS. 10A to 10C. The cold plate has particular advantages to provide high performance, efficient cooling of specific electronic devices to which the cold plate is coupled. As such, the second cooling circulatory arrangement, and more specifically the cold plates, can be coupled to the electronic devices in the electronic module which produce the greatest amount of heat. Although it would not be practical to cool every electronic device within the electronic module in this way, the use of cold plates as part of the second cooling circulatory arrangement allows focused cooling which can reduce the burden of cooling the whole volume of the electronic module by the first cooling circulatory system. As such, the first and the second cooling circulatory arrangement act in cooperation to provide a particularly efficient and effective cooling system for the electronic module.

A further benefit of the cold plates within the second cooling circulatory arrangement is the provision of a closed, sealed system, wherein the second liquid coolant does not make direct contact with any electronic device. This allows use of water for the second liquid coolant (rather than dielectric liquid, for instance), which is readily available at a low cost. A large throughput of water through the second cooling circulatory arrangement is possible if the second cooling circulatory arrangement is connected to a facility water supply and drainage, or to a powerful pump system external to the electronic module, which further increases the potential cooling power of the second cooling circulatory arrangement.

In general terms, there is herein described a cold plate, comprising a housing (which may be integrally formed), a surface of the housing (typically planar) being arranged to provide a thermal interface (which may be termed a conduction surface) for cooling an electronic device thermally coupled thereto. The cold plate further comprises at least one channel within the housing and proximate to the surface. The channel or channels may be formed of an internal chamber (or chambers), volume or other space for containing liquid coolant (such as water, a water-based coolant, a coolant that essentially comprises water or a high specific-heat capacity liquid alternative such as a mineral oil or dielectric fluid). The channel or channels are arranged for the liquid coolant to flow therethough, such that heat received by the thermal interface is transferred to the liquid coolant. Optionally, a plurality of parallel channels may be provided, each extending from the coolant port. As will be discussed further below, pins and/or fins are preferably arranged within the at least one channel.

The cold plate also comprises a coolant port extending outside the housing, for transferring liquid coolant to and/or from the at least one channel. The coolant port may be a connector, coupling, joint or other similar structure. An inlet and an outlet coolant port may be provided. At least one conduit, such as a pipe, hose or tube (preferably flexible), may be coupled to the coolant port for transferring liquid coolant to and/or from the coolant port. Advantageously, the cold plate is configured such that the liquid coolant remains substantially in a liquid state (that is, single phase liquid cooling) throughout the cooling system.

Figure 10A:
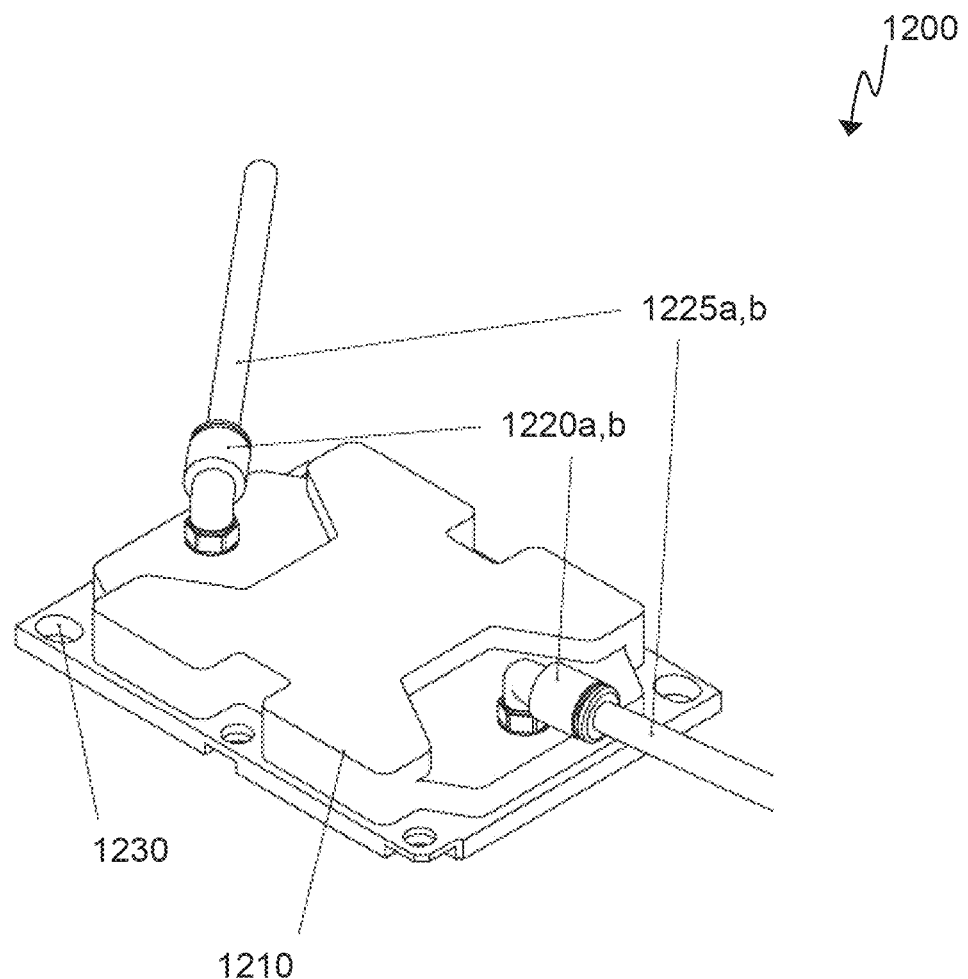

Referring first to FIG. 10A, there is schematically shown an embodiment of a cold plate (or cold plate assembly) 1200 for use as the cooling module of the second cooling circulatory arrangement. In particular, the cold plate is advantageous for use in an electronic module or server blade (or similar module). The cold plate assembly comprises: a cold plate housing 1210 (preferably made integrally); connectors 1220a, 1220b forming an inlet/outlet port of the cold plate; and inlet/outlet conduits 1225 (which here are pipes or tubes). Also shown are fixture points 1230 for the cold plate 1200. These fixture points may beneficially replicate the ones found on air cooled heat sinks in a typical server chassis, allowing the cold plates to be retrofitted into a server blade.

In a preferred example, multiple coolant ports 1220a, 1220b are used, as shown in FIG. 10A. Then, a first coolant port 1220a is provided for transferring liquid coolant into the cold plate 1200, and a second coolant port 1220a is provided for transferring liquid coolant from the cold plate 1200. In the example of FIG. 10A, the coolant ports 1220a, 1220b are coupled to independently rotating fluid connectors (or swivel joints or swivel elbow connectors, the terms being used synonymously herein) thereby allowing adjustment in the direction of the inlet/outlet conduit 1225a, 1225b coupled to the coolant port 1220a, 1220b. As such, this type of connector are especially useful in configuring or installing the cold plate assembly for operation. The swivel joint may increase flexibility of placement of the cold plate. This may more readily allow retro-fitting of the cold plate to an existing electronic module, such as a server or other computer system, without the need to make any other changes to the unit or system. The cold plate may be configured to fit in place of an air-cooled heat sink, for example.

Preferably, the surface arranged to provide a thermal interface to an electronic device (such as the second electronic device) to which the cold plate is coupled is a bottom surface of the cold plate housing (for instance the underside, not shown, of the cold plate housing 1210 in FIG. 10A). Then, the coolant ports 1220a, 1220b are advantageously provided on a top surface of the housing 1210, opposite the bottom surface. In preferred embodiments, the coolant port extends in a direction perpendicular to the top surface of the housing. The swivel joint may then extend the coolant port in a different direction, typically more parallel to the top surface of the housing. Beneficially, the swivel joint allows the direction of the pipe to be adjusted around an axis perpendicular to the top surface of the housing. In particular, the swivel joint may allow the direction of the pipe to be adjusted through at least 90 degrees, 180 degrees, 270 degrees and preferably up to (and including) 360 degrees, especially around an axis perpendicular to the top surface of the housing. Thus, the swivel connector may allow full rotation freedom for the coolant port.

In principle, a single coolant port could provide both an inlet for liquid coolant to the channel and an outlet for liquid coolant from the channel. In the preferred embodiment, multiple coolant ports are used, as shown in FIG. 10A. Then, the coolant port is a first coolant port for transferring liquid coolant to the at least one channel. The cold plate may comprise a second coolant port for transferring liquid coolant from the at least one channel.

The housing of the cold plate, and the arrangement of the ports on the cold plate may take any shape beneficial to promote flow of coolant through the cold plate and to portions of a second electronic device to which the cold plate is coupled. In some examples, the housing is elongated and the first and second coolant ports are located at opposite ends of the housing along the direction of elongation, which may promote flow of liquid coolant across the thermal interface surface and/or aid flexible placement of the cold plate. Additionally or alternatively, the second coolant port may (like the first coolant port) comprise a swivel joint thereby allowing adjustment in the direction of a pipe coupled to the second coolant port. Providing two coolant ports, each with swivel joints, may allow improved ways of coupling the cold plate within a cooling system, including the potential to couple cold plates together.

With reference to FIG. 10B, there is depicted a top internal (plan) view of an example cold plate in accordance with the example of FIG. 10A. In this drawing, the lid and nozzles are removed for clarity.

Shown in FIG. 10B are: coolant inlet port 1225a; coolant outlet or exhaust port 1225b; coolant flow channel 1235; and pins 1240. It can be seen that the flow channel is formed between a coolant inlet port 1225a and a coolant outlet or exhaust port 1225b, through which, when the cold plate is in use, the second liquid coolant can flow. This configuration, and especially the configuration of the pins 1240, distributes coolant flow in all directions within the cold plate, allowing coolant to spread evenly across the cold plate.

Referring to FIG. 10C, there is shown a side (cross-sectional) view of the embodiment of FIG. 10B, with connectors coupled to ports 1225a, 1225b, cold plate base 1245. Cold plate lid 1250 is also shown. The base plate 1245 and lid 1250 may together form the cold plate housing 1210 shown in FIG. 10A. As shown in FIGURE the pins 1240 are connected to the base 1245 and lid 1250. This may ensure that no flow of liquid coolant passing through the channel can short-cut or bypass the pins. In this way, the pins can direct the coolant flow within the cold plate.

The base plate 1245 may provide the thermal interface, to which the second electronic device can be coupled. In particular, the cold plate 1200 can be mounted to an electronic device (for instance, a second or third electronic device as described with reference to FIGS. 1A to 3B), having the base plate 125 of the cold plate in direct contact with a surface of the second electronic device. In this way, heat may transfer from the surface of the electronic device, through the thermal interface provided by the base plate 1245, to the liquid coolant flowing within the cold plate.

Weir Heat Sink

The weir of the first cooling circulatory system will now be described in more detail with reference to FIGS. 11A to 13B. The weir provides particular advantages for directing and increasing the flow of the first liquid coolant in the first cooling circulatory arrangement. By use of the weir, the first liquid coolant can be directed to flow over or through specific regions of the electronic module, and any electronic devices mounted therein. In some examples, the base of the weir may be coupled to the first electronic device (or another electronic device), and therefore act as a heat sink for the coupled device. In an alternative example, the electronic device may reside in the volume of the weir. In addition, use of the weir allows the level of first liquid coolant required in the electronic module to be reduced, as discussed further below. This is particularly important where the liquid level of the first liquid coolant is to be maintained at a low enough level to avoid contact with the cooling modules or cold plates in the second cooling circulatory arrangement.

Figure 11A:
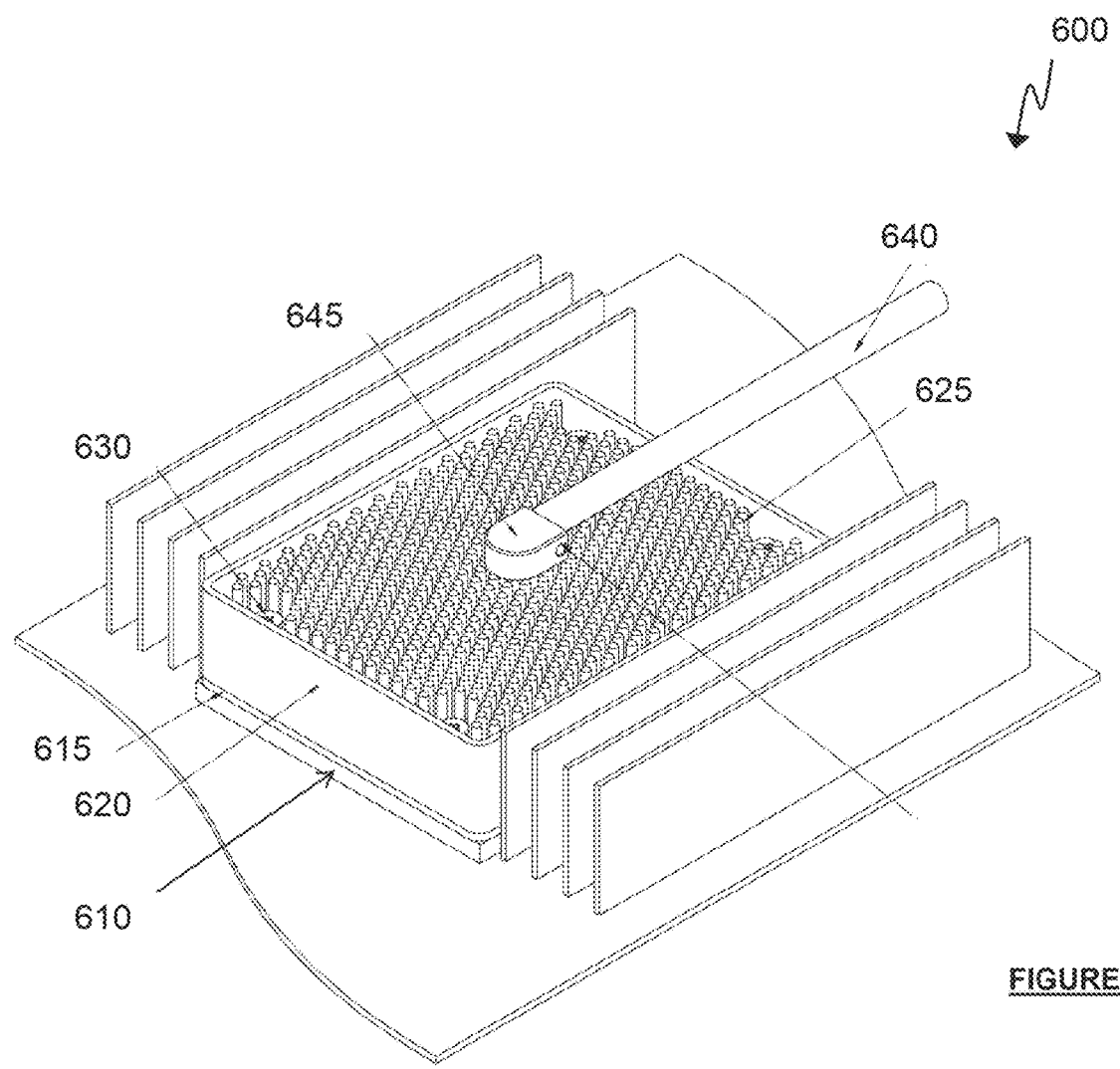
FIG. 11A is a perspective view, FIG. 11B an exploded view and FIG. 11C a cross-sectional view of the weir heat sink used in the first cooling circulatory arrangement.
Figure 11B:
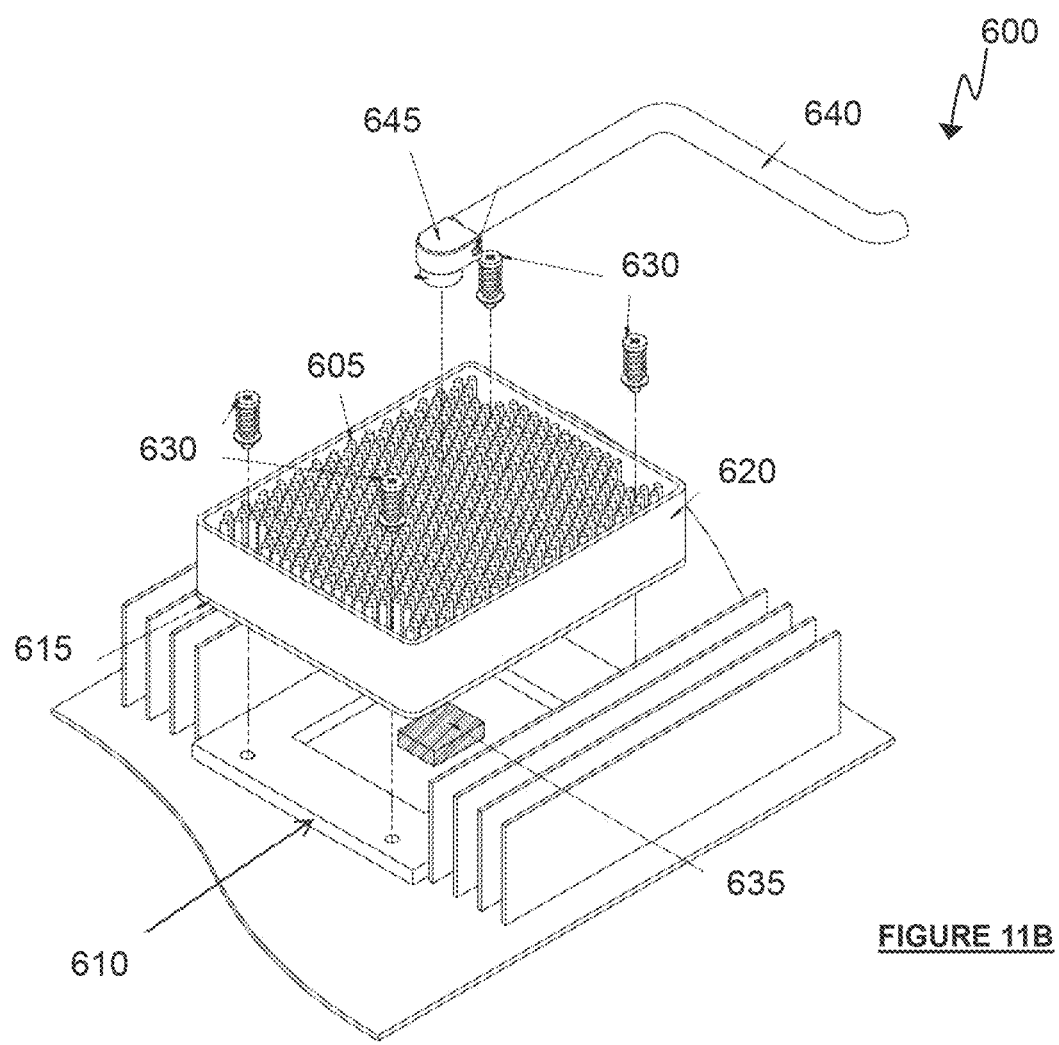

Referring first to FIG. 11A, there is illustrated a first embodiment of a weir or weir heat sink for use in the first cooling circulatory system. With reference to FIG. 11B, there is shown an exploded view of the embodiment of FIG. 11A. The weir 600 comprises: a base made up of a mount 610 and a planar substrate 615 fixed to the mount 610; a retaining wall 620 attached to the planar substrate 615; projections (shown in the form of pins) 625; and fixing screws 630, which attach the substrate 615 to the mount 610. In this way, the planar substrate 615 sits directly on a high temperature component, which may be the first electronic device 635. As such, heat is transferred from the first electronic device 635 to a volume defined by the planar substrate 615 and the retaining wall 620, in which projections 625 are provided.

The weir heat sink 600 can be made from a single component, for example by: die cast; lost wax casting; metal injection mould (MIM); additive manufacture; or forged. It could also be machined out of a block of material or skived. The weir heat sink 600 may be formed from any material that is thermally conductive, such a metal or other thermal conductor. Some examples may include aluminium, copper or carbon.

Also shown in FIGS. 11A and 11B are a pipe 640 and an inlet to the weir at a nozzle 645. The first liquid coolant is delivered to the weir heat sink 600 via the nozzle 645. The nozzle 645 is arranged to direct coolant perpendicular to the plane of the substrate 615. This forces the jet or flow of the liquid coolant directly into the volume defined by the substrate 615 and retaining wall 620 of the heat sink 600. As a consequence, the heat dissipation is improved. This is especially the case in comparison with a system where coolant is directed to flow over a heat sink, in a direction parallel to the plane of the heat sink substrate, such as in an air cooled system.

In the examples shown in FIGS. 11A and 11B, the nozzle 645 delivers the coolant directly in the centre of the volume defined by substrate 615 and retaining wall 620. In this example, the centre of that volume corresponds with the hottest part of the area of the substrate 615, which is adjacent to (and directly on) the high temperature component 635. This provides a contraflow, such that the coldest coolant is directed to contact the hottest area of the weir heat sink. The coolant moves out radially from the hottest part.

With reference to FIG. 11C, there is shown a cross-sectional view of the weir heat sink in FIG. 11A in operation. The same features as shown in previous drawings are identified by identical reference numerals. An arrow indicates the flow of coolant within the pipe 640, to provide first liquid coolant 805 within the volume defined by the substrate 615 and retaining wall 620 of heat sink 600 and first liquid coolant 810 outside the heat sink 1. As indicated previously, first liquid coolant emerging from nozzle 645 is directed towards the centre of the volume (corresponding with the centre of the surface area of substrate 615) and from there moves out radially towards the retaining wall 620. Sufficient first liquid coolant is pumped via nozzle 645 into the volume, such that it overflows 810 the retaining wall 620 and collects with remaining first liquid coolant 815 exterior to weir heat sink 600.

In an alternative embodiment, first liquid coolant retained in the weir may be allowed to drain through holes in the base or side walls of the weir, in order to promote flow of the first liquid coolant. In a further variation, the first electronic device may be located within the volume of the weir, rather than coupled to an outer surface of the weir.

The retaining wall 620 acting as a side wall enables different levels of coolant. The first liquid coolant 805 within the volume of the weir heat sink 600 is at a relatively high level and the coolant 815, which at least partially immerses a plurality of other electronic devices in the electronic module (not shown in this drawing), is at a lower level. This allows significantly less liquid coolant to be used than in other similar systems that cover all components at the same height.

A number of benefits are thereby realised. Firstly, if a dielectric coolant is used as the first liquid coolant, less first liquid coolant is used. This has two main benefits: dielectric coolant can be expensive and so costs can be significantly reduced, and dielectric liquid coolants are typically very heavy, and so weight of the electronic module can be reduced. Moreover, by using less liquid coolant, the electronic module 100 can be more straightforward to install and/or lift. Also, installing the electronic module 100 can require less infrastructure. In addition, the electronic module 100 is easier to handle than similar devices are systems using significantly more primary liquid coolant. The level of the first liquid coolant 815 within the majority of the container 110 is not close to the top of the container. As a result, spillages during maintenance or exchange of components are less likely. The risk of leakage is also reduced.

The retaining wall 630 creates a weir effect, and promotes flow of the first liquid coolant. The coolant 815 at a relatively low level cools the electronic devices in the electronic module 100 (the first electronic device, and any other electronic device). It is not necessary for the first electronic device, and any other electronic devices, to be fully immersed in first liquid coolant. The first liquid coolant retained in the weir heat sink 600 may also provide some redundancy to the cooling of the first cooling circulatory arrangement, in the event of a failure of the pump 185 or other component.

Figure 12:
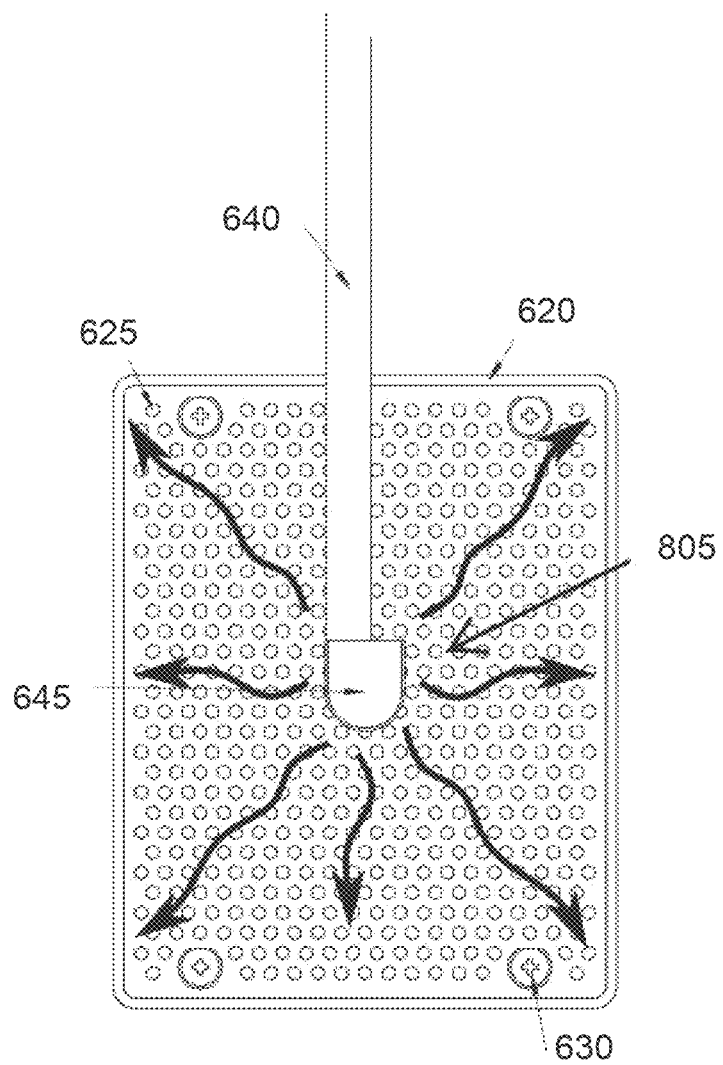
FIG. 12 is a plan view of the weir heat sink, showing fluid flow from the nozzle.

Referring next to FIG. 12, there is shown a top view of the embodiment of FIG. 11A, showing a nozzle arrangement. As previously discussed, the nozzle 645 is coupled to pipe 640. The nozzle 645 is positioned to face the centre of the surface area of the substrate 615 (not shown in this figure). The radial flow of coolant is shown by arrows in this drawing.

Figure 13A:
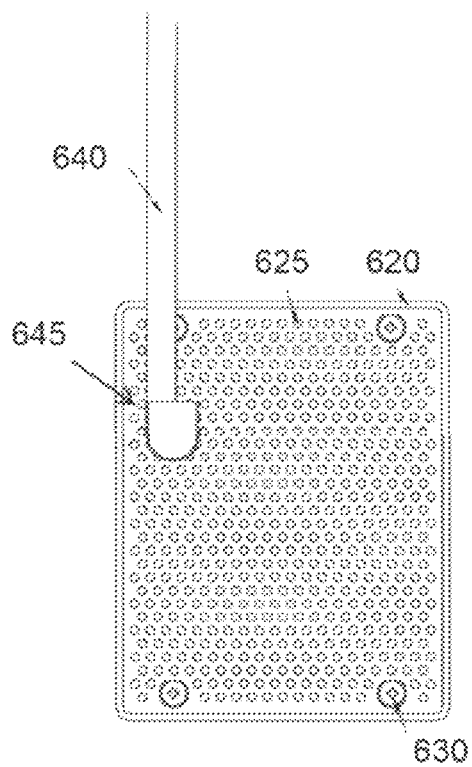
FIGS. 13A and 13B shows alternative arrangements for the nozzle of the weir heat sink.
Figure 13B:
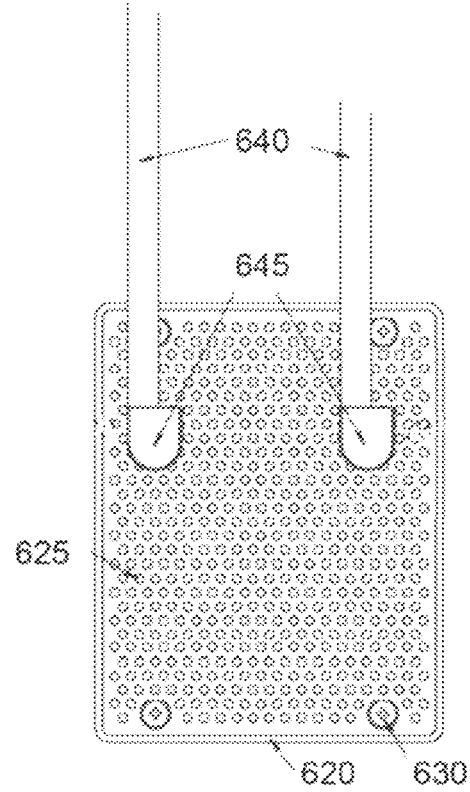

Alternative positions for the nozzle 640 are possible. Some such positions will now be described with reference to FIGS. 13A, in which there is shown a top view of the first variant of the nozzle arrangement of the embodiment of FIG. 11A and with reference to FIG. 13B, in which there is shown a top view of a second variant of the nozzle arrangement of the embodiment of FIG. 11A. Referring first to FIG. 13A, the nozzle 645 is shown off-centre. Such an arrangement may be provided if the hottest part of the first electronic device (not shown, to which the weir heat sink 600 may be coupled) is not adjacent the centre of the substrate 615. Referring to FIG. 13B, two nozzles are shown. The two nozzles 645 are positioned over the surface area of the substrate 615 (not shown) adjacent two of the hottest parts of the first electronic device (not shown, to which the weir heat sink 600 may be coupled).

The projections 625 (as pin and/or fins) could integrally be formed with the rest of weir heat sink 600 or be made from separate components. The projections 625 could be tolerance fit, glued or brazed in place. Additionally or alternatively, the retaining wall 620 could be integrally formed or made separately from the rest of the heat sink 600, for example by an extrusion or fabricated sheet metal part. Then, the retaining wall 620 could be tolerance fit, glued in place, brazed or welded.

The Liquid Level of the First Liquid Coolant

Use of a heat exchanger as a separate and specific element to transfer heat between the first and the second liquid coolant provides improved control over the cooling performance of the overall system. The cooling power of each element within the first and the second cooling circulatory arrangements depends, at least in part, on the temperature gradient between the liquid coolant and the element to be cooled. In particular, a larger temperature differential will typically result in a greater heat transfer than a smaller temperature differential. The described configurations for the cooling system (in which heat exchange between the first and the second liquid coolant takes place primarily at the heat exchanger) allows selection of the most advantageous combination of temperature gradients or temperature differentials at each element to be cooled.

In particular, it has been identified that it is advantageous to thermally decouple the first and the second liquid coolant, except in controlled regions of the system (in particular, within the heat exchanger). It has been found that the cooling performance of the cooling modules (or cold plates) is significantly reduced if the cooling modules are directly thermally coupled to the first liquid coolant. Specifically, in a system where the first cooling circulatory arrangement provides immersive cooling and the first liquid coolant is allowed to at least partially immerse the cooling modules or cold plates, then the performance of the cooling modules is reduced. As a result, it has been found to be desirable to avoid direct contact between the cooling modules (or cold plates) and the reservoir of first liquid coolant contained within the housing or chassis of the electronic module.

One option to achieve this aim is by arrangement of the cooling modules within the housing of the electronic module relative to the first electronic device such that, when the system is in use, the cooling modules are above the uppermost liquid level of the volume of first liquid coolant housed within the chassis of the electronic module, whilst the first electronic device is arranged to be at least partially immersed within the first liquid coolant. In this case, the first electronic device is arranged in the housing so that, when the electronic module is placed in a rack, the base of the first electronic module is below the base of the cooling module. In other words, every surface of the cooling module will be above the uppermost level of the first liquid coolant contained within the electronic module when the electronic module is placed in a rack.

Such an advantageous configuration requires appropriate selection of the volume of first liquid coolant (in order to maintain an appropriate first liquid coolant level). The required liquid level may be lower than expected in typical immersive cooling system. The lower level of the first liquid coolant may be enabled by the superior overall cooling performance of the system described. Furthermore, use of a weir heat sink in the first cooling circulatory system (as described in more detail with reference to FIGS. 11A to 13B) may also allow for reduction of the overall volume of the first liquid coolant (and so its liquid level), whilst still maintaining good cooling performance. Reduction of the volume of the first liquid coolant required in the system also may reduce costs, and the weight of the sealed electronic module.

FIG. 14 is a cross-sectional view of an electronic module, showing the arrangement of the liquid level 50 of the first liquid coolant housed in the housing of the electronic module compared to the cooling module (or cold plate) 14. In particular, it can be seen that the base of the cold plate 14 is above the level 50 of the first liquid coolant, so that none of the side walls or top surface of the cold plate 14 are immersed in the first liquid coolant. It can be seen that the second electronic device to which the cold plate is thermally coupled 55 is entirely immersed in the first liquid coolant. Connections (such as output conduit 1225b) to the cold plate 14 are also maintained above the liquid level of the first liquid coolant. A portion 60 of the cavity inside the housing of electronic module is about the first liquid coolant level, and not filled with liquid coolant (either first liquid coolant, or second liquid coolant).

An alternative option for thermally decoupling the cooling modules (or cold plates) and the first liquid coolant is to thermally insulate the cooling modules (or cold plates) at the outer surfaces of the sides and/or top wall of the cold plate. However, this option can be complex, can increase the size and volume of the cold plate (which is not desirable within the confinement of the electronic module housing), and can add expense. Therefore, control of the first liquid coolant level, as described above, may be preferred.

Rack Mounted Electronic Modules

Figure 15A:
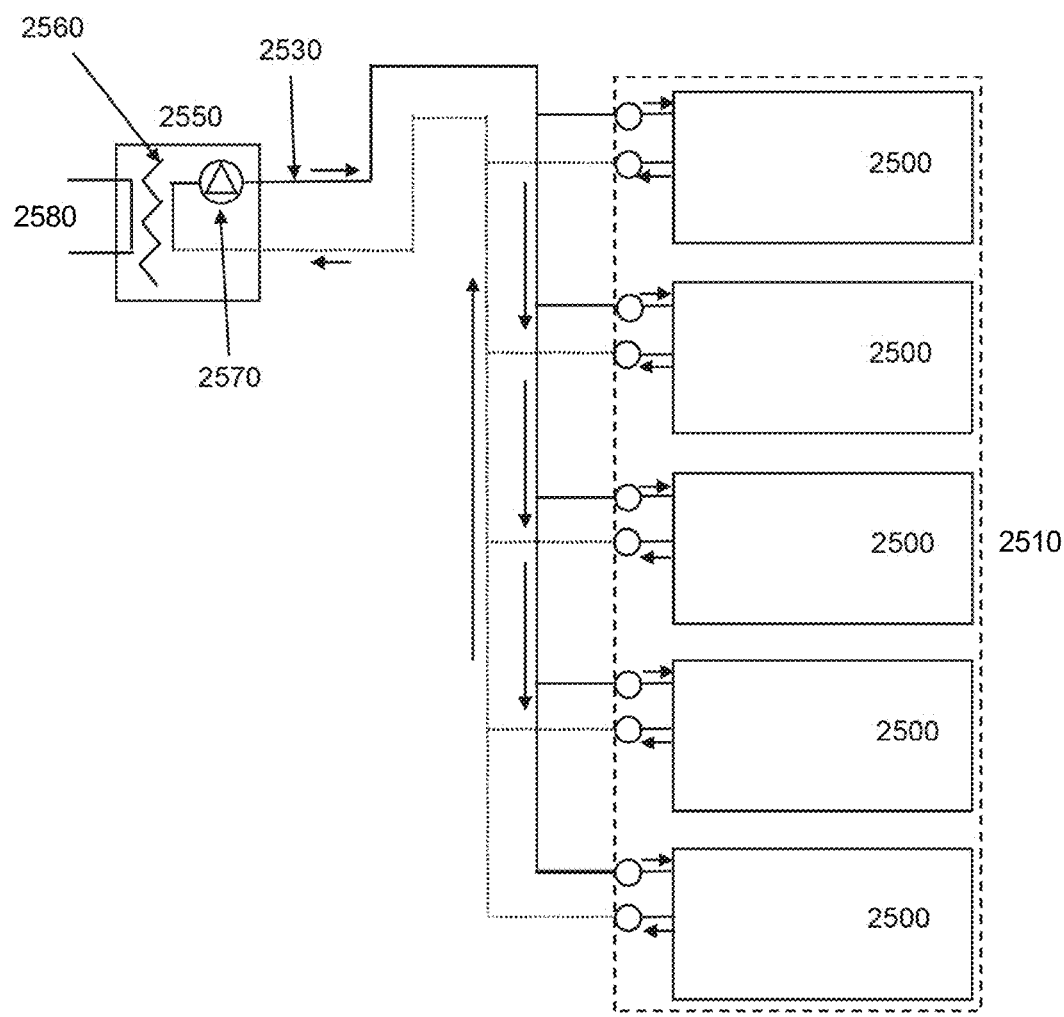
FIG. 15A is a schematic representation of a plurality of the electronic modules connected to a first example of a rack level cooling system for cooling the second liquid coolant.
Figure 15B:
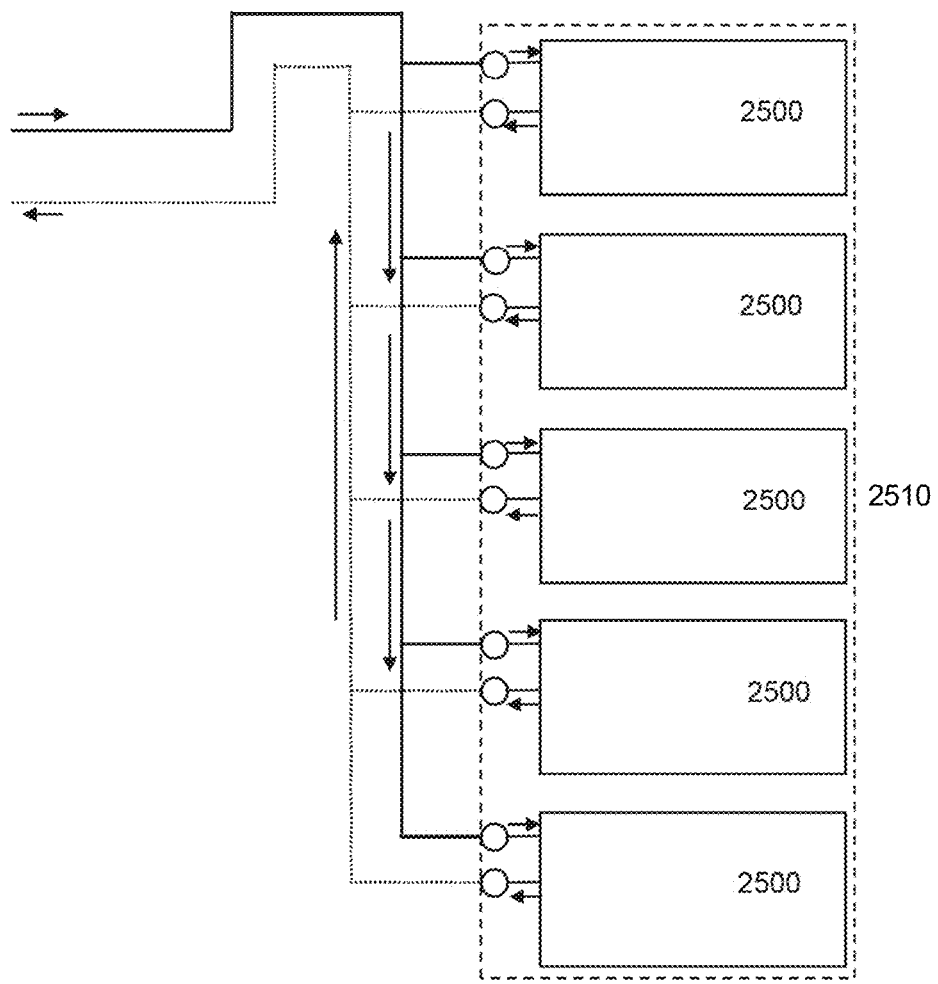
FIG. 15B is a schematic representation of a plurality of the electronic modules connected to a second example of a rack level cooling system for cooling the second liquid coolant.

FIGS. 15A and 15B shows an example of a number of electronic modules 2500 according to the examples described above mounted in a rack 2510. In FIGURES and 15B, the second cooling circulatory arrangement is connected to a rack level cooling system. In particular, a number of electronic modules are connected in parallel. Each electronic module may be of the type described above with reference to FIGS. 1A to 9B.

In the example of FIG. 15A, a single external cooling system of the type described with reference to FIG. 1A, above, is used to cool the secondary liquid coolant supplied to each of the electronic modules 2500 within the rack 2510. In other words, the second liquid coolant is cooled via a second heat exchanger, in which heat is transferred to a third liquid coolant or coolant medium.

In FIG. 15B the second liquid coolant in the second cooling circulatory arrangement is supplied with (constantly replenished) lower temperature second liquid coolant by connection to a facility level cooling system, such as a facility level cooling water system fed by mains water described above with reference to FIG. 1B.

System Comprising a Second Cooling Circulatory Arrangement with the Thermally Conductive Interface at the Heat Exchanger and the Cooling Modules (or Cold Plates) Arranged in Parallel As described above, the various systems for the system for cooling a plurality of electronic modules make use of a heat exchanger 18. The heat exchanger 18 resides within the housing of the electronic module 10. It is used for transfer of heat from the first coolant liquid in the first circulatory system 20 (which typically is circulating through the housing, to at least partially immerse some of the electronic devices 12 within the housing), and the second coolant liquid in the second circulatory system 22 (which typically is circulating through the cold plates 14, 16 and/or the heat exchanger 18, depending on whether a series or parallel configuration of the cold plates and heat exchanger is used). Heat is transferred from the first coolant liquid to the second coolant liquid within the heat exchanger 18.

As discussed above, the heat exchangers 18 used in the described systems may be plate heat exchangers. Plate heat exchangers comprise at least a first chamber and a second chamber, which are separated from each other by a thermally conductive interface (at least in some portions of each chamber). Such a heat exchanger 18 is configured for flow of the first liquid coolant through at least the first chamber, and flow of the second liquid coolant through at least the second chamber. When the respective coolant flows through each chamber, heat is transferred from the first liquid coolant to the second liquid coolant through the thermally conductive interface. Typically, each chamber has a single input and output port, to allow flow of the respective liquid coolant through the given chamber. The chambers are thermally coupled by not fluidly coupled, and there is no intermingling of the first and the second liquid coolant within the heat exchanger.

The described plate heat exchangers can be used in any of the configurations for the system described above with reference to FIGS. 1A to 3B (including a system in which the heat exchanger is arranged in series with the cold plates, or in a system in which the heat exchanger is arranged in parallel with the cold plates). Such heat exchangers necessitate use of appropriate connectors between various components of the system. For instance, to provide the system in FIG. 8A in which the cold plates 125a, 125b are arranged in parallel with a typical plate heat exchanger 170 requires use of two-way inlet manifold 221 between the inlet 145 at the wall of the housing and the heat exchanger 170, and a two-way outlet manifold 251 between the outlet 180 at the wall of the housing and the heat exchanger 170. Such a configuration operates effectively, but the two-way inlet manifold 221 and two-way outlet manifold 251 require additional space within the volume of the electronic module housing 110. Reducing the space taken up by the cooling system within the volume of the housing 110 is preferable, in order to maximise space for electronic devices to be cooled.

With this in mind, a novel configuration for a heat exchanger has been proposed by the inventors. The novel configuration for the heat exchanger is discussed with reference to FIGS. 16 to 18, and implementation of the novel heat exchanger in a system with parallel branches of the second circulatory cooling arrangement is discussed with reference to FIG. 19A to 22B. Although the use of the novel configuration for a heat exchanger is discussed with particular reference to the system having a parallel configuration of the second circulatory cooling arrangement, it will be understood that similar configurations for the heat exchanger could be used within a system having a series configuration of the second circulatory cooling arrangement (having the cooling modules and the mechanism for thermal heat exchange with the first liquid coolant in series), as discussed with respect to the systems of FIGS. 1A and 1B, and FIGS. 2A and 2B, above.

Figure 17:
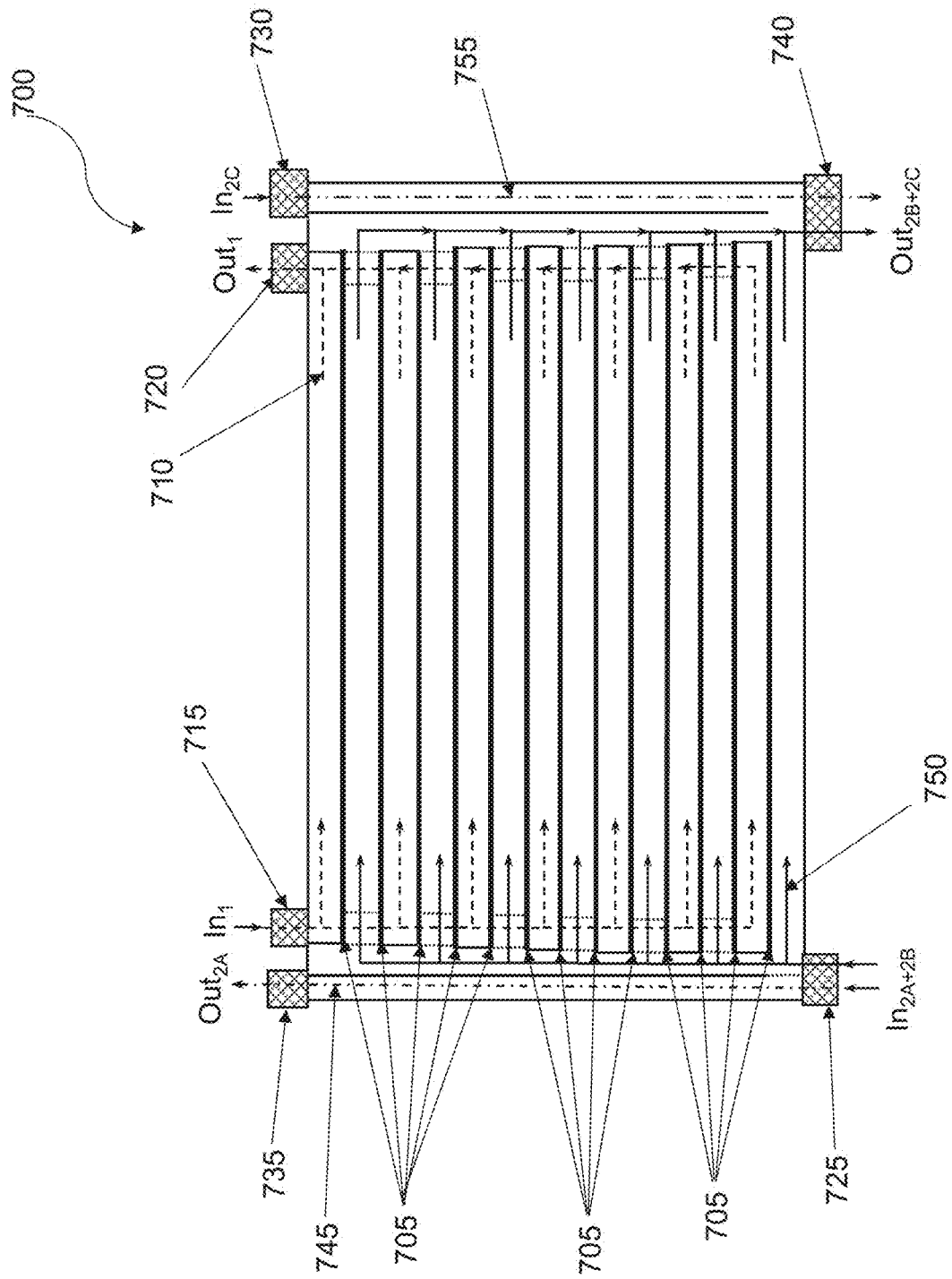
FIG. 17 illustrates a heat exchanger having a total of six input and output ports and having parallel flow between the thermally conductive interface used for heat exchanger.
Figure 18:
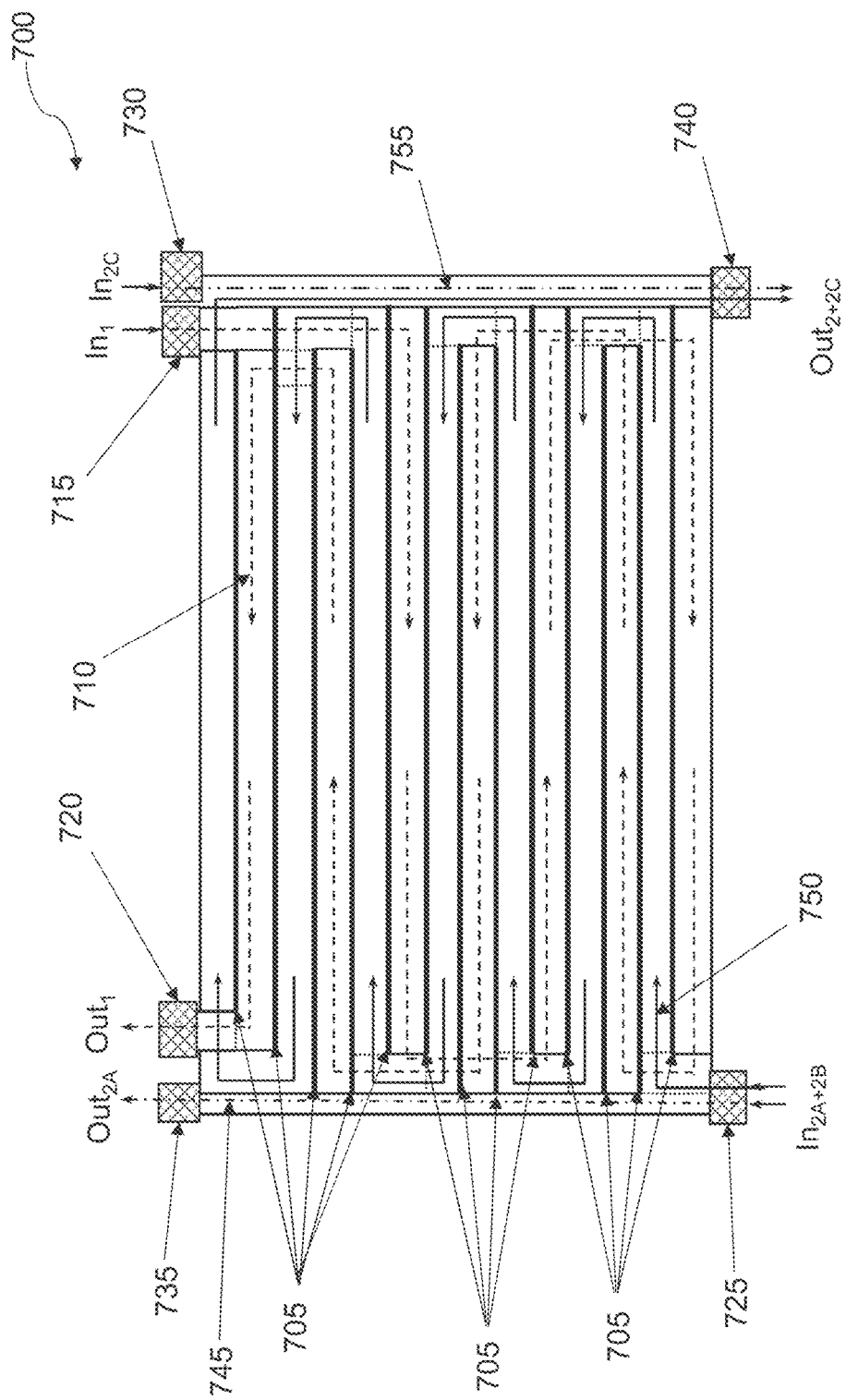
FIG. 18 illustrates a heat exchanger having a total of six input and output ports and having serial flow past the thermally conductive interface used for heat exchanger.

An example of the flow through the novel configuration for the heat exchanger 700 is shown in FIG. 16. An example of the internal structure of the same heat exchanger is shown in FIG. 17. The heat exchangers in FIGS. 16 and 17 have a parallel feed past the thermally conductive interface of the heat exchanger. However, the novel configuration for the heat exchanger 700 could also employ a serial feed to the thermally conductive interface, and this is shown in FIG. 18. However, the general concepts of the heat exchanger of FIGS. 16 and 17, and the heat exchanger of FIG. 18 are the same, being that the second chamber has two inlets (inlet ports) and two outputs (outlet ports) as well as at least two pathways therethrough. Each pathway provides a route for the liquid coolant between different combinations of the inlet and outlet ports, and at least one of the pathways does not pass by or make contact with the thermally conductive interface through which heat can pass to the other chamber of the heat exchanger. All the pathways are fluidly connected and reside within the same chamber of the heat exchanger being fluidly separate to any other chamber of the heat exchanger.

Similar to the previously described typical configuration for the plate heat exchanger, each of the heat exchangers shown in FIGS. 16, 17 and 18 comprises a first and a second chamber, separated from each other by a thermally conductive interface 705. The first chamber is arranged to have the first coolant liquid flow therethrough, and the second chamber is arranged to have the second coolant liquid flow therethrough. The wall 795 of the housing or chassis of the electronic module is marked on FIG. 16. The body of the heat exchanger (being the portion of the heat exchanger housing the first and the second chamber and the thermally conductive interface) is inside the housing or chassis.

The first coolant liquid flows through the first chamber on a pathway 710 (marked with dashed arrows at FIGS. 16, 17 and 18) between a single input, $In_1$ (input port 715) and a single output, $Out_1$ (output port 720). First coolant liquid travelling on the pathway through the first chamber passes and makes contact with one or more thermal interface 705, which allows heat of transfer to (or from) another liquid coolant on the other side of the thermal interface 705, according to the temperature gradient between the two liquids at the interface. However, the thermal interface 705 acts as a physical barrier between the first and second chamber (and so mixing of the first and second liquid coolant is prevented).

In the heat exchangers shown in FIGS. 16, 17 and 18, the pathway 710 through the first chamber always extends from a first input, $In_1$ (input port 715) to a first output, $Out_1$ (output port 720) to the first chamber. However, it can be seen that in the heat exchanger represented in FIGS. 16 and 17 the pathway through the first chamber comprises parallel branches passing by different thermally conductive interfaces (or thermal plates). In comparison, the pathway through the first chamber of the heat exchanger shown in FIG. 18 passes by the thermally conductive interfaces (or thermal plates) serially.

The second chamber of the heat exchangers shown in FIGS. 16, 17 and 18 has two inputs, $In_{2A+2B}$ and $In_{2B}$ (input ports 725, 730) and two outputs, $Out_{2A}$ and $Out_{2B+2C}$ (output ports 735, 740). In all case, three pathways are defined through the second chamber, wherein each pathway routes the second liquid coolant between different combinations of the input and output ports.

A first pathway 745 (dot-dashed arrows in FIGS. 17 and 18) is routed from a first second chamber input, $In_{2A+2B}$ (input port 725), directly to a first second chamber output $Out_{2A}$ (output port 735). A second pathway 750 (solid arrows in FIGS. 17 and 18) is routed from first second chamber input $In_{2A+2B}$ (input port 725), past the one or more thermal interface 705 with the first chamber, and then to a second, second chamber output $Out_{2B+2C}$ (output port 740). Finally, the third pathway 755 (dash-dotted arrows in FIG. 16) is routed from a second, second chamber input $In_{2C}$ (input port 730) directly to second, second chamber input $Out_{2B+2C}$ (input port 740). It can be seen that the first pathway 745 and the second pathway 750 share a common input, first second chamber input $In_{2A+2B}$, whilst the second pathway 750 and the third pathway 755 share a common output, second, second chamber input $Out_{2B+2C}$. However, the first pathway 745 has an individual, unshared output, first second chamber output $Out_{2A}$, and the third pathway 755 has an individual, unshared input, second, second chamber input $In_{2C}$. All three pathways 745, 750, 755 through the second chamber are fluidly connected, and physically (and fluidly) separate from the first chamber.

It can be seen that the second pathway through the heat exchanger in FIGS. 16 and 17 is different form the second pathway though the heat exchanger in FIG. 18. However, in both cases the second pathway passes from the first second chamber input $In_{2A+2B}$ (input port 725), past the one or more thermal interface 705 with the first chamber, and to the second, second chamber output $Out_{2B+2C}$ (output port 740). In particular, the second pathway in the heat exchanger of FIGS. 16 and 17 pass the one or more thermal interface 705 on parallel branches of the second pathway, whereas the second pathway in the heat exchanger of FIG. 18 pass the one or more thermal interface 705 in a serial configuration. It will be understood that the specific route though the second chamber is not limiting, except for the requirement for, in these specific examples, the second pathway to pass the thermally conductive interface whereas the first and second pathway do not.

The second coolant liquid, having entered the second chamber of the described heat exchanger may take one of the three pathways 745, 750, 755. The proportion of second liquid coolant taking each pathway will depend on the relative flow rates through each pathway, as well as the point of entry. Only the second pathway 750 makes contact with the thermal interface 705, through which heat is transferred from the first liquid coolant in the first chamber. Accordingly, heat transfer from the first liquid coolant to the second liquid coolant will primarily take place on the second pathway 750 so that, ideally, the second liquid coolant on at least the first pathway will 745 not receive any of the heat transferred through the thermal interface 705.

In the described configuration, each chamber can be considered a portion of the heat exchanger 700 that is physically partitioned from any other chamber within the heat exchanger 700. Coolant fluid within the first chamber cannot enter the second chamber via any route within the body of the heat exchanger 700. Although different pathways may be provided through each chamber, the various pathways will meet and be joined with another pathway at one or more points along its length. The joining point may be at a common input or output (for instance $In_{2A+2B}$, or $Out_{2B+2C}$) or may be as a result of a join or crossing of two pathways within the chamber. Although each individual pathway in the chamber may not cross and/or make direct contact with every other individual pathway within the chamber, all the pathways within a single given chamber are fluidly connected.

It will be understood that a pathway through a chamber represents a passage between a given first and second point (an input and an output to the chamber). Between these points, fins or other projections may be provided, or other mechanisms to increase a surface area for heat transfer. A particular pathway may have a serial configuration (such as the second pathway shown in FIG. 18), or may itself have parallel branches through the chamber (such as the second pathway shown in FIGS. 16 and 17). However, the fluid is considered to traverse a single pathway when the start and end point (input and output to the chamber) for all fluid on that pathway is the same.

As noted above, the described novel configuration of the heat exchanger 700 may be particularly advantageous for use in a system in which the thermally conductive interface 705 at the heat exchanger and the cooling modules (or cold plates) are arranged on parallel first and second branches of the second cooling circulatory arrangement. In particular, a first branch of the second cooling circulatory arrangement may comprise the described second pathway 745 through the second chamber (which here passes, or makes contact with, the thermally conductive interface 705 between the first and the second chamber). A second branch of the second cooling circulatory arrangement may comprise the described first pathway 745 through the second chamber (which passes through the heat exchanger without receipt of heat via the thermally conductive interface 705), the cooling modules (or cold plates), and then the third pathway 755 through the second chamber of the heat exchanger. In this way, the second liquid coolant passing through the second branch of the cooling circulatory arrangement (passing through the first 745 and third 755 pathway through the second chamber of the heat exchanger 700) effectively bypasses the one or more thermally conductive interface 705 at the heat exchanger (which is on the second pathway 750 through the second chamber of the heat exchanger). As such, the thermally conductive interface 705 at the heat exchanger and the cold plates are arranged in parallel.

The rate of flow of second liquid coolant through each of the first 745, second 750 and third 755 pathways through the second chamber of the heat exchanger 700 may be different. The relative rate of flow (or the fraction of the total volume of liquid coolant passing through a chamber) for the second liquid coolant via each pathway may be chosen to balance or adjust the cooling power at the thermally conductive interface 705 (which is cooling the first liquid coolant in the cooling circulatory arrangement) compared to the cooling power at the cooling modules or cold plates. For instance, by increasing the relative rate of flow through the second pathway 750 through the second chamber of the heat exchanger compared to the first pathway 745, a greater volume of second liquid coolant is passed via the thermally conductive interface 705 than through the cooling modules. This provides a greater capacity for heat to be absorbed into the second liquid coolant from the first liquid coolant, than from the second electronic device via the cooling module.

The relative rate of flow of the second liquid coolant through each of the first 745 and the second 750 pathways can be adjusted by controlling the relative fluid pressure gradient (or pressure drop) across each of the input 725, 730 and output 735, 740 ports. The pressure gradient, in turn, may be controlled by changing the size of the apertures or openings at the input or output port serving each of the pathways. For instance, adjusting the diameter of a nozzle or size of the aperture in an orifice plate at the outlet 735 to the first pathway 745 would result in a change in the relative flow rate through the cooling modules. Alternatively, the flow could be controlled by changing the relative diameter of input and output conduits between the heat exchanger and the cooling modules.

In one example, the fluid pressure gradient at the output port 735 serving the first pathway 745 through the second chamber of the heat exchanger may be lower than the fluid pressure gradient at the output port 740 serving the second pathway 750. This results in a lower rate of flow through the first pathway 745 (and so, in the example above, the input and output conduits between the heat exchanger and the cooling modules) than compared to the second pathway 750.

In a particular configuration of the system in which the thermally conductive interface 705 at the heat exchanger and the cooling modules (or cold plates) are arranged on parallel first and second branches of the second cooling circulatory arrangement, the first pathway 745 (being within the branch of the second cooling circulatory arrangement comprising the cooling modules) may have a rate of flow that is 50% or less than the rate of the flow through the second pathway 750 (being within the branch of the second cooling circulatory arrangement comprising the thermally conductive interface 705). In a still further example, the first pathway 745 may have a rate of flow that is 35% or less than the rate of the flow through the second pathway 750. This latter example equates to around 25% or less of the total volume of the second coolant liquid entering via the common input $In_{2A+2B}$ then passing through the first pathway 745 (and the first branch of the second cooling circulatory arrangement) compared to around 75% or more passing through the second pathway 750 (and the second branch of the second cooling circulatory arrangement). The rate of flow through each pathway could also be considered as a fraction of the total rate of flow through the second chamber, so for the example given the first pathway 745 may have a rate of flow that is 25% or less of the total rate of the flow of the second coolant liquid through the second chamber.

Setting or selection of the flow rate can be beneficial where the heat generated by the first electronic device (or devices) in contact with the first dielectric coolant is greater than the heat generated by the second electronic device to which a cooling module is coupled. As noted above, the balance of coolant going through the heat exchanger and to the cooling modules can be controlled by controlling the pressure drop or pressure gradient at the input and output ports (most likely using different diameters of nozzle, connector or opening at an orifice plate at the outlet of one pathway through the chamber).

Figure 19A:
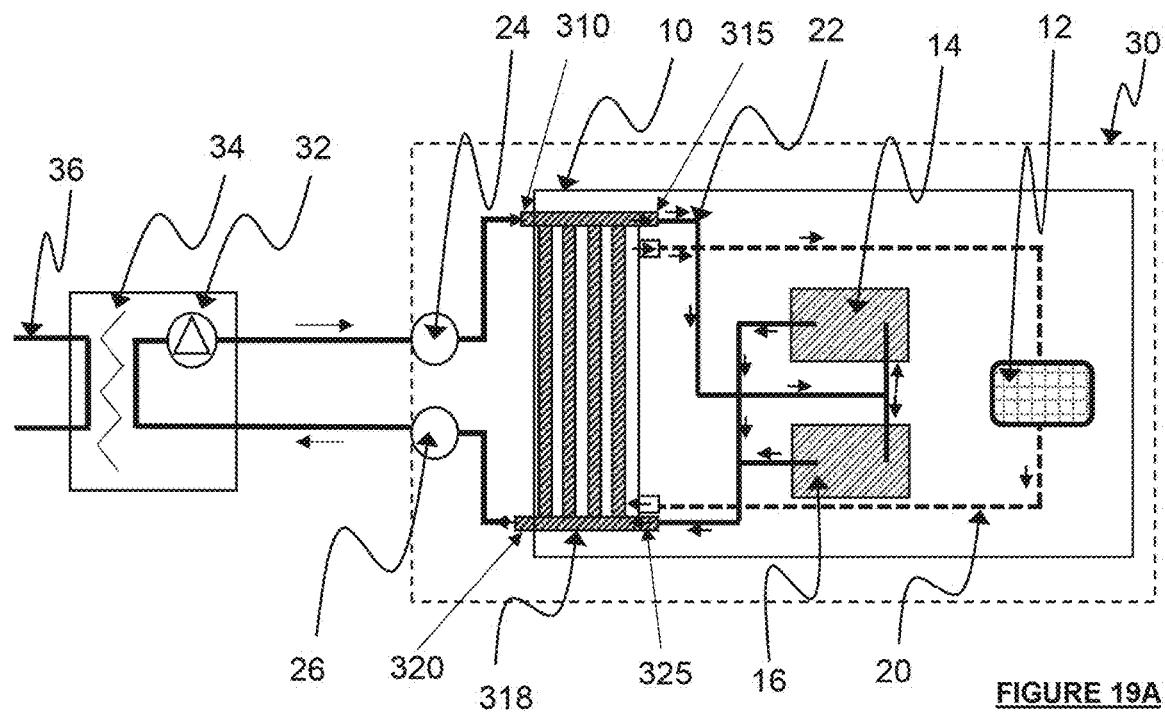
FIGS. 19A and 19B are schematic representations of implementations of a fourth example of the system for cooling a plurality of electronic devices housed in a chassis or housing of an electronic module.
Figure 19B:
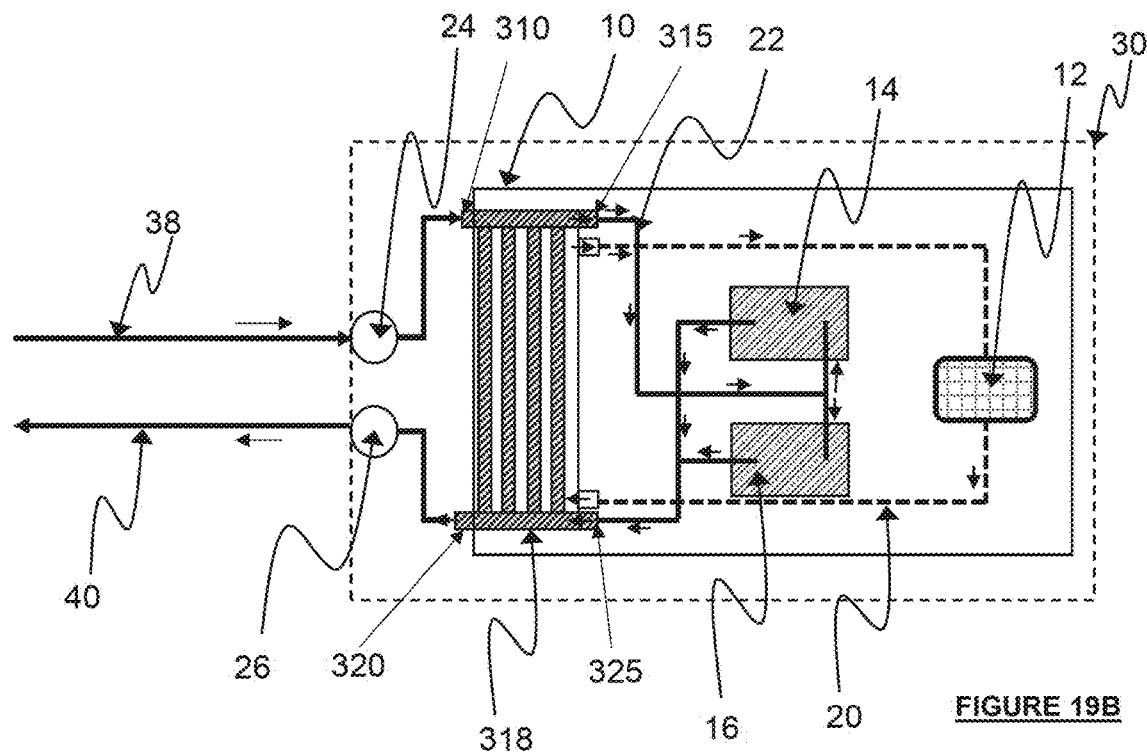

FIGS. 19A and 19B show an example configuration of an electronic module having a hybrid cooling system, including two cooperating circulatory loops of liquid coolant as described above with reference to FIGS. 1A and 1B, FIGS. 2A and 2B, and FIGS. 3A and 3B. The example of FIGS. 19A and 19B shows a system in which the thermally conductive interface at the heat exchanger and the cooling modules (or cold plates) are arranged on respective parallel first and second branches of the second cooling circulatory arrangement. The systems of FIGS. 19A and 19B incorporate a heat exchanger having a first and second pathway through the second chamber, as described above.

The electronic modules of FIGS. 19A and 19B share common features with the examples of FIGS. 1A and 1B, FIGS. 2A and 2B, and FIGS. 3A and 3B, described above. In particular, the electronic modules 10 of FIGS. 19A and 19B also comprise a first electronic device 12, a first 14 and a second 16 cooling module (coupled to a respective second and third electronic device, not shown), and a heat exchanger 318. However, here the heat exchanger 318 is of the type described with reference to FIG. 16, 17 or 18 for instance.

The configuration of the first cooling circulatory arrangement 20 in the examples of FIGS. 19A and 19B are substantially the same as that described above with respect to FIGS. 3A and 3B. However, the configuration of the second cooling circulatory arrangement 22 differs compared to each of the above described examples. In particular, in the examples of FIGS. 19A and 19B, upon entering the electronic module 10 the second coolant liquid is passed directly to the heat exchanger 318. The flow of the second liquid coolant into the heat exchanger 318 is split to pass through two pathways in the second chamber of the heat exchanger (as described above with reference to FIGS. 16 to 18). Only one of the pathways through the second chamber of the heat exchanger 318 is in contact with the thermally conductive interface through which heat is transferred to the second liquid coolant from the first liquid coolant.

In the second cooling circulatory arrangement 22 of the electronic modules 10 illustrated in FIGS. 19A and 19B, when the system is in use the second liquid coolant enters the electronic module through a first input at the housing of the electronic module and directly to a first input 310 to a second chamber at the heat exchanger 318, the second chamber having a first and second pathway therethrough. Both the first and the second pathway through the second chamber receive second liquid coolant via the first input 310 to the second chamber at the heat exchanger 318.

Once within the heat exchanger 318, a first pathway through the second chamber of the heat exchanger conducts a first portion of the second liquid coolant directly to a first output 315 from the second chamber of the heat exchanger 318. The first pathway does not pass via a thermally conductive interface with the first chamber, and so the first portion of the second liquid coolant passing along the first pathway does not receive heat transferred form the first liquid coolant via the thermally conductive interface.

A second pathway though the heat exchanger 318 conducts a second portion of the second liquid coolant past the thermally conductive interface with the first chamber. As such, the second portion of the second liquid coolant receives heat transferred from the first liquid coolant in the first chamber of the heat exchanger 318, via the thermally conductive interface. The second pathway though the heat exchanger 318 conducts the second portion of the second liquid coolant to a second output 320 from the second chamber of the heat exchanger 318.

The first portion of the second liquid coolant, having passed through the first pathway through the second chamber of the heat exchanger 318 and out first output from the second chamber 315, is passed to the first and second cooling modules 14, 16 (coupled to the second and third electronic devices, respectively). Here, heat is transferred to the first portion of the second liquid coolant via the thermal interface at each cooling module 14, 16. The first portion of the second liquid coolant is then directed to a second input 325 to the second chamber of the heat exchanger 318, and on a third pathway through the second chamber of the heat exchanger 318. The third pathway does not pass via the thermally conductive interface, as described above with reference to FIGS. 16 to 18. On the third pathway, the first portion of the second liquid coolant re-joins the first portion, and exits the heat exchanger at the second output 320 from the second chamber of the heat exchanger 318, mixed and intermingled with the first portion.

In this way, it will be understood that the division of the second liquid coolant to pass through either the first or the second pathway through the second chamber of the heat exchanger 318 denotes the division of the second cooling circulatory arrangement into two separate branches, which are arranged in parallel. The first branch of the second cooling circulatory arrangement is passed to the first and second cooling modules 14, 16, and then re-joins the second branch at a third pathway back though the body of the heat exchanger 318, to be conducted out of a common output 320 from the heat exchanger 318. The second branch of the second cooling circulatory arrangement is passed via the thermally conductive interface of the heat exchanger 318 (remaining entirely inside the heat exchanger 318), and re-joins the first branch prior to the common output 320 from the heat exchanger 318.

Just as in the example of FIGS. 3A and 3B, in the arrangement of the second cooling circulatory arrangement 22 in FIGS. 19A and 19B, a separate portion of the second liquid coolant receives heat from the second and third electronic device (via the cooling modules 14, 16) than the portion that receives heat from the first liquid coolant at the heat exchanger 318. The flow of the second liquid coolant through each branch can be carefully controlled, in order to balance the cooling performance of the cooling modules 14, 16 compared to the heat exchanger 318. For instance the relative rate for flow through each of the first and second branch may be adjusted, to provide a greater cooling power at either of the cooling modules 14, 16 or the thermally conductive interface within the heat exchanger 318.

The electronic module 10 according to FIG. 19A is connected to an external cooling system, via a rack 30, that is identical to the external cooling system described above with respect to FIGS. 1A, 2A and 3A. The electronic module according to FIG. 19B is connected to an external cooling system, via a rack 30, that is identical to the external cooling system described above with respect to FIGS. 1B, 2B and 3B.

In the system of FIG. 19A and FIG. 19B, the first cooling circulatory arrangement may have the same features and benefits discussed above with respect to the systems discussed with reference to FIGS. 1A to 3B. In particular, the first cooling circulatory arrangement 20 may provide immersive cooling, wherein the first liquid coolant is a dielectric. As described above, the liquid level of the first liquid coolant may be such that, when the system is in use, the first liquid coolant does not make direct contact with the first 14 and second 16 cooling module, but at least partially immerses first electronic device 12.

A specific implementation of the system considered in FIG. 19A and FIG. 19B is described in more detail below.

Figure 20A:
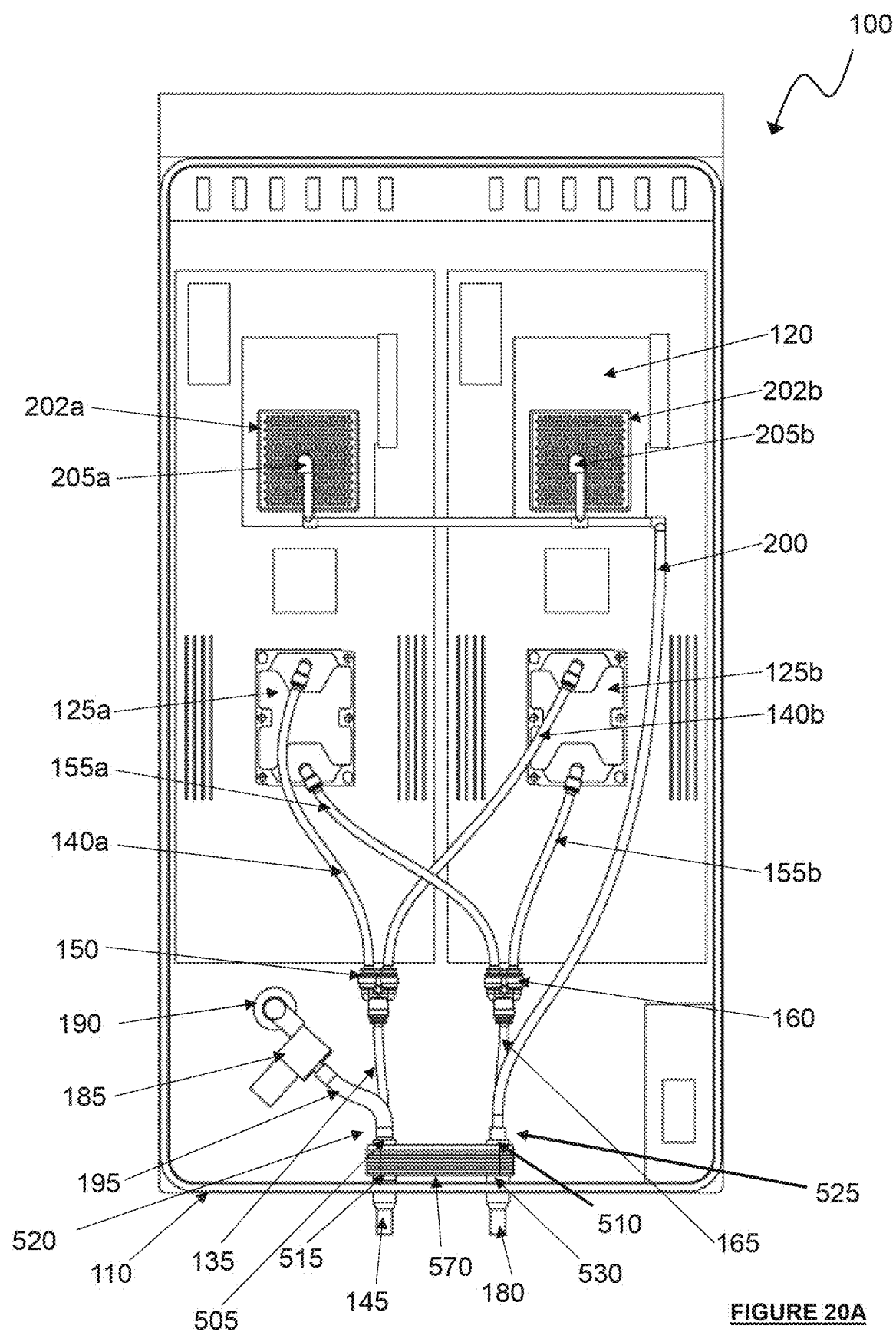
FIG. 20A is a plan view.
Figure 20B:
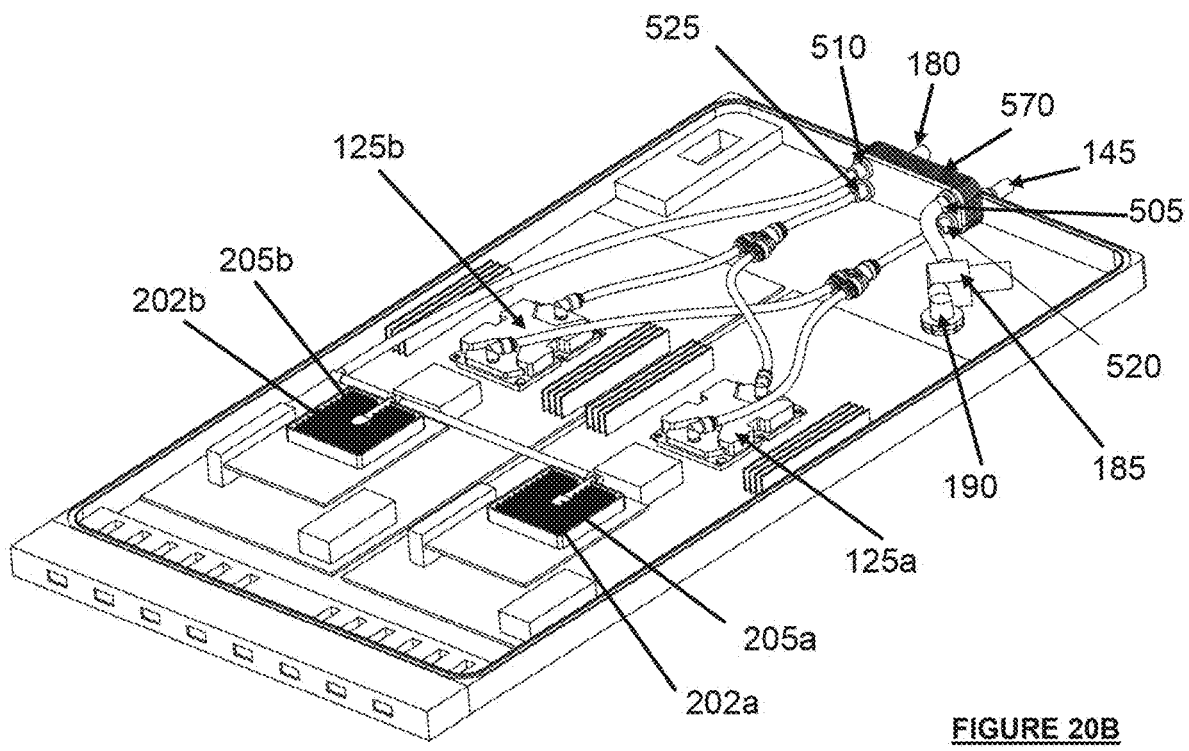
FIG. 20B and FIG. 20C are perspective views, of an electronic module that is a specific implementation of the fourth example of the system according to FIGS. 19A and 19B.
Figure 20C:
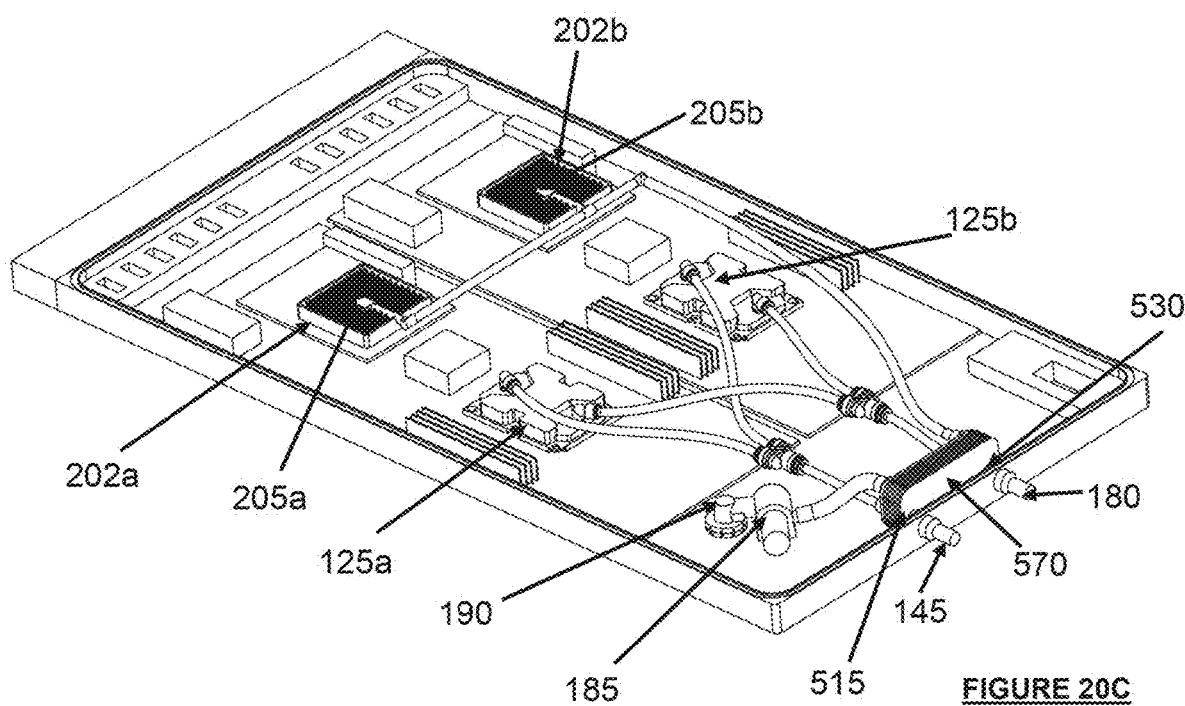
Figure 21:
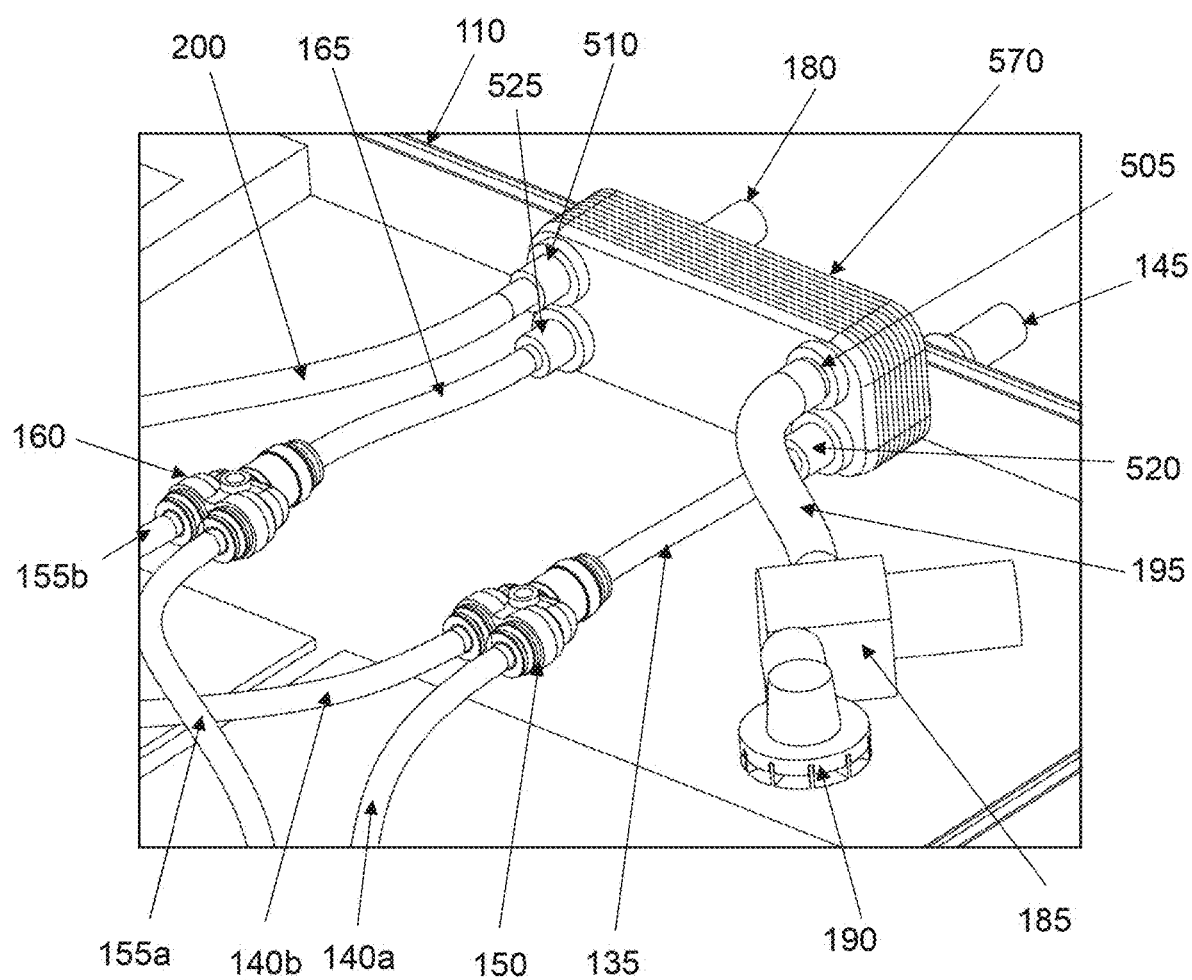
FIG. 21 is a detailed view of the ports at the heat exchanger in the system according to the implementation of the electronic module in FIGS. 20A, 20B and 20C.

Referring to FIG. 20A, there is illustrated a specific implementation of the example of an electronic module 100 described above with reference to FIGS. 19A and 17B (in which the cooling modules and the thermally conductive interface of the heat exchanger are arranged on parallel branches within the second cooling circulatory arrangement). The electronic modules may be a module or server blade, having appropriate dimensions and outer connectors to fit within a commonplace server rack (not shown). The same electronic module 100 is shown in FIG. 20B and FIG. 20C, which each depict different perspective views of the module. A magnified image of the ports of the heat exchanger within the system is shown in FIG. 22.

The electronic module has an outer housing or enclosure 110, which has a base, walls and lid, and may be sealable. A plurality of electronic devices (or heat generating components) are mounted within the housing. In some cases, the components may be mounted on printed circuit boards (PCB) 120 which may be connected to the base, lid or a wall of the housing. The described system looks to remove heat generated by the electronic devices from within the electronic module.

A first cooling circulatory arrangement (or first cooling loop) is used to cool certain electronic devices of the plurality of electronic devices mounted within the electronic module. A second cooling circulatory arrangement (or second cooling loop) is used to cool others of the heat generating components. For instance, the second cooling circulatory arrangement can be provided with a greater cooling power, and so be used to cool specific components which generate greater amounts of heat than those components cooled by the first cooling circulatory arrangement. The second cooling circulatory arrangement is also used to cool the first liquid coolant circulating in the first cooling circulatory arrangement.

In the example depicted in FIGS. 20A, 20B and 20C, an electronic module has a first cooling circulatory arrangement (or first cooling loop) that provides immersive cooling. The first cooling circulatory arrangement is contained entirely within the housing 110 of the electronic module. In particular, a first liquid coolant is contained within the sealable housing of the electronic module, so that a number of components to be cooled 120 are at least partially immersed in the first liquid coolant. The first liquid coolant is contained in the volume of the housing 110 of the electronic module and may be considered as a reservoir of first liquid coolant.

First liquid coolant from the reservoir of first liquid coolant is collected or received at a pump input 190. The pump input 190 may be shaped in order to improve flow of the liquid coolant towards a pump 185. The pump 185 moves the first liquid coolant through the first cooling circulatory arrangement (or first cooling loop). First liquid coolant is passed through the pump 185, moved through a pipe 195 and into a heat exchanger 570. The heat exchanger has the configuration discussed above with reference to FIGS. 16 to 18. The first coolant liquid enters a first chamber in the heat exchanger 570 via input 505, wherein the first chamber is separated from a second chamber by a thermally conductive interface. Heat retained in the first coolant fluid may be transferred via the thermally conductive interface to the second coolant fluid, which is also passed through the heat exchanger 570 as described below. Thus, the first liquid coolant is cooled as it is passed through the heat exchanger 570. As will be understood, first liquid coolant entering the heat exchanger 570 is at a higher temperature to the first liquid coolant passing out of the heat exchanger 570.

In the example of FIGS. 20A, 20B and 20C, a pipe 200 is connected to the heat exchanger to carry first cooling fluid exiting via an output 510 from the heat exchanger 170. At the distal end of the pipe 200 are one or more outlets or nozzles 205a, 205b. In the specific example of FIGS. 20A, 20B and 20C, the outlets or nozzles 205a each form the inlet to a weir 202a, 202b. The weirs act as heat sinks, and are part of the first cooling circulatory arrangement. The weir is described above in further detail with respect to FIGS. 12A to 14B. However, the first cooling circulatory arrangement could be configured without use of the described weir heat sink. For instance, nozzles could be arranged to distribute first liquid coolant that has passed out of the heat exchanger to the vicinity of a first electronic device, or to cause flow of first liquid coolant through the reservoir of first liquid coolant in the housing or chassis (in which the first electronic device is at least partially immersed) and towards the pump inlet 190.

First cooling liquid passes out of outlets or nozzles 205a, 205b and through the weir 202a, 202b (if used), until being collected within the reservoir of first liquid coolant contained within the volume of the housing 110 of the electronic module 100. In this way, the cooler first liquid coolant which has passed through the heat exchanger 570 can be reintroduced to the bath or reservoir of the first liquid coolant within the housing 110, and cool any electronic components partially immersed in the reservoir. Specifically, the cooled first liquid coolant will absorb heat from the surfaces of the electronic devices 120 (including the first electronic device with which it is in contact). Eventually, the first liquid coolant will once again be collected at the pump input 190, thereby completing the first cooling circulatory arrangement (or first cooling loop).

FIGS. 20A, 20B and 20C also depict a second cooling circulatory arrangement. The second cooling circulatory arrangement incorporates one or more cooling modules or cold plates 125a, 125b, which are each mounted to one or more electronic devices. Ideally, the electronic devices require higher performance cooling. The cold plates 125a, 125b are a module or chamber, through which a second liquid coolant (such as water) can be passed. Heat can be transferred to the second liquid coolant within the cold plate from the electronic devices 130a, 130b, by conduction of the heat through the mounting surface of the cold plate, coupled to the given electronic device. The cold plates 125a, 125b of the second cooling circulatory arrangement are discussed in more detail above, with respect to FIGS. 10A, 10B and 10C. The second cooling circulatory arrangement of FIGS. 20A, 20B and 20C has two cold plates, connected in parallel, although these could also be connected in serial, for instance.

Referring to FIGS. 20A, 20B and 20C, an inlet 145 at the wall of the housing 110 of the electronic module connects directly to an a first heat exchanger second chamber input 515, the heat exchanger being arranged within the housing 110 of the electronic module. Specifically the inlet 145 connects directly to an input 515 of the second chamber of the heat exchanger 570. The inlet 145 comprises a connector, which may be any suitable type of connector, including a quick disconnect connector. Second liquid coolant is received into the electronic module via the inlet 145. The inlet 145 and the first heat exchanger second chamber input 515 may be one piece or entity.

As discussed above with reference to FIGS. 16 to 18, the heat exchanger in the system of FIGS. 20A, 20B and 20C comprises at least two pathways through the second chamber, and here comprises three pathways through the second chamber. In a first branch of the second cooling circulatory arrangement, a first portion of the second liquid coolant is passed directly through the body of the heat exchanger 570 via a first pathway to a first heat exchanger second chamber output 520. A first input conduit 135 is connected to the first heat exchanger second chamber output 520, to transport the first portion of the second liquid coolant to a further input manifold 150. A second and third input conduit 140a, 140b are connected to the further input manifold. The second and third input conduits 140a, 140b are each connected to a respective cold plate 125a, 125b. In this way, the first portion of the second coolant fluid can be transported, in parallel, to each of the cold plates 125a, 125b within the electronic module. The second liquid coolant is then passed through the cold plate, as discussed above in relation to FIGS. 10B and 10C.

An output conduit 155a, 155b is connected to each of the respective cold plates 125a, 125b. The output conduits 155a, 155b receive the first portion of the second liquid coolant output from each of the cold plates 125a, 125b, in parallel. The output conduits 155a, 155b are connected to a further output manifold 160, which is connected to an output conduit 165. The output conduit 165 directs the first portion of second liquid coolant to a second heat exchanger second chamber input 525, arranged at the housing of the heat exchanger 570. The first portion of the second liquid coolant is then directed on a third pathway through the heat exchanger 570. The first portion of the second liquid coolant eventually re-joins a second portion of the second liquid coolant, as discussed below.

In a second branch of the second cooling circulatory arrangement, a second portion of the second liquid coolant is passed via a second pathway through the second chamber of the heat exchanger 570. The second pathway passes via the thermally conductive interface between the first and the second chambers of the heat exchanger 570. In this way, the second portion of the second liquid coolant contacts the thermally conductive interface and receive heat transferred from the first liquid coolant via the thermally conductive interface. After passing the thermally conductive interface, the second pathway joins the third pathway through the second chamber of the heat exchanger 570. Thus, the first and second portion of the second liquid coolant (and the first and second branches of the second cooling circulatory arrangement) re-join.

After the first and second branches of the second cooling circulatory arrangement re-join within the heat exchanger 570, the second liquid coolant passes out of the heat exchanger 570 via a second heat exchanger second chamber output 530. This passes the second liquid coolant directly to an outlet 180 at the wall of the housing of the electronic module. The outlet 180 comprises a connector, which may be any suitable type of connector, including a quick disconnect connector. The outlet 180 and the second heat exchanger second chamber output 530 may be the same, single entity.

Although not shown in FIGS. 20A, 20B and 20C, the inlet 145 and the outlet 180 may each be connected to a cooling system or second liquid coolant supply (for instance by further pipes, connected to the inlet 145 and outlet 180, as necessary). This is discussed in further detail below, in relation to FIGS. 22A and 22B.

Advantageously, the system described with reference to FIGS. 20A, 20B and 20C have all the advantage of a second circulatory system having a first and second parallel branch, as discussed above with respect to FIGS. 8A, 8B and 8C. For instance, the described system allows both the cold plates 125a, 125b and the heat exchange via the thermally conductive interface at the heat exchanger 570 to benefit from the lowest temperature second liquid coolant. Furthermore, this configuration allows balancing of the flow rate (and so the cooling performance) at the thermally conductive interface of the heat exchanger 570 compared to the cold plates 125a, 125b. Such balancing may be achieved by modifying the aperture size of each of the first and second heat exchanger second chamber output 505, 530, for instance. Moreover, compared to the configuration of the system shown in FIGS. 8A, 8B and 8C, the system of FIGS. 20A, 20B and 20C reduces the number and length of conduits and connectors joining the various components of the design (as the inlet 145 and outlet 180 to the housing connect directly to an inlet 515 and outlet 530 at the heat exchanger, for instance). This will significantly reduce the space required to connect the heat exchanger 570 internal to the electronic module, and also reduces the complexity of connections and likelihood of leakage between them. Thus, this design is more space efficient, and less prone to failure. Moreover, the described system allows for a modular design for the housing 110 of the electronic module, with common inlet and outlet ports.

Figure 22A:
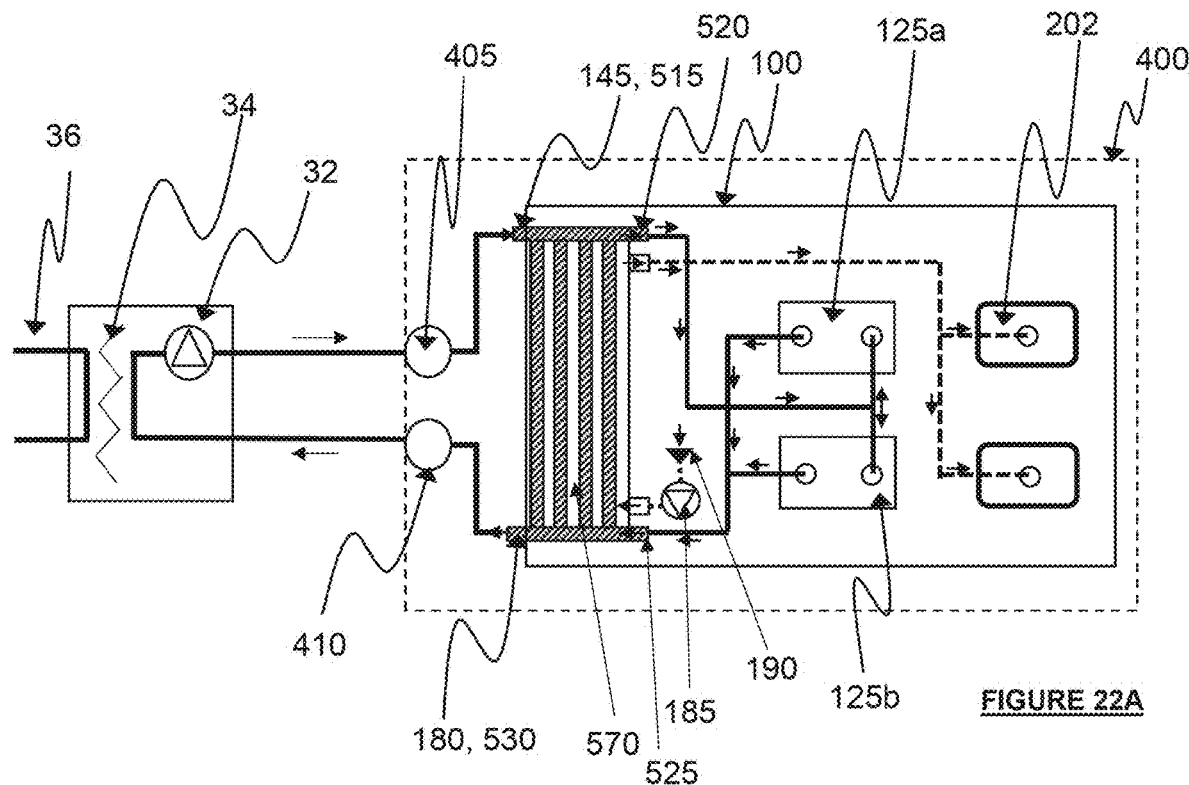
FIGS. 22A and 22B are schematic representations of the system according to the implementation of the electronic module in FIGS. 20A, 20B and 20C.
Figure 22B:
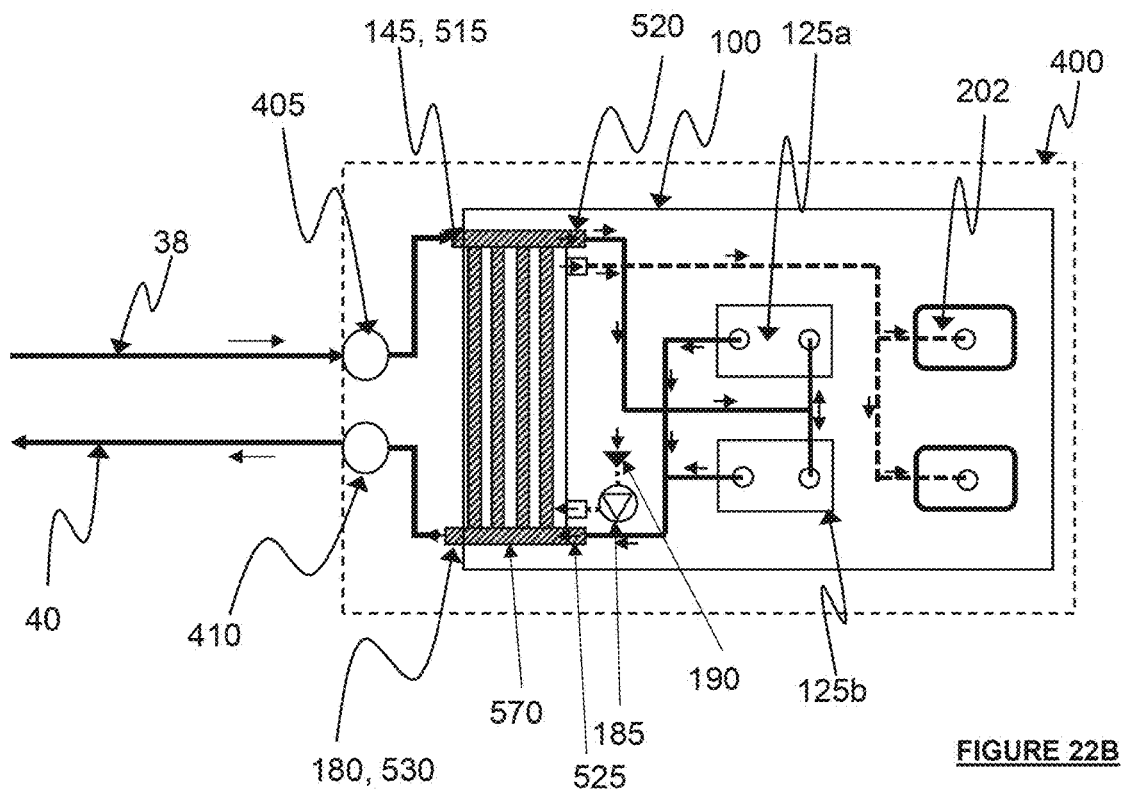

FIGS. 22A and 22B show a schematic view of the first and second cooling circulatory arrangement of FIGS. 20A, 20B and 20C when the electronic module 100 is connected in a rack 400. The arrangement of the first and second cooling circulatory arrangements within the electronic modules are the same for both the examples of FIGS. 22A and 22B. However, the apparatus for providing low temperature second liquid coolant to the electronic modules is different within the two examples of FIGS. 22A and 22B. In particular, the external cooling system for providing the second liquid coolant in the example of FIG. 22A is the same as the external cooling system described above with reference to FIG. 1A (i.e. heat transfer from the second liquid coolant to a third coolant medium, via a further heat exchanger 34). The external cooling system for providing the second liquid coolant in the example of FIG. 22B is the same as the external cooling system described above with reference to FIG. 1B (i.e. supply of the second liquid coolant from a facility level supply, such as a cooling water supply).

Considering the common aspects of FIGS. 22A and 22B, there is shown the first cooling circulatory system having a pump inlet 190, pump 185, heat exchanger 570, and weir 202 for circulation of first liquid coolant within the housing of the electronic module 100. FIGS. 22A and 22B further shows the second cooling circulatory arrangement comprising a first and second cooling module (or cold plate) 125a, 125b, and the heat exchanger 570.

In use, the second liquid coolant is received into the electronic module through an inlet 145, and passed directly to a second chamber of the heat exchanger 570 via a first heat exchanger second chamber input 505. Within the heat exchanger 570, the second liquid coolant is split into two branches. The first branch passes the second liquid coolant out of the heat exchanger 570 through a first heat exchanger second chamber output 515 and directly to two cooling modules (or cold plates) 125a, 125b, arranged in parallel. After passing through the cooling modules (or cold plates) 125a, 125b, the second liquid coolant from the first branch re-enters the second chamber of the heat exchanger 570 through a second heat exchanger second chamber input 520.

In use, the second branch of the second cooling circulatory arrangement passes along a pathway through the second chamber of heat exchanger 570 that makes contact with a thermally conductive interface. Heat may be received from the first liquid coolant (flowing though first chamber of the heat exchanger 570) via the thermally conductive interface. Subsequently, and prior to exiting the heat exchanger 570, the second branch of the second cooling circulatory arrangement is re-joined with the first branch in the second chamber of the heat exchanger 570. The second cooling liquid is then passed out of the heat exchanger 570 via a common, second output 530 from the second chamber of the heat exchanger and directly to an outlet 180 in the wall of the electronic module.

The inlet 145 and outlet 180 of the electronic module may each be connected to an inlet 405 or outlet 410 manifold, respectively, at the server rack 400 in which the electronic module 100 is mounted. The inlet 145 and outlet 180 may be connected to the inlet 405 and outlet 410 manifold at the server rack 400 via a quick disconnect connector.

It will be understood that, although a specific configuration for the heat exchanger is discussed with respect to FIGS. 16 to 18, other configurations of the heat exchanger can be envisaged in which one of the first or the second chamber of the heat exchanger have two or more inputs and/or outputs. In each case, at least two pathways are arranged though the same chamber, wherein that chamber has two or more inputs and/or two or more outputs. In each case, two or more of the at least two pathways share at least one common input and/or output. However, at least one of the pathways comprises a different combination of inputs and/or outputs than another of the pathways. In this way, although the pathways are all fluidly connected, each separate pathway through a given chamber of the heat exchanger offers a different route, between a different combination of connectors. The relative flow rate though different pathways may be adjusted to pass different volumes of liquid coolant through each separate pathway.

FIGS. 23(a), 23(b) and 23(c) shows just some of the variety of different pathways that could be formed through a single chamber (such as through the second chamber) of a heat exchanger, according to the described configuration. Only some of the pathways are arranged in contact with a thermally conductive interface for heat exchange with liquid coolant flowing in a separate chamber (wherein the flow through that separate chamber is not shown in FIG. 23(a), 23(b) or 23(c). FIG. 23(a) shows a chamber having two pathways, each with a common input, but a separate output. FIG. 23(b) shows a further example of a chamber having two pathways, each with a common input, but a separate output. FIG. 23(c) shows an example of a chamber having three pathways where a first pathways has a common input with a second pathway and separate output, and the third path way has a separate input and common output with the second pathway.

A number of combinations of the various described embodiments could be envisaged by the skilled person. All of the features disclosed herein may be combined in any combination, except combinations where at least some of such features and/or steps are mutually exclusive. In particular, the preferred features of the invention are applicable to all aspects of the invention and may be used in any combination. Likewise, features described in non-essential combinations may be used separately (not in combination).

Each feature disclosed in this specification, unless stated otherwise, may be replaced by alternative features serving the same, equivalent or similar purpose. Thus, unless stated otherwise, each feature disclosed is one example only of a generic series of equivalent or similar features.

As used herein, including in the claims, unless the context indicates otherwise, singular forms of the terms herein are to be construed as including the plural form and, where the context allows, vice versa. For instance, unless the context indicates otherwise, a singular reference herein including in the claims, such as "a" or "an" means "one or more". Throughout the description and claims of this disclosure, the words "comprise", "including", "having" and "contain" and variations of the words, for example "comprising" and "comprises" or similar, mean that the described feature includes the additional features that follow, and are not intended to (and do not) exclude the presence of other components.

The use of any and all examples, or exemplary language ("for instance", "such as", "for example" and like language) provided herein, is intended merely to better illustrate the disclosure and does not indicate a limitation on the scope of the disclosure unless otherwise claimed. No language in the specification should be construed as indicating any non-claimed element as essential to the practice of the disclosure.

Any steps described in this specification may be performed in any order or simultaneously unless stated or the context requires otherwise. Moreover, where a step is described as being performed after a step, this does not preclude intervening steps being performed.

The invention claimed is:

1. A system for cooling a plurality of electronic devices, the electronic devices housed in a housing of an electronic module, the system comprising: a first cooling circulatory arrangement, configured to cause a first liquid coolant to circulate between a first electronic device of the plurality of electronic devices and a heat exchanger, wherein the first electronic device is arranged to be thermally coupled to the first liquid coolant such that, when the system is in use, heat generated at the first electronic device is transferred to the first liquid coolant; a second cooling circulatory arrangement, configured to cause a second liquid coolant to flow through the heat exchanger, and to cause the second liquid coolant to flow through a cooling module thermally coupled to a second electronic device of the plurality of electronic devices, wherein, when the system is in use, heat generated by the second electronic device is transferred to the second liquid coolant via a surface of the cooling module; wherein the first cooling circulatory arrangement and the second cooling circulatory arrangement are thermally coupled via the heat exchanger, such that the heat exchanger is configured to transfer heat from the first liquid coolant to the second liquid coolant, and wherein the heat exchanger and the cooling module are arranged on parallel branches of the second cooling circulatory arrangement, so that the second cooling circulatory arrangement is configured to cause the second liquid coolant to flow through the heat exchanger and to cause the second liquid coolant to flow through the cooling module in parallel.

2. The system of claim 1, wherein the housing is configured to contain the first liquid coolant and wherein, when the system is in use, the first electronic device is at least partially immersed in the first liquid coolant contained within the housing.

3. The system of claim 1, wherein the housing is configured to contain a volume of first liquid coolant which, when the system is in use, fills the housing to a liquid level, wherein the cooling module is arranged within the housing to be above the liquid level of the first liquid coolant, and the first electronic device is arranged within the housing to be at least partially immersed in the first liquid coolant contained within the housing.

4. The system of claim 1, wherein the heat exchanger comprises at least a first chamber and a second chamber separated from each other by a thermally conductive interface, wherein the heat exchanger is configured for flow of the first liquid coolant through at least the first chamber, and flow of the second liquid coolant through at least the second chamber, such that heat is transferred from the first liquid coolant to the second liquid coolant through the thermally conductive interface.

5. The system of claim 1, wherein the heat exchanger is arranged within the housing of the electronic module.

6. The system of claim 1, wherein the first cooling circulatory arrangement further comprises a weir, the weir comprising:
a base and a retaining wall extending from the base, the base and retaining wall defining a volume for holding some of the first liquid coolant;
a weir inlet, through which the first liquid coolant flows into the volume;
wherein the flow of sufficient first liquid coolant through the weir inlet into the volume causes the first liquid coolant to overflow the retaining wall and collect with first liquid coolant contained in the housing of the electronic module and exterior the weir.

7. The system of claim 6, wherein the weir inlet further comprises a nozzle arrangement, for directing the first liquid coolant flowing into the volume.

8. The system of claim 6, wherein the weir further comprises projections extending from the base and/or retaining wall within the volume of the weir.

9. The system of claim 6, wherein the weir is coupled to a surface of the first electronic device, to act as a heat sink, or wherein the first electronic device is located within the volume of the weir.

10. The system of claim 1, wherein the first cooling circulatory arrangement further comprises:
a pump configured to circulate the first liquid coolant around the first cooling circulatory arrangement; and
wherein the first cooling circulatory arrangement further comprises a pump inlet, arranged to receive first liquid coolant contained in the housing of the electronic module and exterior the weir.

11. The system of claim 1, wherein the cooling module comprises:
a cold plate, the cold plate comprising a cold plate housing, a surface of the cold plate housing being arranged to provide a thermal interface for cooling the second electronic device which is thermally coupled thereto; and
at least one channel within the cold plate housing and proximate to the surface of the cold plate housing, the at least one channel arranged for the second liquid coolant to flow therethough such that heat received from the second electronic device through the surface of the cold plate housing is transferred to the second liquid coolant.

12. A method for cooling a plurality of electronic devices, the electronic devices housed in a housing of an electronic module, the system comprising: circulating a first liquid coolant around a first cooling circulatory arrangement, comprising causing a first liquid coolant to circulate between a first electronic device of the plurality of electronic devices and a heat exchanger, wherein the first electronic device is arranged to be thermally coupled to the first liquid coolant such that heat generated at the first electronic device is transferred to the first liquid coolant; transporting a second liquid coolant around a second cooling circulatory arrangement, comprising causing a second liquid coolant to flow through the heat exchanger, and causing the second liquid coolant to flow through a cooling module thermally coupled to a second electronic device of the plurality of electronic devices, wherein heat generated by the second electronic device is transferred to the second liquid coolant via a surface of the cooling module; wherein the first cooling circulatory arrangement and the second cooling circulatory arrangement are thermally coupled via the heat exchanger, such that heat from the first liquid coolant is transferred to the second liquid coolant via the heat exchanger, wherein the heat exchanger and the cooling module are arranged on parallel branches of the second cooling circulatory arrangement, and wherein transporting the second liquid coolant around the second cooling circulatory arrangement comprises causing the second liquid coolant to flow through the heat exchanger and causing the second liquid coolant to flow through the cooling module in parallel.

13. The method of claim 12, wherein the housing is configured to contain the first liquid coolant and wherein the first electronic device is at least partially immersed in the first liquid coolant contained within the housing.

14. The method of claim 12, wherein the housing is configured to contain a volume of first liquid coolant which fills the housing to a liquid level, wherein the cooling module is arranged within the housing to be above the liquid level of the first liquid coolant, and the first electronic device is arranged within the housing to be at least partially immersed in the first liquid coolant contained within the housing.

* * * * *